United States Patent [19]
Takasugi

[11] Patent Number: 6,088,285
[45] Date of Patent: Jul. 11, 2000

[54] SEMICONDUCTOR MEMORY CIRCUIT IN WHICH PATTERN WIDTHS OF SWITCHING CIRCUIT AND BUFFERS ARE FORMED WITHIN A PATTERN WIDTH OF A COLUMN UNIT

[75] Inventor: Atsushi Takasugi, Tokyo, Japan

[73] Assignee: Oki Electric Industry Co., Ltd., Tokyo, Japan

[21] Appl. No.: 09/009,265

[22] Filed: Jan. 20, 1998

[51] Int. Cl.[7] ....................................... G11C 8/00
[52] U.S. Cl. .............................. 365/230.05; 365/189.05; 365/230.03; 365/240
[58] Field of Search ........................ 365/230.05, 189.04, 365/240, 230.03, 189.05, 230.08

[56] References Cited

U.S. PATENT DOCUMENTS 5,400,292  3/1995  Fukiage et al. ..................... 365/230.01
5,680,365  10/1997 Blankenship ....................... 365/230.05
5,726,948  3/1998  Hush et al. ........................ 365/230.05
5,732,041  3/1998  Joffe .................................. 365/230.05
5,835,417  10/1998 Ayukawa et al. .................. 365/189.04

*Primary Examiner*—David Nelms
*Assistant Examiner*—Hien Nguyen
*Attorney, Agent, or Firm*—Jones Volentine, LLP

[57] ABSTRACT

A semiconductor memory circuit comprises a memory array including an X decoder and column units. Each of the column units has a Y decoder, memory cells and bit line pairs. The semiconductor memory circuit further comprises switching circuits each having an input connected to one of the Y decoders and outputs. The switching circuit is connected to the input and one of the outputs in response to a control signal. The semiconductor memory circuit further comprises buffers each of which is connected to one of the outputs of the switching circuits, ports each of which is connected to one of the buffers and a memory control signal generating circuit outputting the X address and Y address.

45 Claims, 57 Drawing Sheets

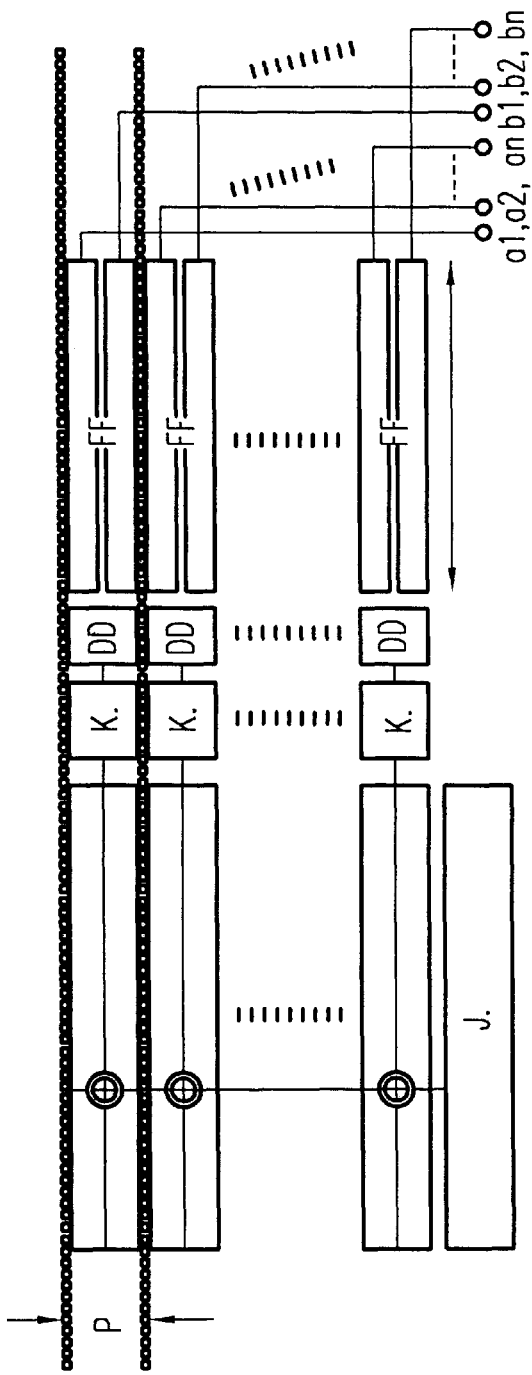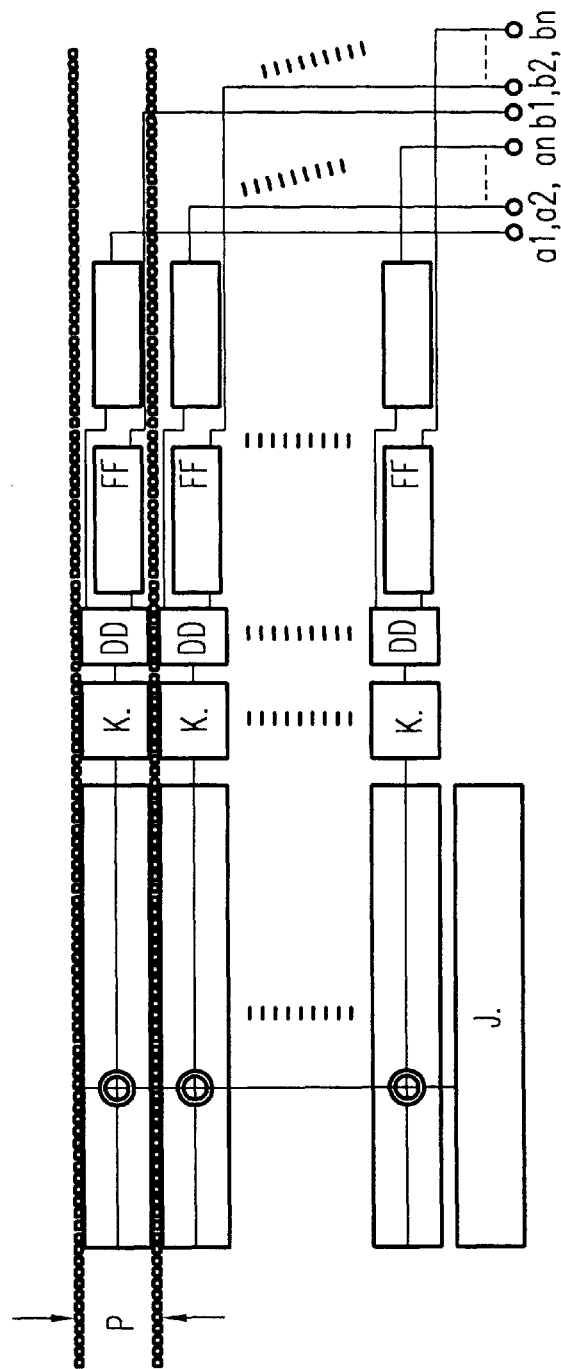
FIG.2A
FIG.2B

SEMICONDUCTOR MEMORY CIRCUIT IN WHICH PATTERN WIDTHS OF SWITCHING CIRCUIT AND BUFFERS ARE FORMED WITHIN A PATTERN WIDTH OF A COLUMN UNIT

BACKGROUND OF THE INVENTION

This invention relates to a large-capacity memory with buffers, and specifically to a memory device having buffers such as serial memories, and shift registers.

A switching hub is known as one of network equipment or apparatuses used when information held in the same segment is transferred from a given personal computer to another personal computer under a network environment. A shared memory for constructing the switching hub is known as a conventional general-purpose DRAM, SRAM or an SDRAM (Synchronous DRAM) that will be widely used for a general-purpose DRAM from now on. Further, the switching hub needs a buffer unit, which makes use of a general-purpose SRAM or a small-capacity FIFO (First-In, First-Out) type SRAM.

Most of switching hubs are comprised of a general-purpose X-16 DRAM or SRAM or an X-16 SDRAM, i.e., they are constructed using discrete devices. Examples developed with SDRAMs capable of sync-clock control have been on the increase in recent years.

With a view toward implementing a device whose processing speed is faster (i.e., whose number of processing bits per unit time is large), an I/O needs to extend its width broader. Since, the I/O width is represented as an X16 even at the maximum in a world-standardized general-purpose memory, a large number of X16-configured memories are only used in parallel to design a device having a broader width such as an X32 or X64 or the like. In other words, the implementation of the device will result in an unavoidable increase in cost.

Further, the FIFO (or SRAM) used as a buffer connected to the memory referred to above also makes a common use of the X16-configured product in the same manner as described above. As described above, the implementation of the device larger in I/O width needs a large number of devices. When it is desired to increase the number of ports, a larger number of FIFOs are required. As a result, the device itself will be very expensive.

Moreover, a drawback arises in that since electrical wiring for connecting to shared memory portions broadened in I/O width are implemented or provided in plural form, (a great number of data buses are needed) and hence buffers wide in I/O width need broader board areas on a board. This can result in a delay in the speed for the transfer of data between the FIFO and the shared memory.

Thus, the design of the device using the conventional discrete devices makes it impossible to construct a high-performance and economical system having an I/O width represented as an X128 or X256, for example.

SUMMARY OF THE INVENTION

With the foregoing in view, it is therefore an object of the present invention to provide a large-capacity memory having a broad I/O width and buffers whose I/O widths are broad.

A semiconductor memory circuit of the present invention comprises a memory array including an X decoder and column units. Each of the column units has a Y decoder, memory cells and bit line pairs. The semiconductor memory circuit further comprises switching circuits each having an input connected to one of the Y decoders and outputs. The switching circuit is connected to the input and one of the outputs in response to a control signal. The semiconductor memory circuit further comprises buffers each of which is connected to one of the outputs of said switching circuits, ports each of which is connected to one of the buffers and a memory control signal generating circuit outputting the X address and Y address.

Typical ones of various embodiments of the present invention have been described in brief. However, the various embodiments of the present invention and specific configurations of these embodiments will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 2(a) and 2(b) show layouts of circuit patterns employed in the present embodiment;

DETAILED DESCRIPTION OF THE PREFERRED EMBODIMENTS

Preferred embodiments of the present invention will hereinafter be described in detail with reference to the accompanying drawings.

Figure 1:
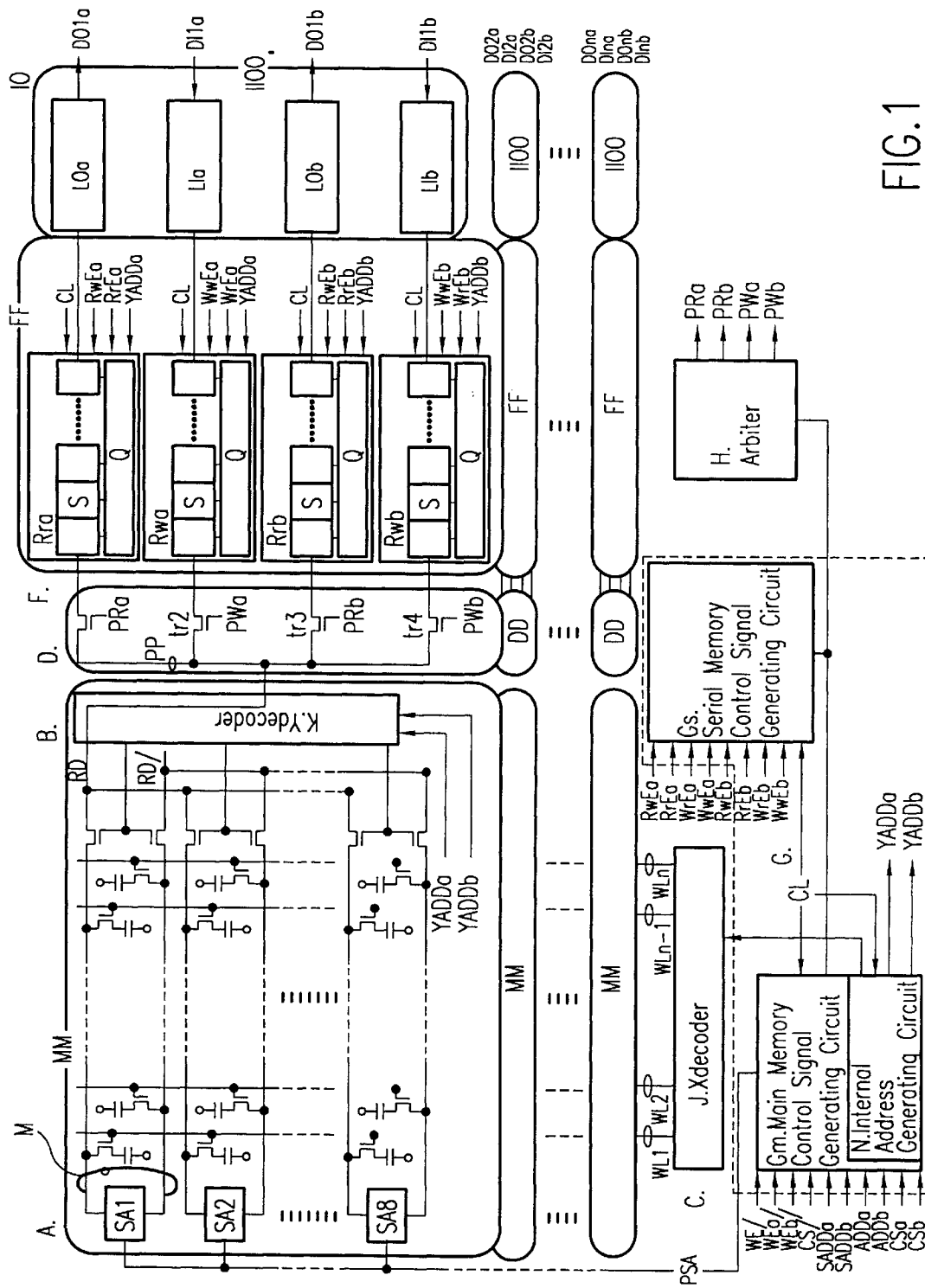
FIG. 1 is a block diagram showing a first embodiment of the present invention.

FIG. 1 is a block diagram showing a first embodiment of the present invention. As memory units of an SDRAM according to the present embodiment, DRAM memory cell units Qij (where i=1 to m, j=1 to n) each comprised of one capacitance and one transistor are used. The plurality of memory cell units Qij are respectively electrically connected to bit line pairs BLi and BLi/ electrically connected to sense amplifiers SAi as shown in FIG. 1. Each bit line pair BLi and BLi/ is electrically connected to its corresponding data bus pair RD and RD/ through opening/closing transistors Tric.

Now, portions including one bit line pair BLi and BLi/ and the opening/closing transistors Trjc for connecting to the memory cell units Qij, the sense amplifier SAi and the data bus pair RD and RD/ respectively corresponding (connected) to the one bit line pair BLi and BLi/ will hereinafter be defined as a column unit M. In the present embodiment, a lump or collection of eight adjacent column units M will be referred to as "middle column unit MM." The number of the column units M constituting the middle column unit MM is not necessarily limited to eight. The number of the column units M may be set to 16 or 32. However, the number of the column units M will be explained below as eight for simplification of illustration.

The memory cell units Qij (where i=1 to m and j=1 to n) included in the eight column units M constituting the middle column unit MM share the use of the same word lines WLj (where j: figures identical to j of Qij) corresponding to outputs of an X decoder J.

Bit lines BL1, BL2, BL3, . . . BL8 provided in the eight column units M constituting the middle column unit MM are respectively electrically connected to a common node (data bus) RD through opening/closing transistors tr1c, tr2c, tr3c, . . . tr8c.

Similarly, bit lines BL1/, BL2/, BL3/, . . . BL8/ provided in the eight column units M constituting the middle column unit MM are respectively electrically connected to a common node (data bus) RD/ through opening/closing transistors tr1c/, tr2c/, tr3c/, . . . tr8c/.

A Y decoder K supplied with Y addresses YADDa and YADDb serves so as to select one from the eight column units M constituting the middle column unit MM.

Each of opening/closing transistor units DD is made up of four transistors whose sources are electrically connected to a common node PP connected to the node RD (since column unit information of a memory is transferred to each bit line pair as complementary signals in a DRAM, positive logic information is transferred from a corresponding memory cell to the node RD and negative logic information is transferred to the node RD/). For simplification of illustration, data transferred outside each column unit will not be handled as the complementary signals in the present embodiment. This data transfer will be explained using the positive logic information alone. Thus, only the node RD is electrically connected to the node PP and the node RD/ is open in FIG. 1. However, the node RD/ is electrically connected to the other node PP/ in an actual device.

As shown in FIG. 1, eight outputs Y1, Y2, Y3, . . . Y8 of the Y decoder K are electrically connected to their corresponding gates of the opening/closing transistors tr1c, tr2c, tr3c, . . . tr8c and tr1c/, tr2c/, tr3c/, . . . tr8c/ for electrically connecting the bit line pairs of the column units M constituting the middle column unit MM to the nodes RD and RD/.

The common node PP is electrically connected to a read serial memory Rra of a port a through the transistor tr1 opened or closed in response to a signal PRa. The read serial memory Rra of the port a is supplied with a common clock CL, and a write enable signal RwEa, a read enable signal RrEa and a Y address YADDa for the serial memory Rra. The read serial memory Rra is also electrically connected to an output buffer LOa having output terminals DOia (where i=1 to n) of the port a.

Similarly, the common node PP is electrically connected to a write serial memory Rwa of a port a through the transistor tr2 opened or closed in response to a signal PWa. The write serial memory Rwa of the port a is supplied with the common clock CL, and a write enable signal WwEa, a read enable signal WrEa and a Y address YADDa for the serial memory Rwa. The write serial memory Rwa is also electrically connected to an input buffer LIa having input terminals DIia (where i=1 to n) of the port a.

Further, the common node PP is electrically connected to a read serial memory Rrb of a port b through the transistor tr3 opened or closed in response to a signal PRb. The read serial memory Rrb of the port b is supplied with the common clock CL, and a write enable signal RwEb, a read enable signal RrEb and a Y address YADDb for the serial memory Rrb. The read serial memory Rrb is electrically connected to an output buffer LOb having output terminals DOib (where i=1 to n) of the port b.

Moreover, the common node PP is electrically connected to a write serial memory Rwb of a port b through the transistor tr4 opened or closed in response to a signal PWb. The write serial memory Rwb of the port b is supplied with the common clock CL, and a write enable signal WwEb, a read enable signal WrEb and a Y address YADDb for the serial memory Rwb. The write serial memory Rwb is electrically connected to an input buffer LIb having input terminals DIib (where i=1 to n) of the port b.

A memory comprised of the four serial memories of the read serial memory Rra of the port a, the write serial memory Rwa of the port a, the read serial memory Rrb of the port b and the write serial memory Rwb of the port b will hereinafter be called "serial memory unit FF". Further, a portion, which consists of the output buffer LOa, the input buffer LIa, the output buffer LOb and the input buffer LIb respectively electrically connected to the four serial memories will be referred to as "input/output unit IIOO".

It is understood that as viewed in the lateral direction of FIG. 1, a set of the middle column unit MM made up of the plurality of column units M adjacent to each other, the opening/closing transistor unit DD electrically connected to the middle column unit MM, the serial memory unit FF electrically connected to the opening/closing transistor unit DD and the two ports (ports a and b) of the input/output unit IIOO electrically connected to the serial memory unit FF constitutes a memory device unit.

Namely, in the memory device unit, the corresponding column unit M of the middle column unit MM, which is selected by the Y decoder and serves as a common memory, is accessed through the serial memory by the input/output unit IIOO of the two ports.

The entire memory is constructed by vertically aligning the memory device unit in plural form as shown in FIG. 1 (at this time, each column unit M shares the use of the word lines WLi and the plurality of memory device units are electrically connected to one another by the word lines WLi).

Now, a middle column unit group, an opening/closing transistor unit group, a serial memory unit group and an input/output unit group are respectively defined as B, D, F and IO. Further, the middle column unit group B will be called "memory portion" and the serial memory unit group F will be referred to as "serial memory portion".

A main memory control signal generating circuit Gm including an internal address generating circuit N to which the clock CL is inputted, is supplied with external input control signals WE/, WEa/ and WEb/ corresponding to memory control signals, an address strobe signal CS/, a port a side address strobe signal CSa, a port b side address strobe signal CSb, the clock CL and addresses, i.e., an X address ADDa with respect to the memory portion of the port a, an X address ADDb with respect to the memory portion of the port b, an address SADDa with respect to the serial memory portion of the port a and an address SADDb with respect to the serial memory portion of the port b. A serial memory control signal generating circuit Gs electrically connected to the main memory control signal generating circuit Gm is supplied as read/write signals with a write signal RwEa with respect to the read serial memory of the port a from the memory portion, a read signal RrEa with respect to the output terminal DO1a from the read serial memory of the port a, a write signal WwEa with respect to the write serial memory of the port a from the input terminal DI1a, a read signal WrEa with respect to the memory portion from the write serial memory of the port a, a write signal RwEb with respect to the read serial memory of the port b from the memory portion, a read signal RrEb with respect to the output terminal DO1b from the read serial memory of the port b, a write signal WwEb with respect to the write serial memory of the port b from the output terminal DO1b, and a read signal WrEb with respect to the memory portion from the write serial memory of the port b. Incidentally, the internal address generating circuit N receives the clock CL therein so as to output an internal X address to the X decoder J and output internal Y addresses YADDa and YADDb to the Y decoder K and the individual serial memories Rra, Rwa, Rrb and Rwb.

The main memory control signal generating circuit Gm, the internal address generating circuit N and the serial memory control signal generating circuit Gs constitute a memory control circuit group G. Only the minimum number of control signals required are illustrated in FIG. 1 to explain a schematic operation of the present embodiment. It is however needless to say that various control signals are actually generated from the memory control circuit group G to activate the memories.

An arbiter H outputs the signal PRa for turning on or off or opening or closing the transistor tr1 constituting the opening/closing transistor unit DD, the signal PWa for opening or closing the transistor tr2 constituting the same, the signal PRb for opening or closing the transistor tr3 constituting the same, and the signal PWb for opening or closing the transistor tr4 constituting the same. The arbiter H is electrically connected to the memory control circuit group G.

The layout of circuit patterns employed in the present embodiment will next be explained with reference to FIGS. 2(a) and 2(b).

The number (corresponding to the number of memory cells connected to their corresponding word lines) of column units constituting a memory array is defined as a. Further, adjacent column units are integrated b by b into a middle column unit. Next, the number of the column units a is divided into n. The Y decoder K selects one of the b column units constituting the middle column unit. The total number of bits of a plurality of serial memories (two in the present embodiment) connected to their corresponding column units is equal to the number of the column units b and hence corresponds to b bits.

The important point of the layout of the circuit patterns employed in the present embodiment is the fact that when the semiconductor device circuit patterns are formed, respective circuit patterns of the opening/closing transistor unit DD for electrically connecting the Y decoder K, the plurality of serial memories (the type of memory is not necessarily limited to the serial memory) and the column units to one another are formed within a middle column unit pitch P.

Namely, patterns for the Y decoder K, the opening/closing transistor unit DD and the serial memory unit FF are formed within a pattern pitch P of each middle column unit as shown in FIG. 2(a). In the present embodiment, the two serial memories are formed within the pattern pitch P of the middle column unit in lengthwise arrangement. FIG. 2(b) shows another example. In the present example, two serial memories are formed within a pattern pitch P of each middle column unit in transverse arrangement.

Incidentally, an I/O device may not be formed within the middle column unit pitch P. In order to collectively place an xn-configured I/O terminal of the port a, which is comprised of a1, a2, a3, . . . an and an xn-configured I/O terminal of the port b, which is made up of b1, b2, b3, . . . bn as shown in FIGS. 2(a) and 2(b), data buses for alternately connecting the I/O terminals and the serial memory units FF as shown in the drawing may be normally drawn from the memory portions to provide convenience.

Figure 3:
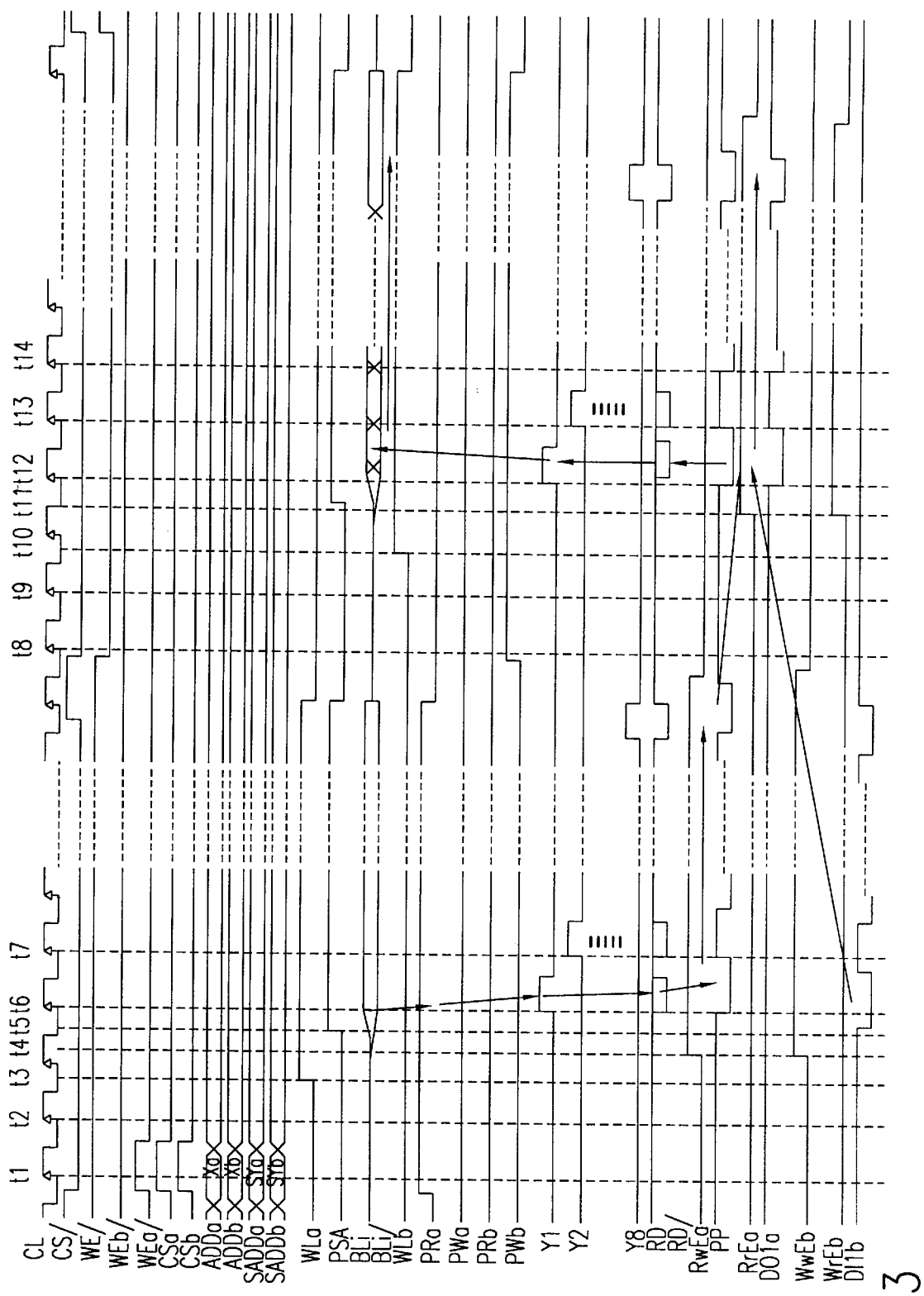
FIG. 3 shows a timing chart of the first embodiment of the present invention.

FIG. 3 shows a timing chart of the first embodiment of the present invention. The operation of the first embodiment of the present invention will be explained below with time with reference to FIG. 3. An example in which data stored in a DRAM memory is outputted from the output terminal DO1a and an example in which data stored in a DRAM memory is inputted from the input terminal DI1b, will now be described as typical ones.

The former example will first be explained.

Since the signal CS/ is low in level on the leading edge of the clock CL at time t1, the DRAM starts operating. Since the port a side address strobe signal CSa is high in level, the address ADDa is taken in or captured as an X address for obtaining access to the DRAM portion for the port a and the address ADDb is captured as an X address for access to the DRAM portion for the port b.

The address SADDa is captured as a leading Y address for serial access on the port a side. As a result, the YADDa is outputted to the Y decoder K and the serial memory Rra of the port a. Since the signal WE/ is high in level at this time, the output PRa of the arbiter H is rendered high in level so that the transistor tr1 is turned ON.

At time t3, the word line WLa selected by the X address captured at time t1 rises or starts up.

Since the signal RwEa is brought to the high level and the output PRa of the arbiter H is high in level so that the transistor tr1 is turned ON, data can be written into the read serial memory Rra of the port a.

At time t5, a sense amp latch signal PSA rises in a state in which information stored in a memory cell connected to the selected word line WLa is being transferred to the bit line pair BLi and BLi/ to activate the corresponding sense amplifier, whereby the memory cell information is amplified on the bit line pair BLi and BLi/.

At time t6, the output Y1 (Y1 will be regarded as selected in the present embodiment) of the Y decoder K is selected in accordance with the leading Y address YADDa for the serial access, which has been captured at time t1, so that the data on the bit line pair BL1 and BL1/ is transferred to the nodes RD and RD/ respectively. Since the signal PRa is high in level, information is written into an address designated or specified by the address YADDa of the read serial memory Rra of the port a through the transistor tr1 as a serial writing leading bit.

The same operations as described above are subsequently made to all the middle column units MM, opening/closing transistor units DD and serial memory units FF simultaneously.

At time t7, the output Y2 (corresponding to one obtained by adding +1 to YADDa) of the Y decoder K is selected so that data on the bit line pair BL2 and BL2/ is transferred to the nodes RD and RD/ respectively. Since the signal PRa is high in level, information is written into an address specified by the address YADDa +1 of the read serial memory Rra of the port a through the transistor tr1.

By repeating the operation at time t7 subsequently, the data stored in the DRAM memory is transferred to the serial memory.

At time t11, the signal RrEa is brought to the high level so that the data can be read into the output terminal DO1a from the serial memory Rra.

At time t12, the leading bit information for the corresponding serial access is read from the serial memory Rra to the output terminal DO1a through the output buffer LOa in synchronism with the leading edge of the clock CL in accordance with the serial-access leading Y address YADDa captured at time t1.

At time t13, the following serial data is read out from the serial memory Rra to the output terminal DO1a through the output buffer LOa in synchronism with the leading edge of the subsequent clock CL.

At time t14, the next serial data is read from the serial memory Rra to the output terminal DO1a through the output buffer LOa in synchronism with the leading edge of the subsequent clock CL.

The same operations as described above are hereafter repeated. As a result, the serial data is read from the serial memory Rra to the output terminal DO1a through the output buffer LOa in synchronism with the clock CL.

The latter example referred to above will next be described.

Since the signal CS/ is low in level and the port b side address strobe signal Csb is high in level upon the leading edge of the clock CL at time t1, the address SADDb is captured as a serial-access leading Y address on the port b side. As a result, the YADDb is outputted to the serial memory Rwb of the port b.

At time t4, the signal WwEb becomes high in level so that information can be written into the serial memory Rwb.

At time t6, the write data inputted to the input terminal DI1b is written into an address specified by the address YADDb of the write serial memory Rwb of the port b via the input buffer LIb as a serial-write leading bit in synchronism with the leading edge of the clock CL.

At time t7, the next write data inputted to the serial data input terminal DI1b is written into the following serial address portion of the write serial memory Rwb of the port b through the input buffer LIb in synchronism with the leading edge of the subsequent clock CL.

By repeating the above operations, the write data inputted to the serial data input terminal DI1b is successively serially written into the write serial memory Rwb of the port b through the input buffer LIb.

Since the signal CS/ is low in level at time t8 upon the leading edge of the clock CL, the DRAM starts operating. The address ADDb has been already captured as the X address at the port b at time t1. Since the signal CSb is low in level, the address YADDb captured at time t1 continues to be stored.

Since the signal WE/ is high in level at this time, the output Pwb of the arbiter H is rendered high so that the transistor tr4 is turned ON.

At time t10, the selected word line WLb rises or starts up in accordance with the X address captured at time t8.

At time t1, the sense amp latch signal PSA rises in a state in which information stored in a memory cell connected to the selected word line WLb is being transferred to the bit line pair BLi and BLi/ to activate the corresponding sense amplifier, whereby the information is amplified on the bit line pair BLi and BLi/. Since the signal WrEb goes high and the signal PWb also goes high here, the information can be written into the DRAM from the serial memory Rwb.

At time t12, the output Y1 (Y1 will be regarded as selected in the present embodiment) of the Y decoder K is selected by the stored serial-access leading Y address YADDb in synchronism with the leading edge of the clock CL, so that the serial-access leading data on the serial memory Rwb is transferred to the bit line pair BL1 and BL1/ through the transistor tr4, whereby the data is written into the corresponding memory cell selected by the word line WLb.

At time t13, the output Y2 of the Y decoder K is selected in synchronism with the leading edge of the clock CL. Thus, the next serial-access data on the serial memory Rwb is transferred to the bit line pair BL2 and BL2/ through the transistor tr4 so that the data is written into the corresponding memory cell selected by the word line WLb.

By repeating the above-described operations, the data on the serial memory Rwb is serially written into the DRAM. The same operations as described above are simultaneously effected on all the middle column units MM, opening/closing transistor units DD and serial memory units FF.

Incidentally, the above explanation for the operation of the arbiter H does not hold water. Therefore, the operation of the arbiter H will be further described below.

When, for example, the data have already been inputted to the write serial memory Rwa of the port a and the write serial memory Rwb of the port b from the input terminals DI1a and DI1b respectively and the data has been written into the write serial memory Rwa of the port a previously, the arbiter H serves so as to allow the signal PWa to take precedence over the signal PWb. Namely, when the signal CS/ becomes low in level and the signal WE/ becomes low in level so as to write the data from the serial memory to the DRAM (immediately before time t8 in FIG. 3), the arbiter H renders the signal PWa high without taking the signal PWb high. As a result, the transistor tr2 is turned ON so that the data can be written into the DRAM from the serial memory Rwa.

At this time, the signal WEa is previously brought to a low level and the CSa is brought to a high level. The addresses ADDa and ADDb captured upon the leading edge of the clock CL are stored and used as the X and Y addresses for the port a. Thus, the arbiter H serves so as to allow the output indicative of the signal PWa to take precedence over the output indicative of the signal PWb and allow the operation of writing of the data into the DRAM from the port a to take precedence over the operation of writing of the data into the DRAM from the port b.

Thereafter, the signal WEb results in the low level and the signal CSb results in the high level. Thus, the addresses ADDb and ADDb captured upon the leading edge of the clock CL are stored and used as the X and Y addresses for the port b.

According to the first embodiment of the present invention, as has been described above in detail, a memory very high in performance can be provided for a network system.

Further, the patterns of the opening/closing transistor units DD connected to the middle column units MM and the serial memory units FF each comprised of the plurality (n) of serial memories connected to the opening/closing transistor units DD are formed within the circuit pattern pitch P of each column unit having the adjacent column units connected to one another in plural form. Thus, a plurality of wide high-speed buffers that could not be achieved at all in the conventional discrete method, can be formed on one chip together with memories with a small space. Further, since a plurality of buffer memories are directly connected to one another at close range, the reading and writing of data from and to the memories can be speeded up so that the throughput or the quantity of information to be processed can be increased significantly.

Further, according to the first embodiment of the present invention, a memory macro, which can take advantage of a merit that mixed wide memories can be utilized, can be provided for an application in which memories and large-scale logic ICs are to be loaded into one chip in mixed form.

Figure 4:
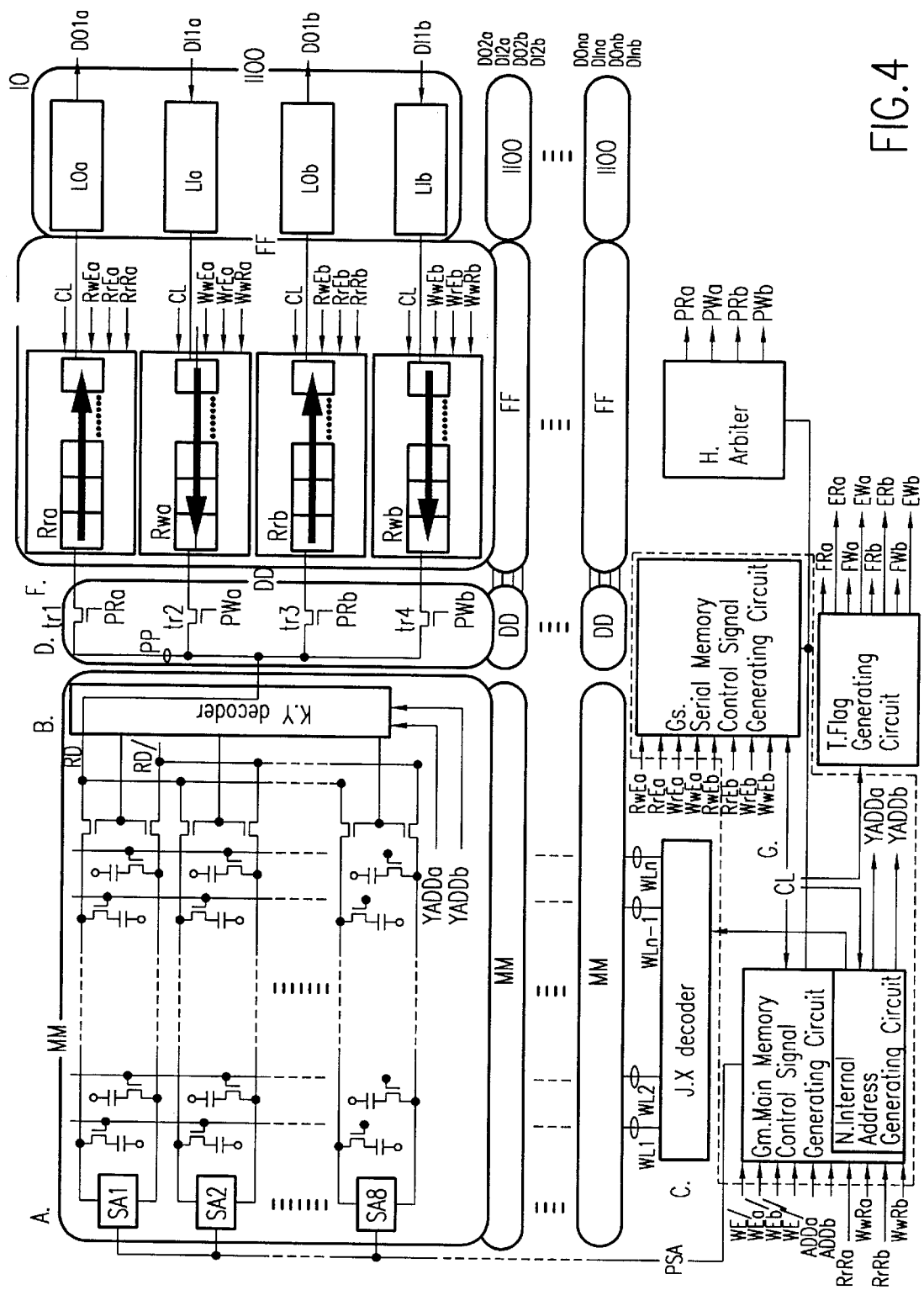
FIG. 4 is a block diagram of a second embodiment of the present invention.

A block diagram of a second embodiment of the present invention will next be shown as FIG. 4. In the second embodiment, the serial memories employed in the first embodiment are replaced by simple shift registers respectively.

As is apparent from the comparison between FIG. 1 and FIG. 4, the second embodiment is similar in connection relation to the first embodiment. However, since the first embodiment is random-accessible, the address strobe signals and the address signals exist. On the other hand, the second embodiment does not include them but includes reset signals RrRa, WwRa, RrRb and WwRb for Y addresses (serial addresses) in place of them. Further, a flag generating circuit T is additionally provided in the second embodiment.

Figure 5:
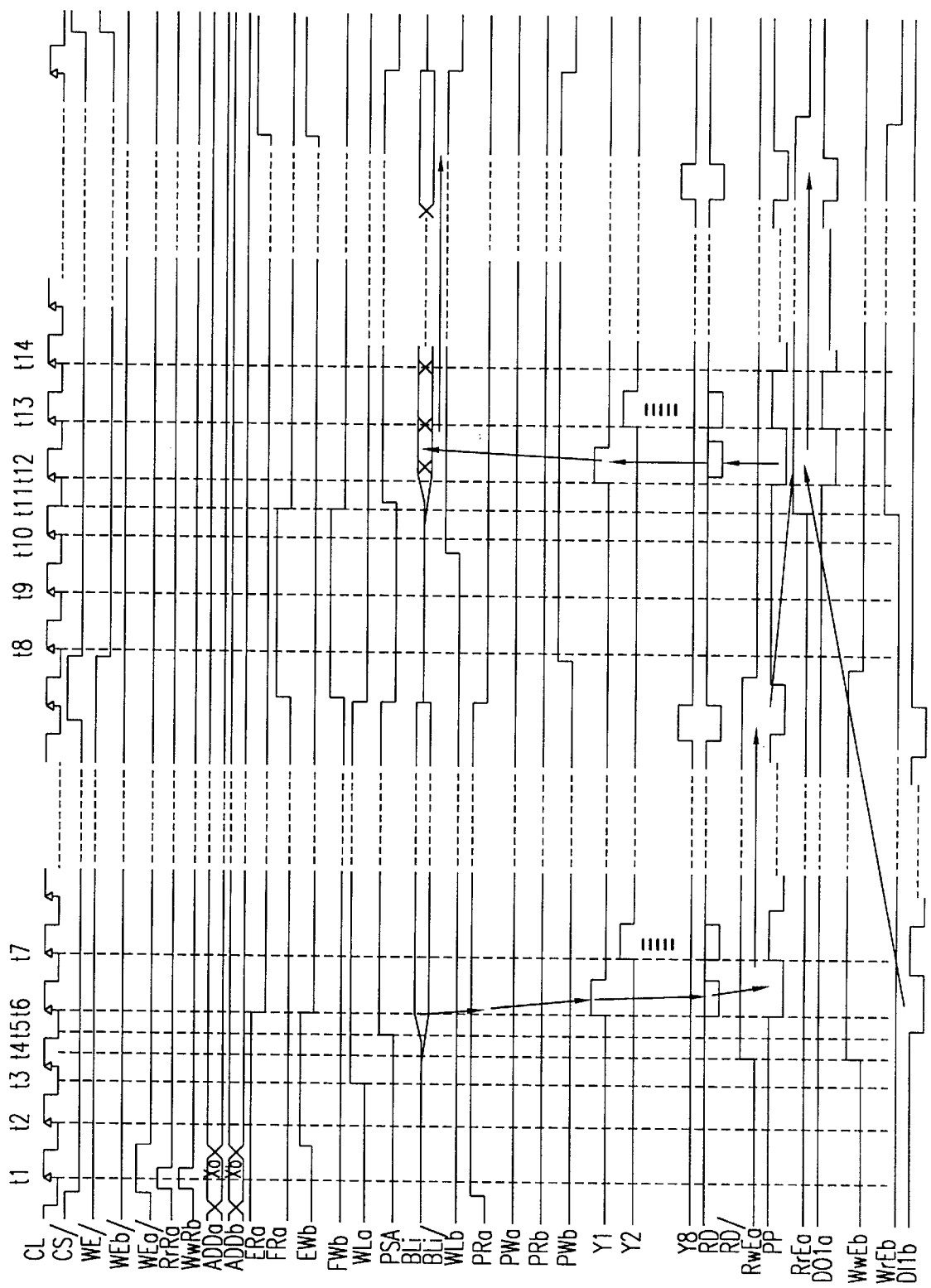
FIG. 5 is a timing chart for describing the operation of the second embodiment of the present invention.

FIG. 5 is a timing chart for describing the operation of the second embodiment of the present invention. Since the second embodiment is substantially identical in operation to the first embodiment, its description will be omitted. The second embodiment is different from the first embodiment in that the first embodiment has the address strobe signals and the address signals because of being random-accessible, whereas the second embodiment is reset by the reset signals for the Y addresses (serial addresses).

A third embodiment of the present invention will hereinafter be described in brief using a block diagram.

Figure 6:
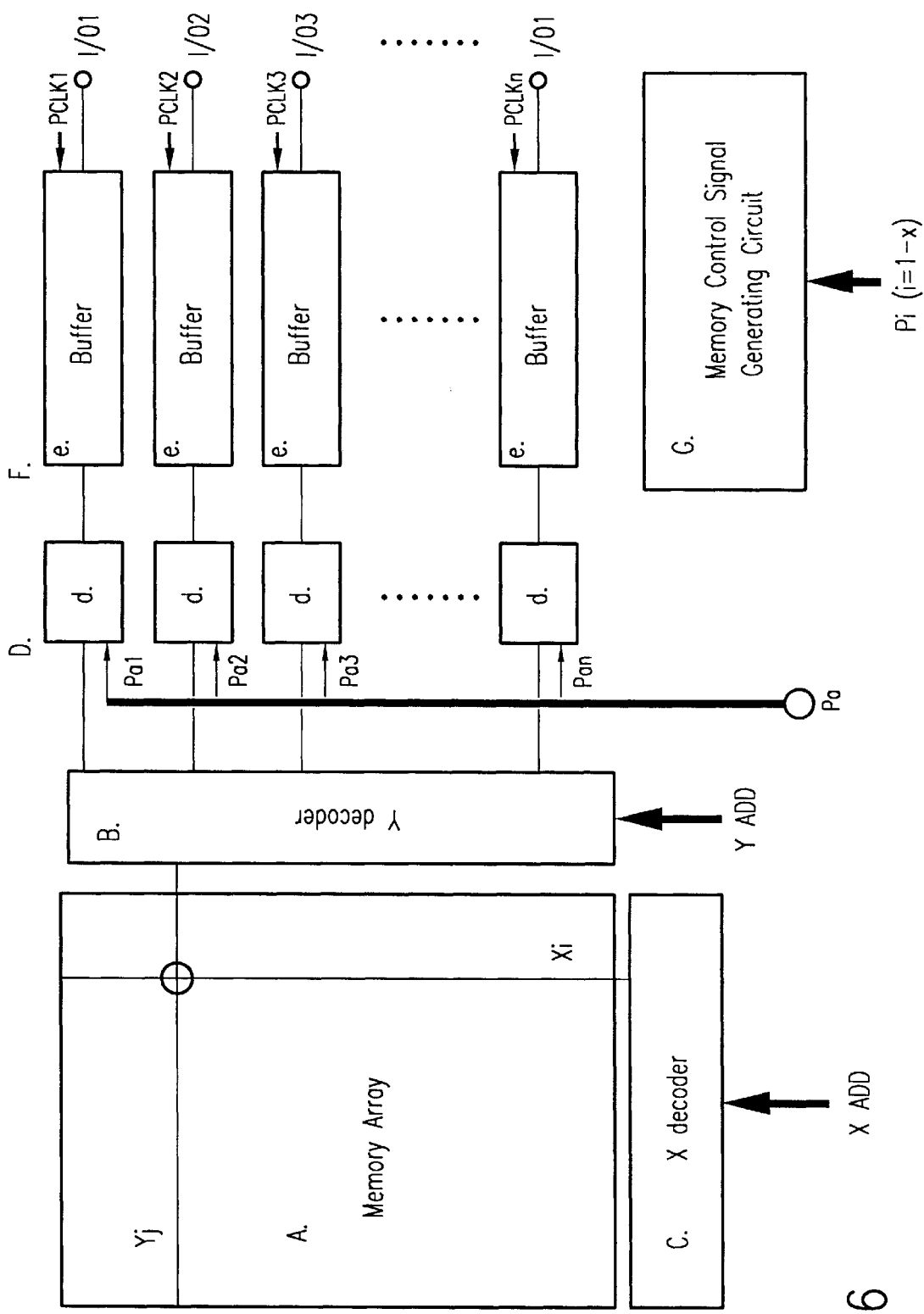
FIG. 6 is a block diagram showing the third embodiment of the present invention.

FIG. 6 is a block diagram showing the third embodiment of the present invention.

The third embodiment includes a memory array A having a column unit group comprised of a plurality of adjacent column units, a Y decoder B electrically connected to the column unit group and an X decoder C. The respective column units in the memory array A commonly use the X decoder C. The Y decoder B is electrically connected to a plurality of buffers e through a plurality of opening/closing switches d. Input/output terminals I/O1 to I/On are electrically connected to their corresponding buffers e. The plurality of opening/closing switches d are respectively controlled by control signals Pa1 to Pan sent from an opening/closing control signal terminal Pa.

The third embodiment is characterized in that the plurality of buffers respectively electrically connected to the input/output terminals are respectively electrically connected to the individual Y decoder units of the middle memory column units through the opening/closing switches.

Figure 7:
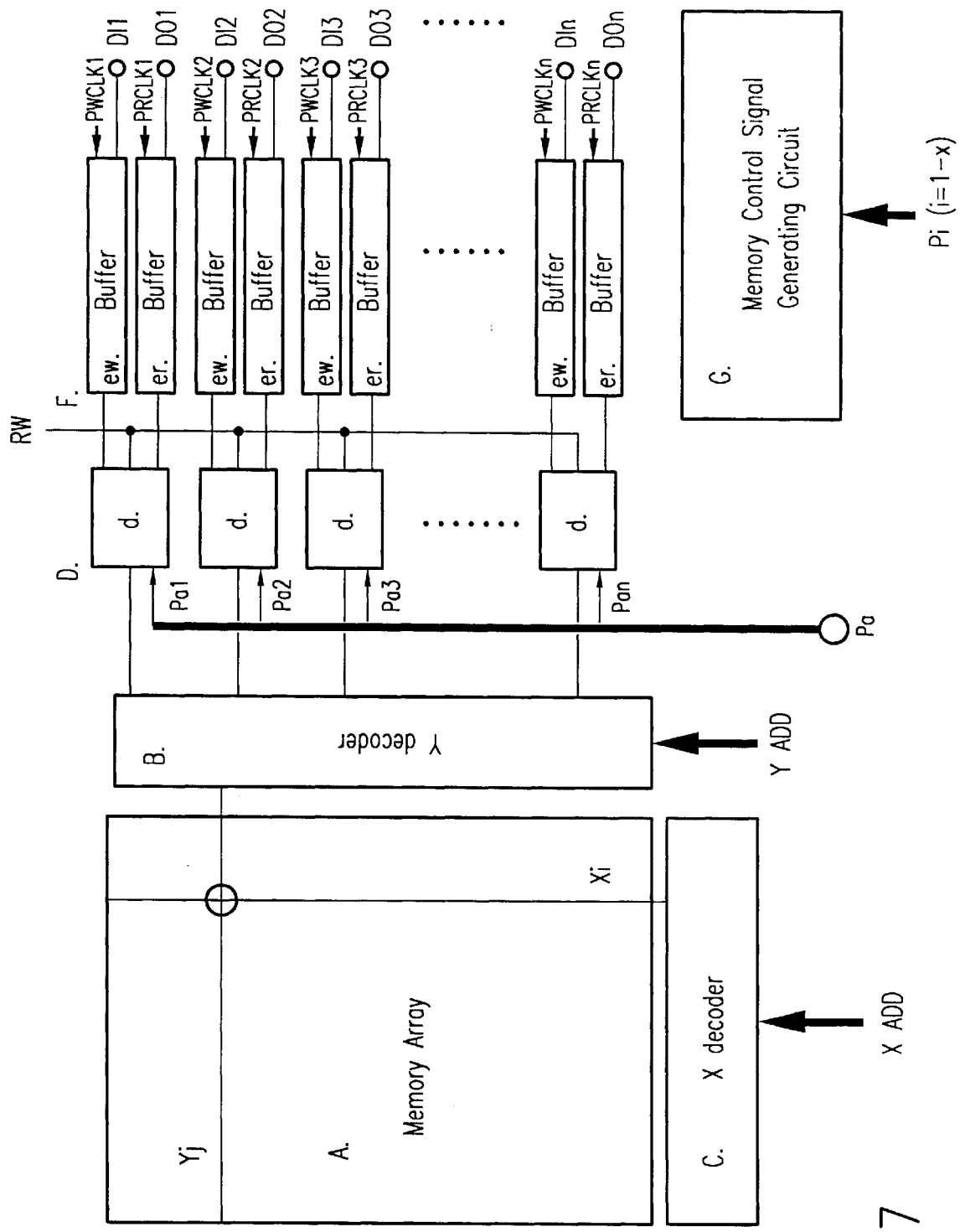
FIG. 7 is a block diagram showing a fourth embodiment of the present invention.

FIG. 7 is a block diagram showing a fourth embodiment of the present invention.

In the fourth embodiment, the buffers e employed in the third embodiment are respectively replaced by input-output independent buffers ew and er. Correspondingly, a read/write control signal RW is inputted to opening/closing switches. Further, input terminals DI1 to DIn and output terminals DO1 to DO1n are respectively electrically connected to the buffers ew and er.

Since the buffers are provided in I/O separate form in the fourth embodiment, the read buffers can accept inputs from the same ports even when they are outputting outside.

Figure 8:
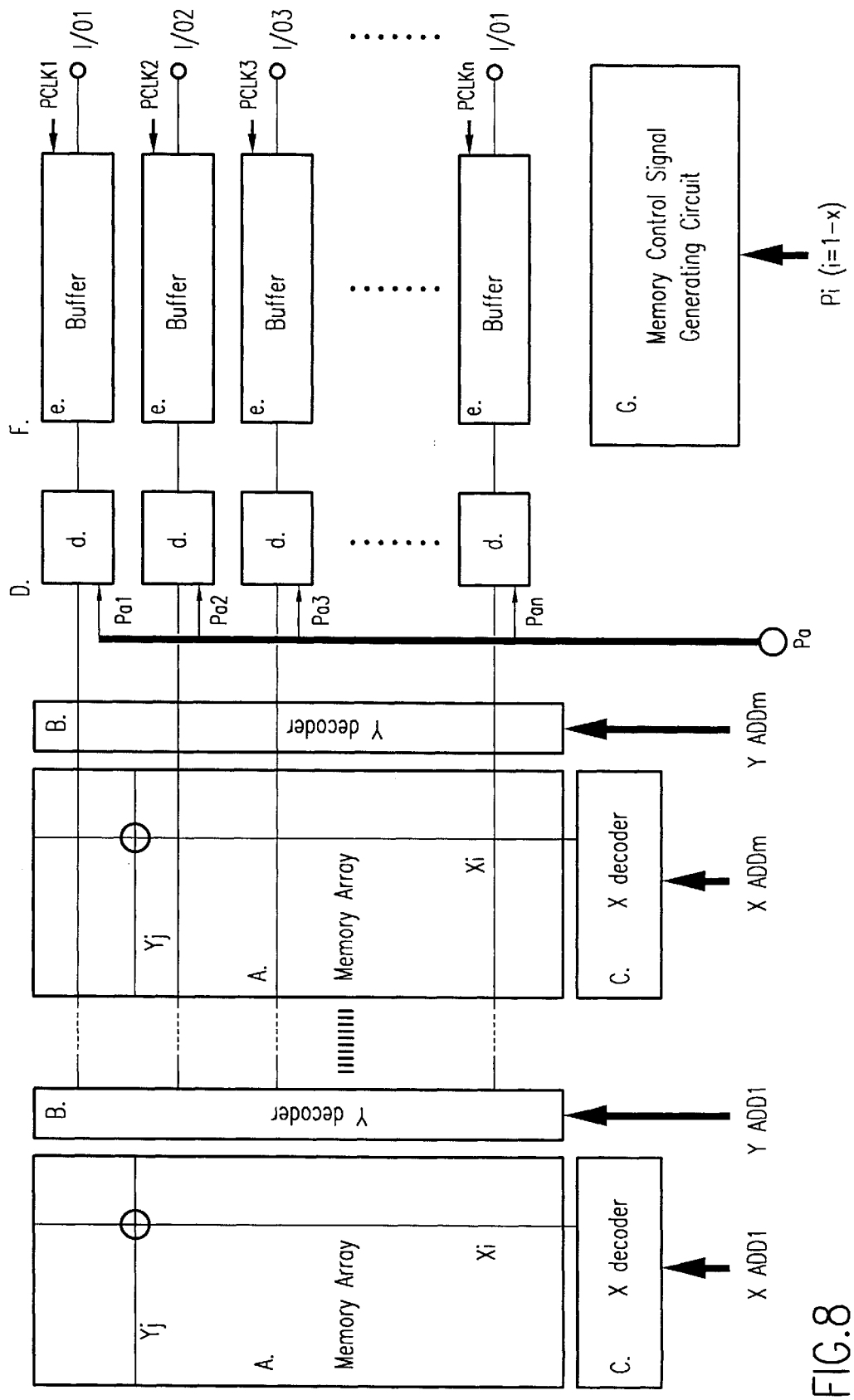
FIG. 8 is a block diagram illustrating a fifth embodiment of the present invention.

FIG. 8 is a block diagram illustrating a fifth embodiment of the present invention.

In the fifth embodiment, the memory array A employed in the third embodiment is divided into a plurality of memory arrays A1 to Am. Y decoders B1 to Bm and X decoders C1 to Cm are respectively provided for the memory arrays A1 to Am. Thus, since the memory arrays (memory banks) are provided in plural form, the start up of each word line and the amplification of information by each sense amplifier subsequent to its start up can be performed for every memory bank in the case of, for example, a DRAM. Thus, while a word line is being booted up by one memory bank, another memory bank can amplify information.

Figure 9:
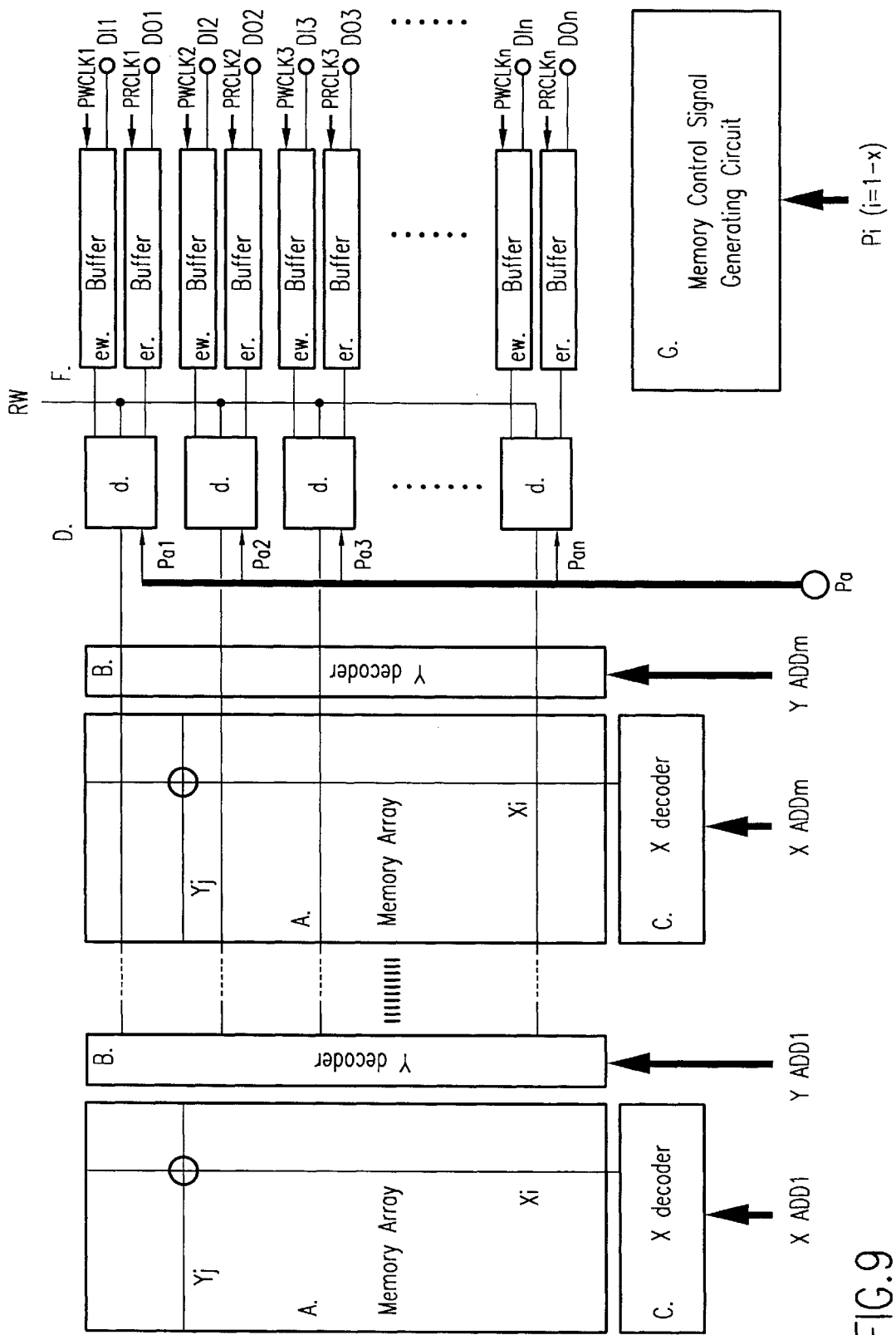
FIG. 9 is a block diagram showing a sixth embodiment of the present invention.

FIG. 9 is a block diagram showing a sixth embodiment of the present invention.

In the sixth embodiment, the buffers e employed in the fifth embodiment are respectively replaced by input/output-independent buffers ew and er. With the provision of the input/output-independent buffers, a read/write control signal RW is inputted to opening/closing switches and input terminals DI1 to DIn and output terminals DO1 to DO1n are respectively electrically connected to the buffers ew and er.

The sixth embodiment can combine an advantageous effect obtained in the fifth embodiment with an advantageous effect obtained in the fourth embodiment.

Figure 10:
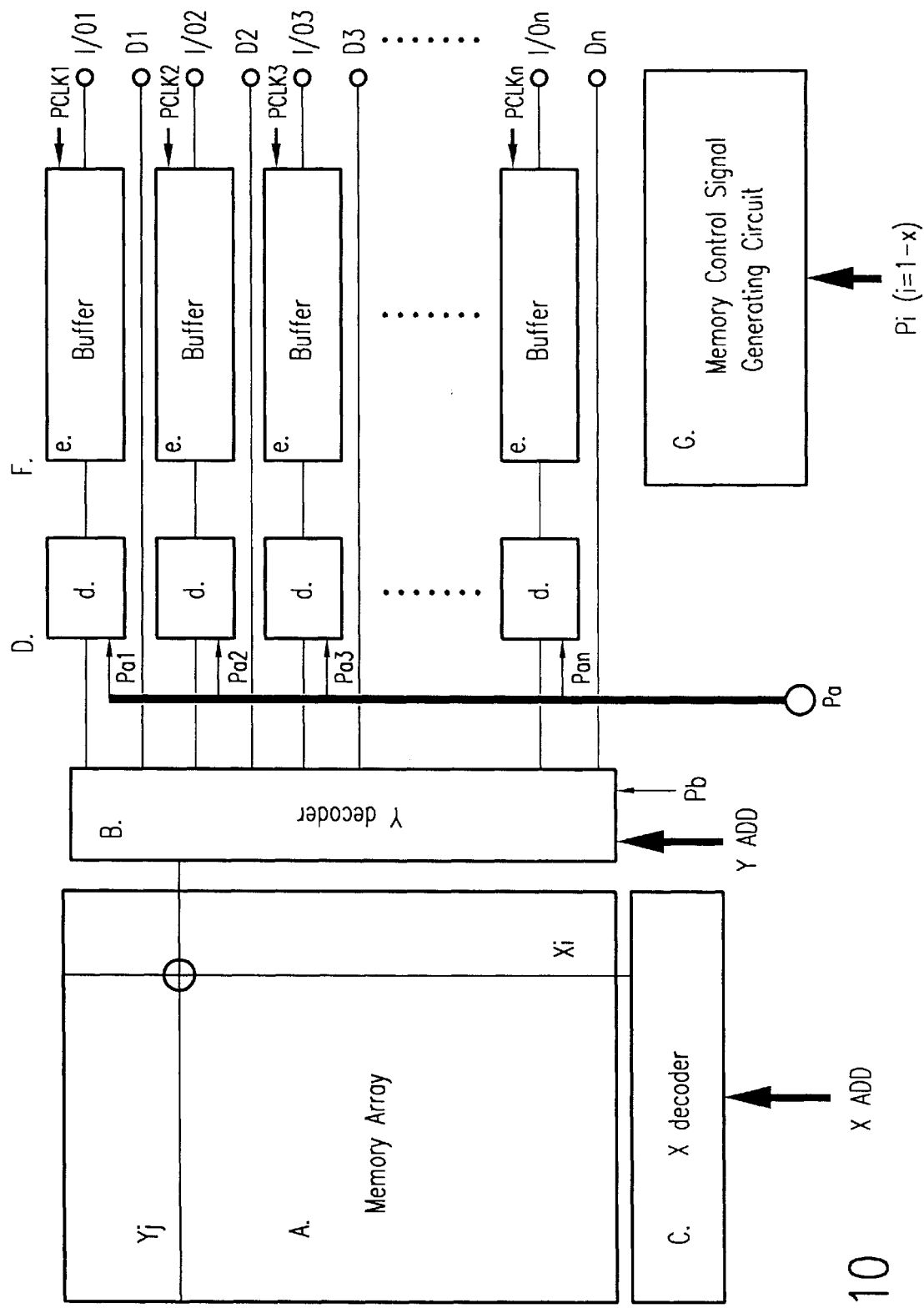
FIG. 10 is a block diagram showing a seventh embodiment of the present invention.

FIG. 10 is a block diagram showing a seventh embodiment of the present invention.

In the seventh embodiment, output terminals D1 to Dn are electrically connected to the Y decoder B so as to allow direct access to the DRAM without having to use the buffers e employed in the third embodiment.

Figure 11A:
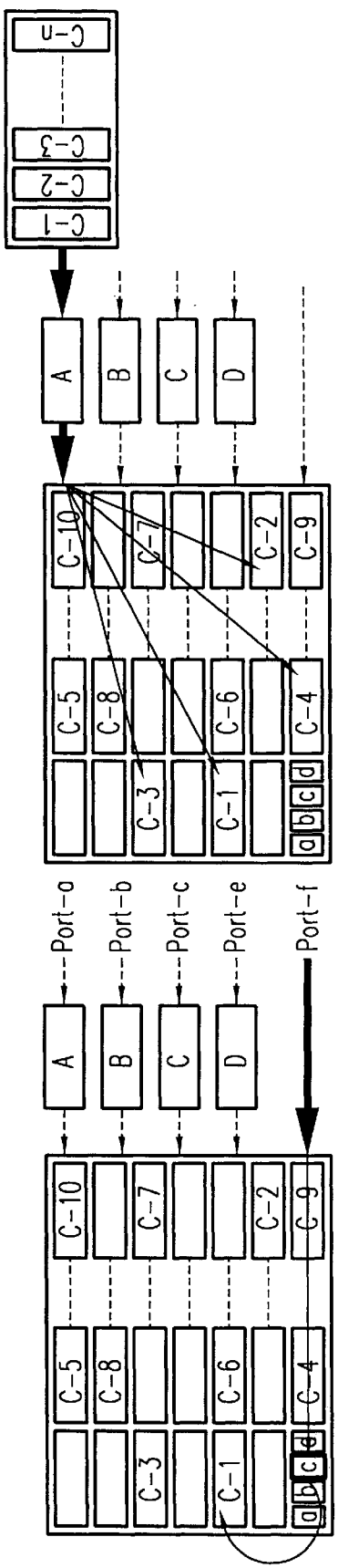
FIGS. 11(a) to 11(d) shows an advantageous effect of the seventh embodiment.

An advantageous effect of the seventh embodiment will be explained with reference to FIGS. 11(a) to 11(d). FIG. 11(a) shows an image diagram of the writing or reading of packet data from or to a common memory unit 1 through input/output terminals of four ports a, b, c and d. Symbols A, B, C and D indicate buffers in a serial memory unit 2. A port f is a terminal provided without being through a buffer.

When information is written into memories through switches of a network application, e.g., information for a destination C is resolved into several packets, followed by delivery to their corresponding memories one after another. In the present embodiment, the packets are defined as C-1, C-2, C-3, . . . C-n in turn (see FIG. 11(b)).

As shown in FIG. 11(a), the input data is not necessarily written into continuous regions in the memory array. There is a possibility that data will be written from other ports at the same period. The pieces of packet information are written into the memory unit 1 at random as shown in FIG. 11(a). Even if the respective packets are randomly stored in the memory unit 1, the respective information can be automatically reproduced if the packets respectively have addresses at which the following packets are held. Namely, if the determined leading address is stored in the memory unit 1, the first packet C-1 can be read by reference to it. Since the address at which the packet C-2 has been stored, is being written into the packet C-1, the packet C-2 can be read. This repetition allows the reproduction of all the information.

Figure 11B:
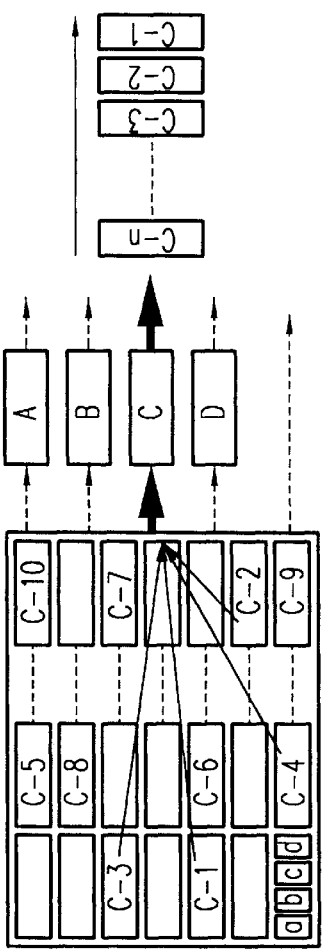

Since the port f is provided aside from the four ports as shown in FIG. 11(a), an address to directly write the packet C-1 can be written into a region c through the port f without having to use the buffers as in the case of other ports upon writing the packet information into the memory unit 1. At this time, the destination may be written into the region c. Thereafter, the respective packets are continuously written into the memory unit through the buffer A as shown in FIG. 11(b).

Figure 11C:
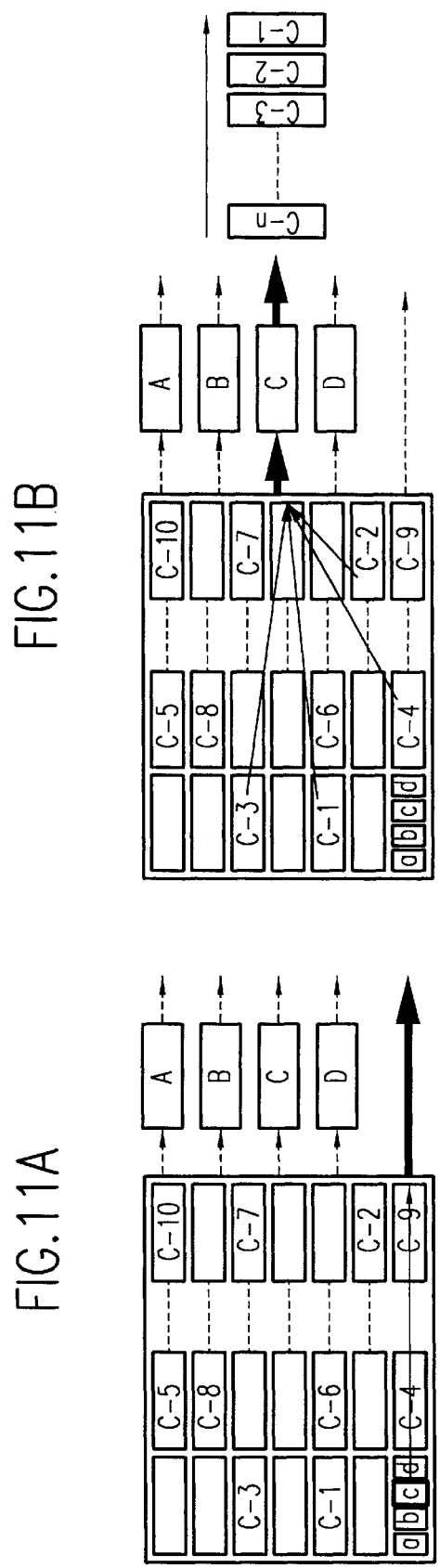
Figure 11D:

As is the case with the above even upon reading the packet information from the memory unit 1, an address at which the packet C-1 has been stored, can be quickly recognized through the port f without having to use the buffers as in the case of other ports because the port f is provided aside from the four ports as shown in FIG. 11(c). Thereafter, information can be successively read from the port c designated as the destination as shown in FIG. 11(d).

It is necessary to read and write information itself to and from memories through various ports by means of buffers according to time and circumstances. However, the reading and writing of the leading address of information stored in each memory from and to a specific place in the memory by using a determined or fixed terminal are efficient and quick. As in the seventh embodiment, the electrical connection of the terminal without having to use the buffer to the Y decoder makes this memory device more convenient.

Figure 12:
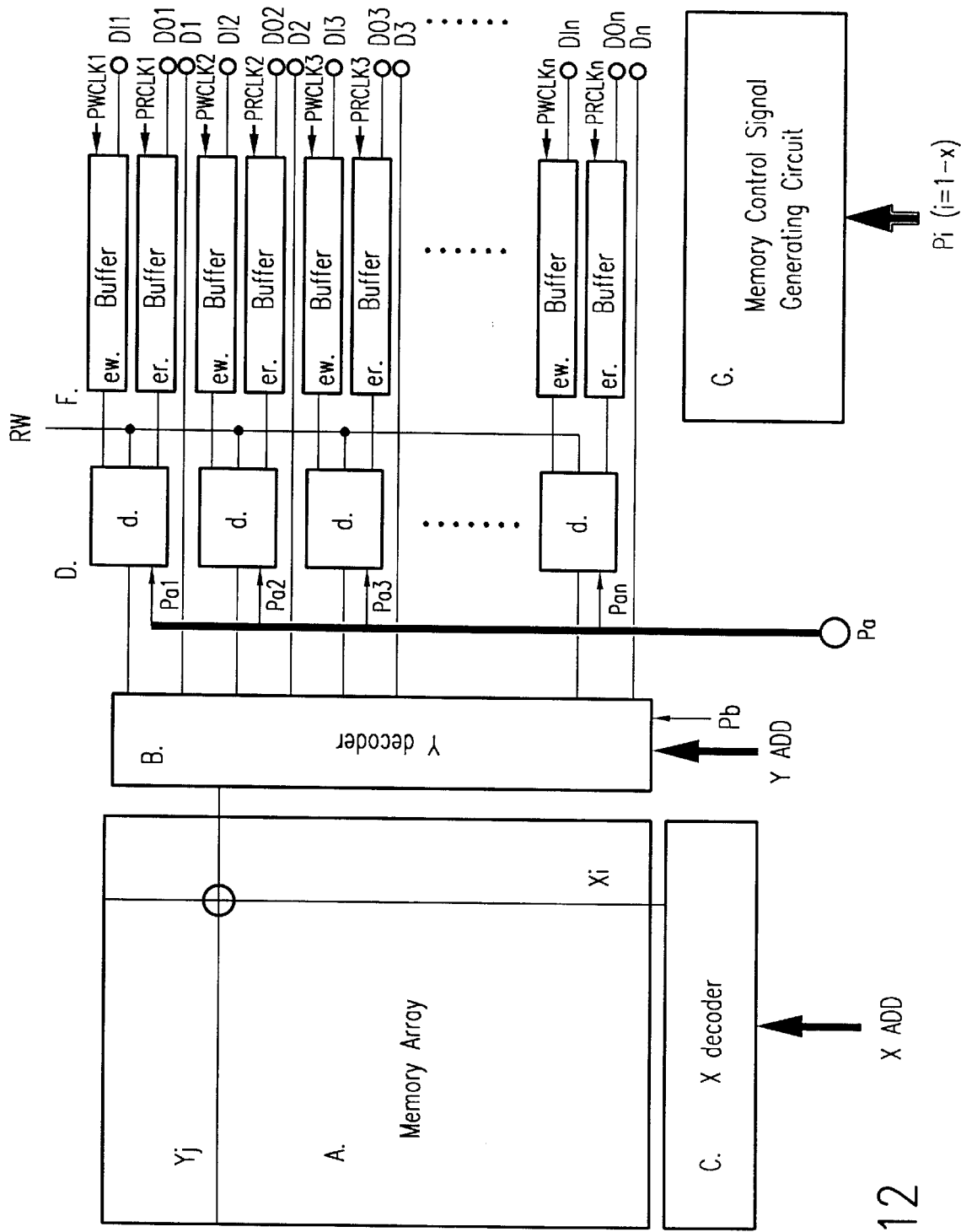
FIG. 12 is a block diagram showing an eighth embodiment of the present invention.

FIG. 12 is a block diagram showing an eighth embodiment of the present invention.

In the eighth embodiment, output terminals D1 to Dn are electrically connected to a Y decoder B so as to allow direct access to a DRAM without having to use the buffers e in the fourth embodiment.

Figure 13:
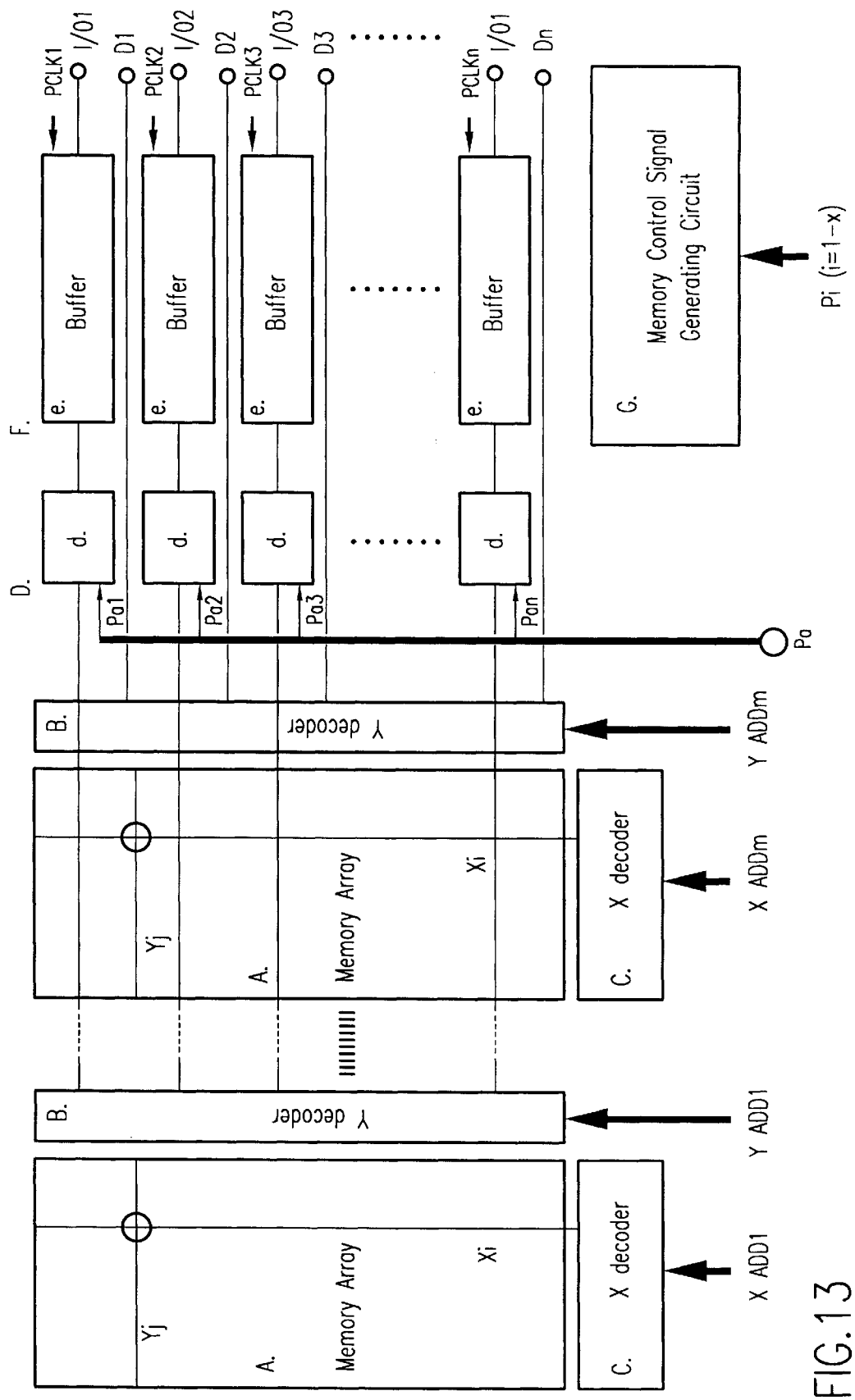
FIG. 13 is a block diagram illustrating a ninth embodiment of the present invention.

FIG. 13 is a block diagram illustrating a ninth embodiment of the present invention.

In the ninth embodiment, output terminals D1 to Dn are electrically connected to a Y decoder B so as to permit direct access to a DRAM without having to use the buffers e in the fifth embodiment.

Figure 14:
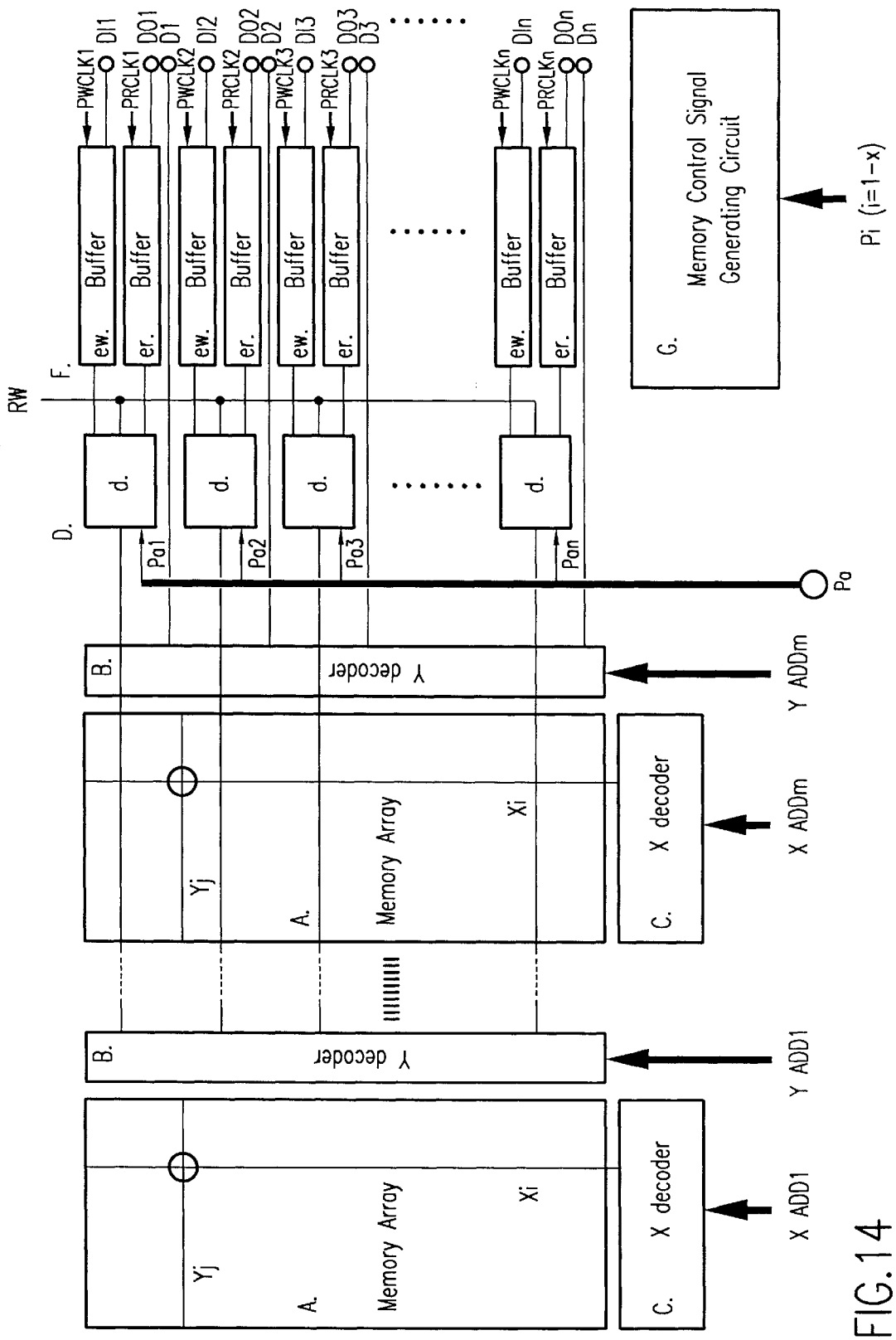
FIG. 14 is a block diagram depicting a tenth embodiment of the present invention.

FIG. 14 is a block diagram depicting a tenth embodiment of the present invention.

In the tenth embodiment, output terminals D1 to Dn are electrically connected to a Y decoder B so as to allow direct access to a DRAM without having to use the buffers e in the sixth embodiment.

Figure 15:
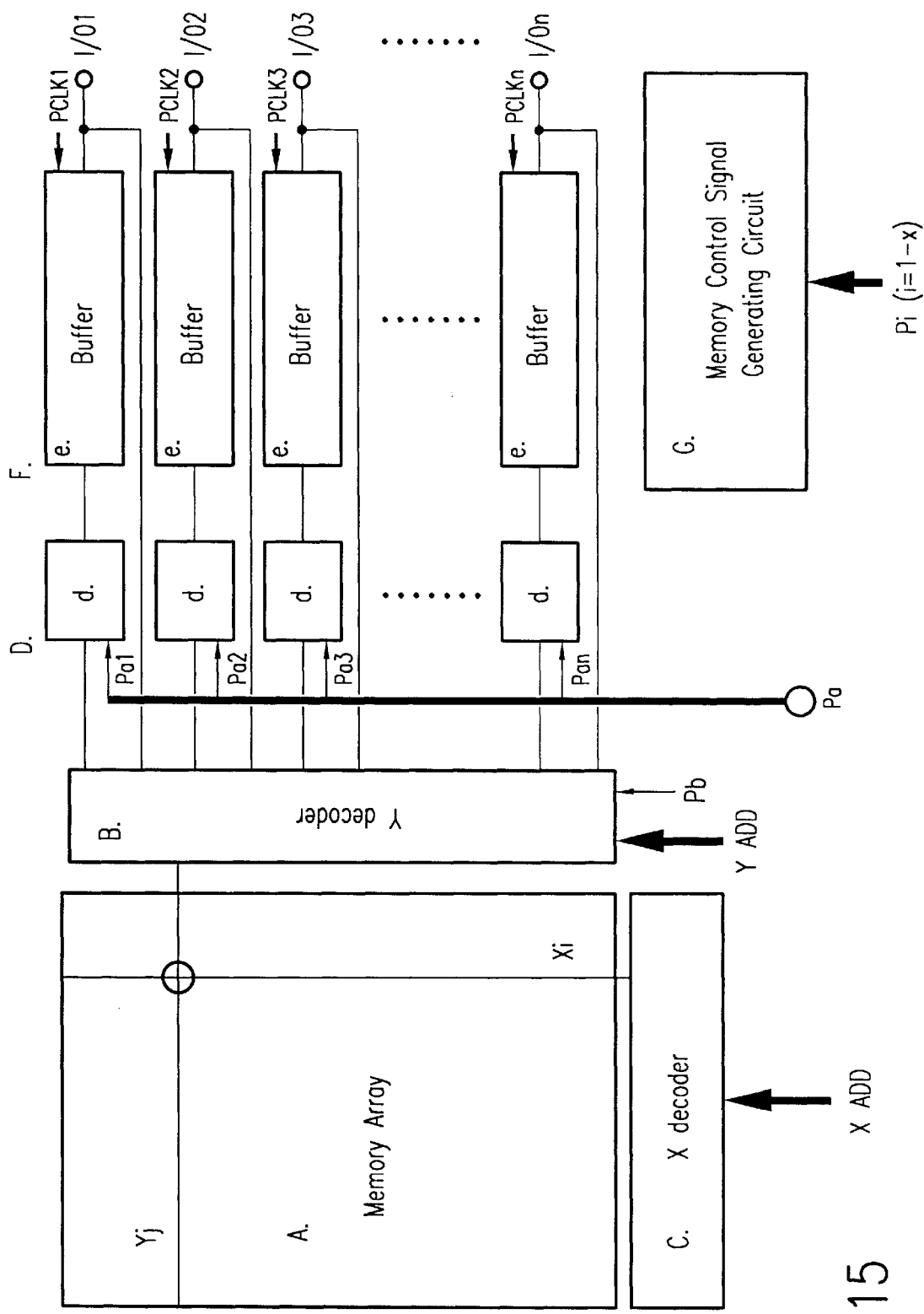
FIG. 15 is a block diagram showing an eleventh embodiment of the present invention; embodiment of the present invention.

FIG. 15 is a block diagram showing an eleventh embodiment of the present invention.

In the eleventh embodiment, input/output terminals I/O1 to I/On share the use of the input/output terminals I/O1 to I/On and the output terminals D1 to Dn employed in the seventh embodiment.

Figure 16:
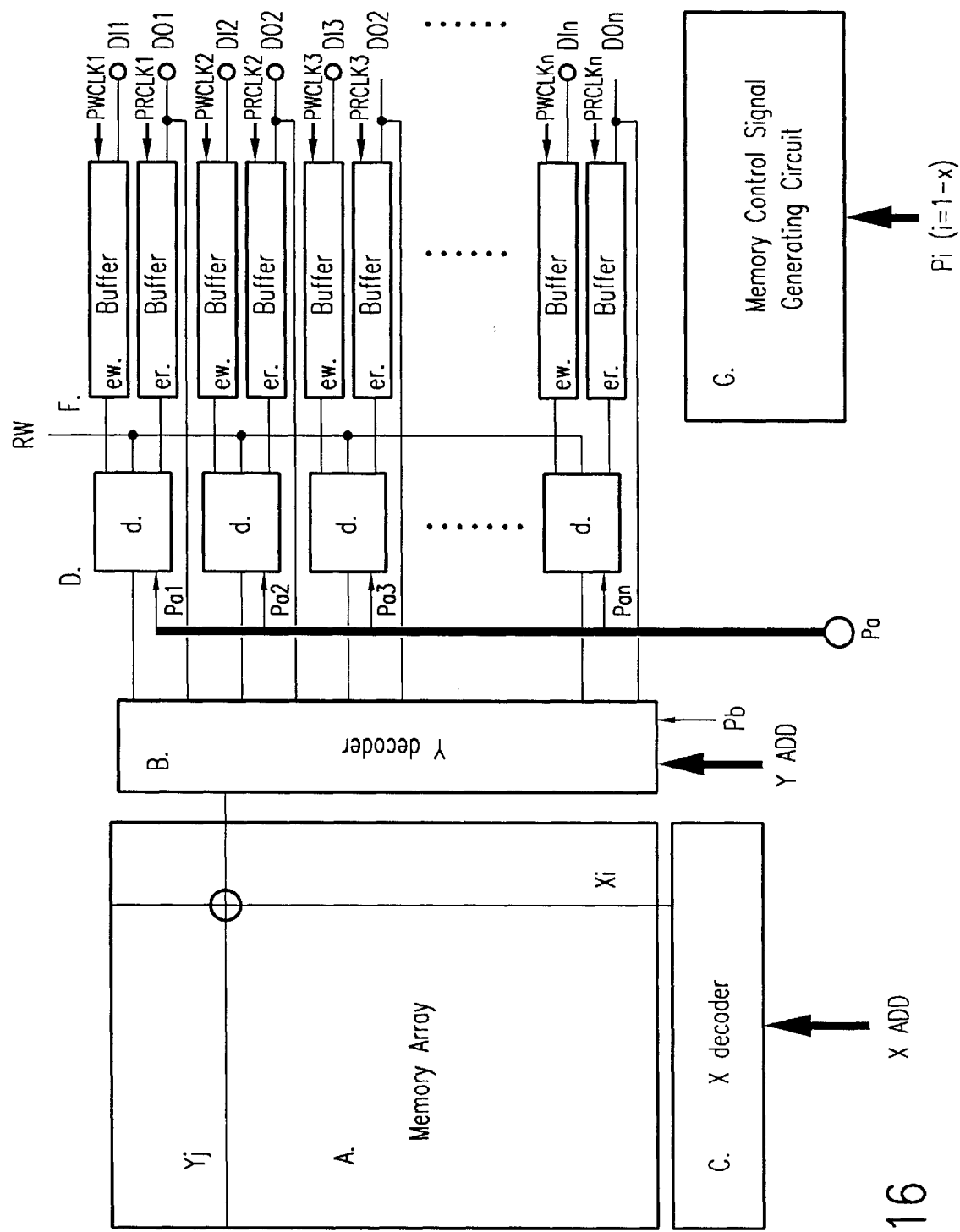

FIG. 16 is a block diagram illustrating a twelfth embodiment of the present invention.

In the twelfth embodiment, output terminals DO1 to DOn share the use of the output terminals DO1 to DOn and the output terminals D1 to Dn employed in the eighth embodiment.

Figure 17:
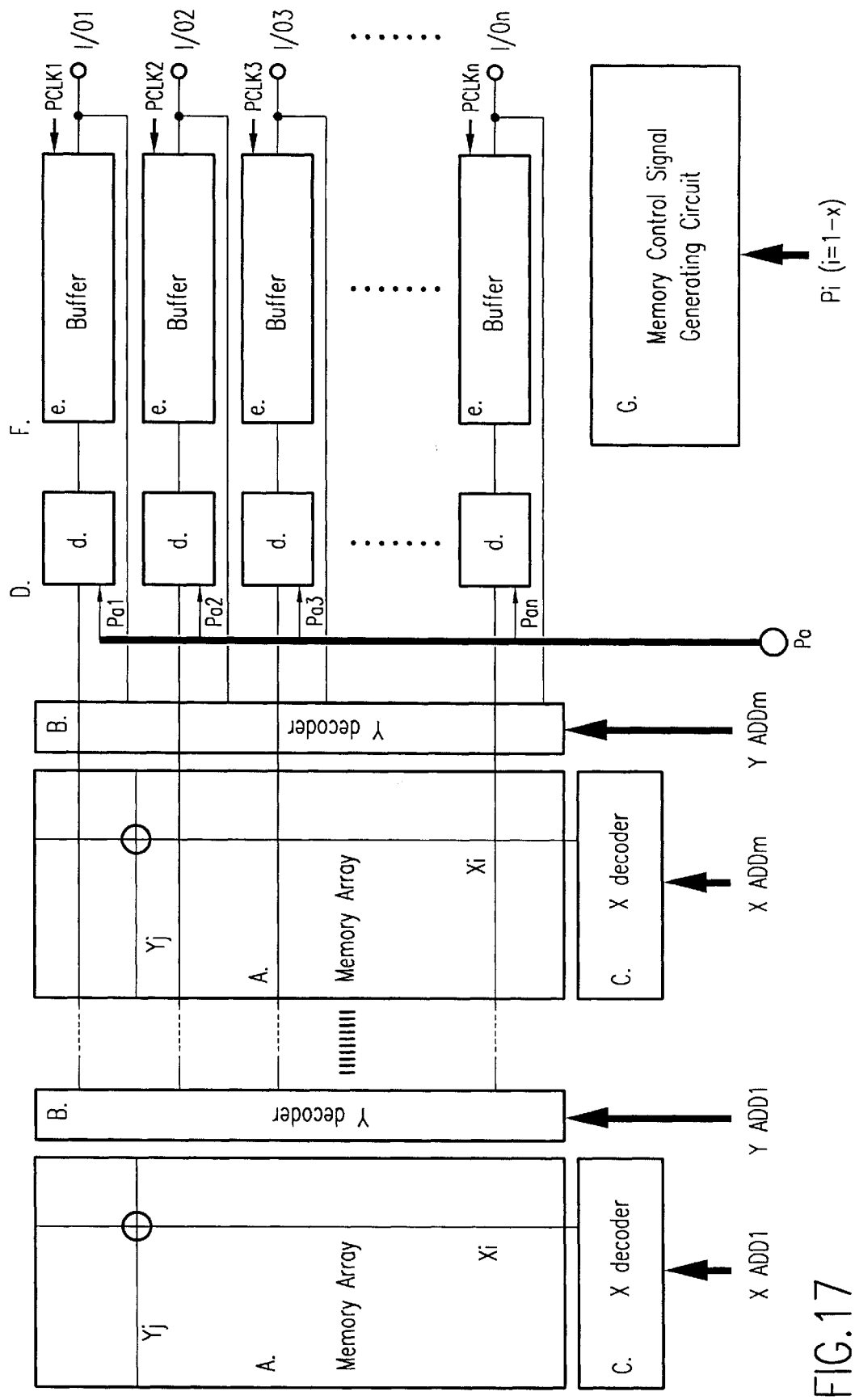
FIG. 17 is a block diagram depicting a thirteenth embodiment of the present invention.

FIG. 17 is a block diagram depicting a thirteenth embodiment of the present invention.

In the thirteenth embodiment, input/output terminals I/O1 to I/On share the use of the input/output terminals I/O1 to I/On and the output terminals D1 to Dn employed in the ninth embodiment.

Figure 18:
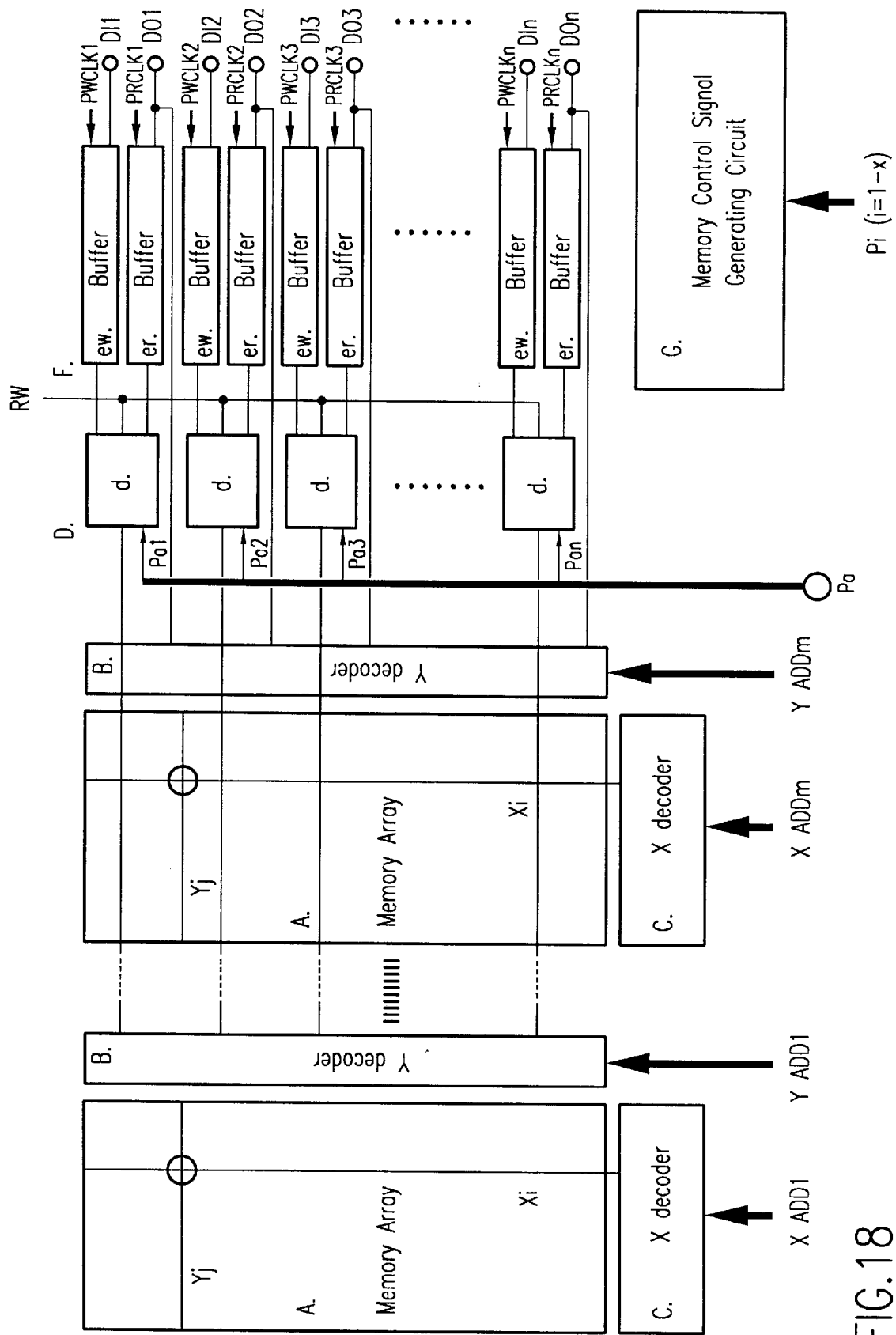
FIG. 18 is a block diagram illustrating a fourteenth embodiment of the present invention.

FIG. 18 is a block diagram illustrating a fourteenth embodiment of the present invention.

In the fourteenth embodiment, output terminals DO1 to DOn share the use of the output terminals DO1 to DOn and the output terminals D1 to Dn employed in the tenth embodiment.

Figure 19:
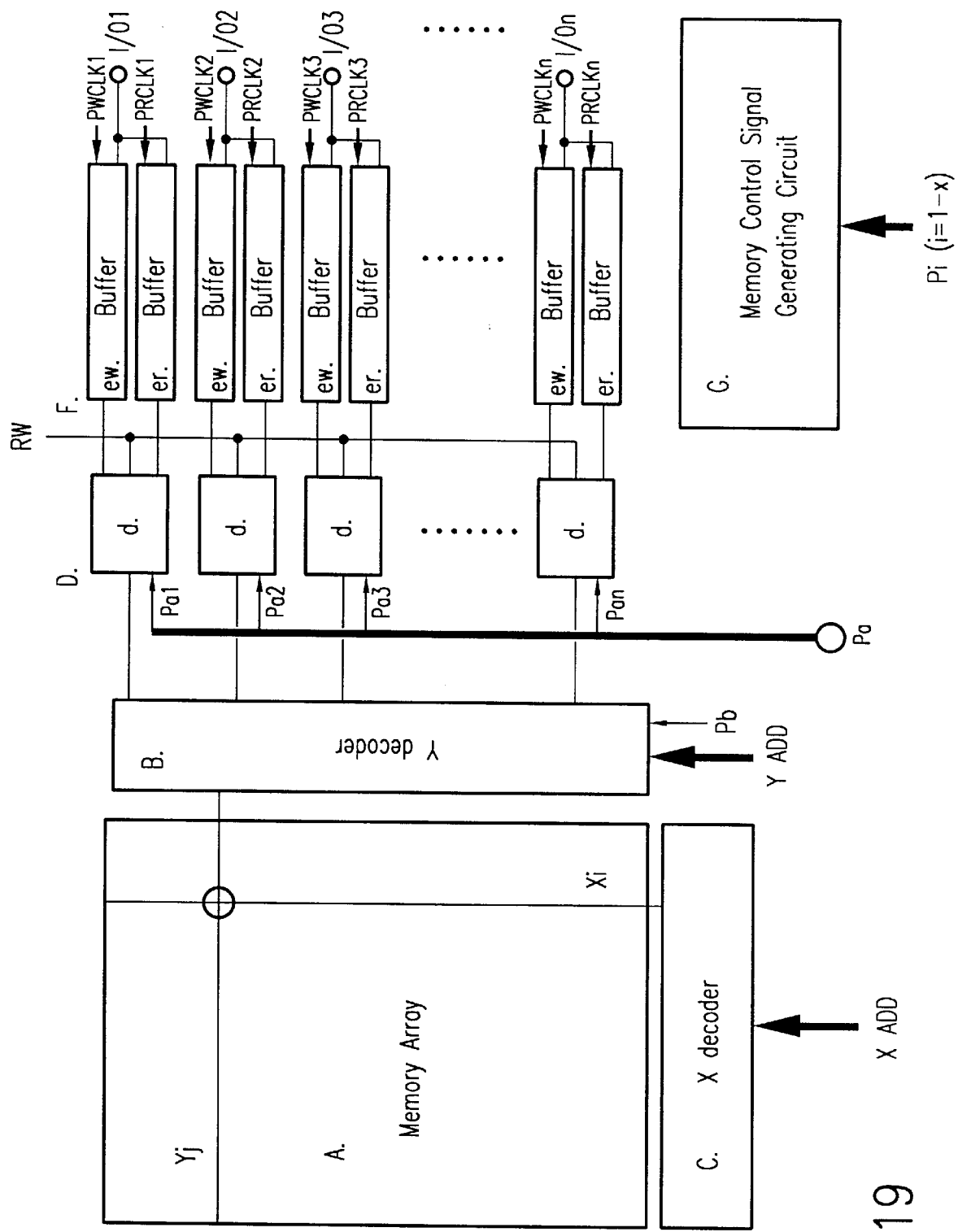
FIG. 19 is a block diagram depicting a fifteenth embodiment of the present invention.

FIG. 19 is a block diagram depicting a fifteenth embodiment of the present invention.

In the fifteenth embodiment, input/output terminals I/O1 to I/On share the use of the output terminals DO1 to DOn and input terminals DI1 to DIn employed in the sixth embodiment.

Figure 20:
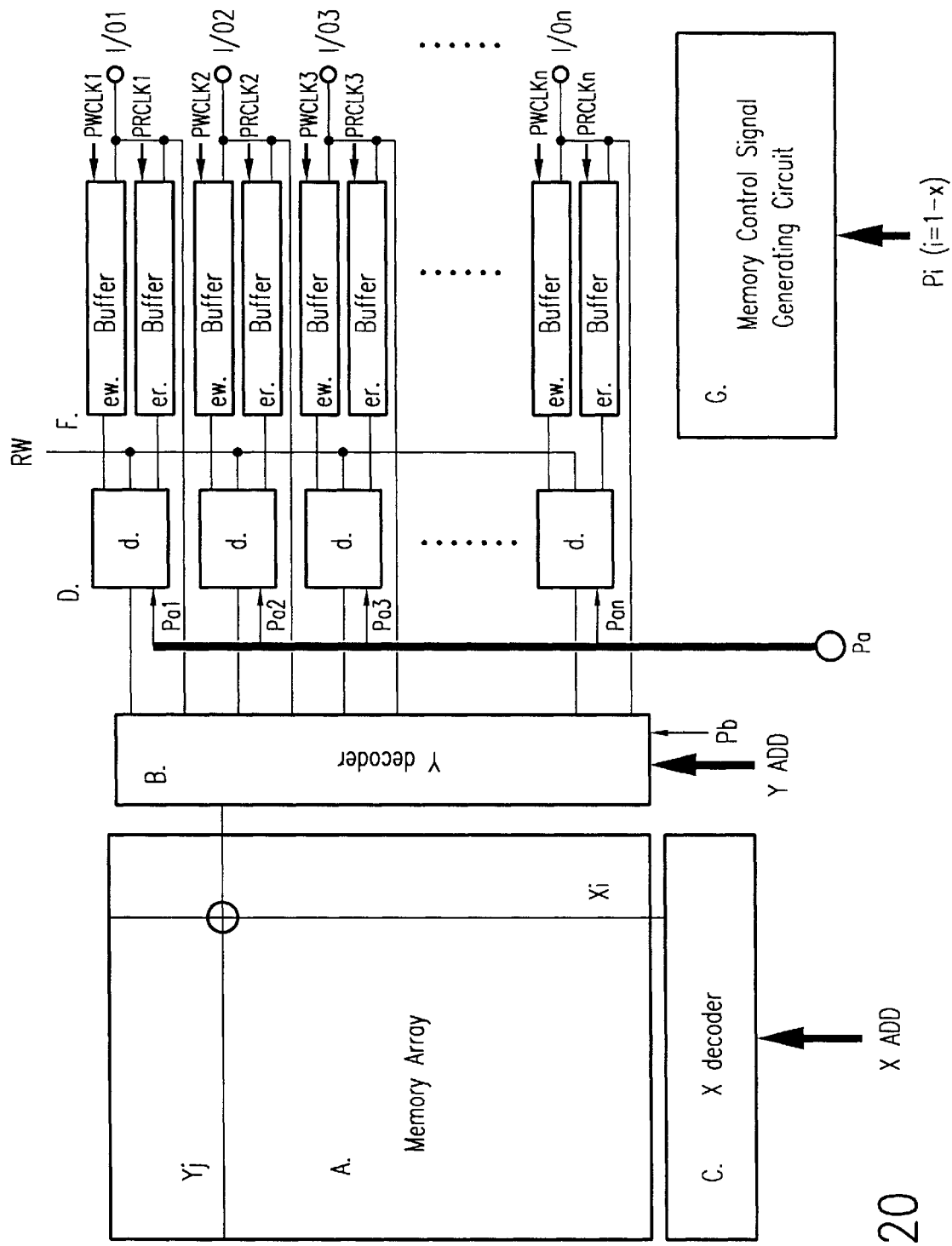
FIG. 20 is a block diagram showing a sixteenth embodiment of the present invention.

FIG. 20 is a block diagram showing a sixteenth embodiment of the present invention.

In the sixteenth embodiment, input/output terminals I/O1 to I/On share the use of the output terminals DO1 to DOn and output terminals D1 to Dn employed in the eighth embodiment.

Figure 21:
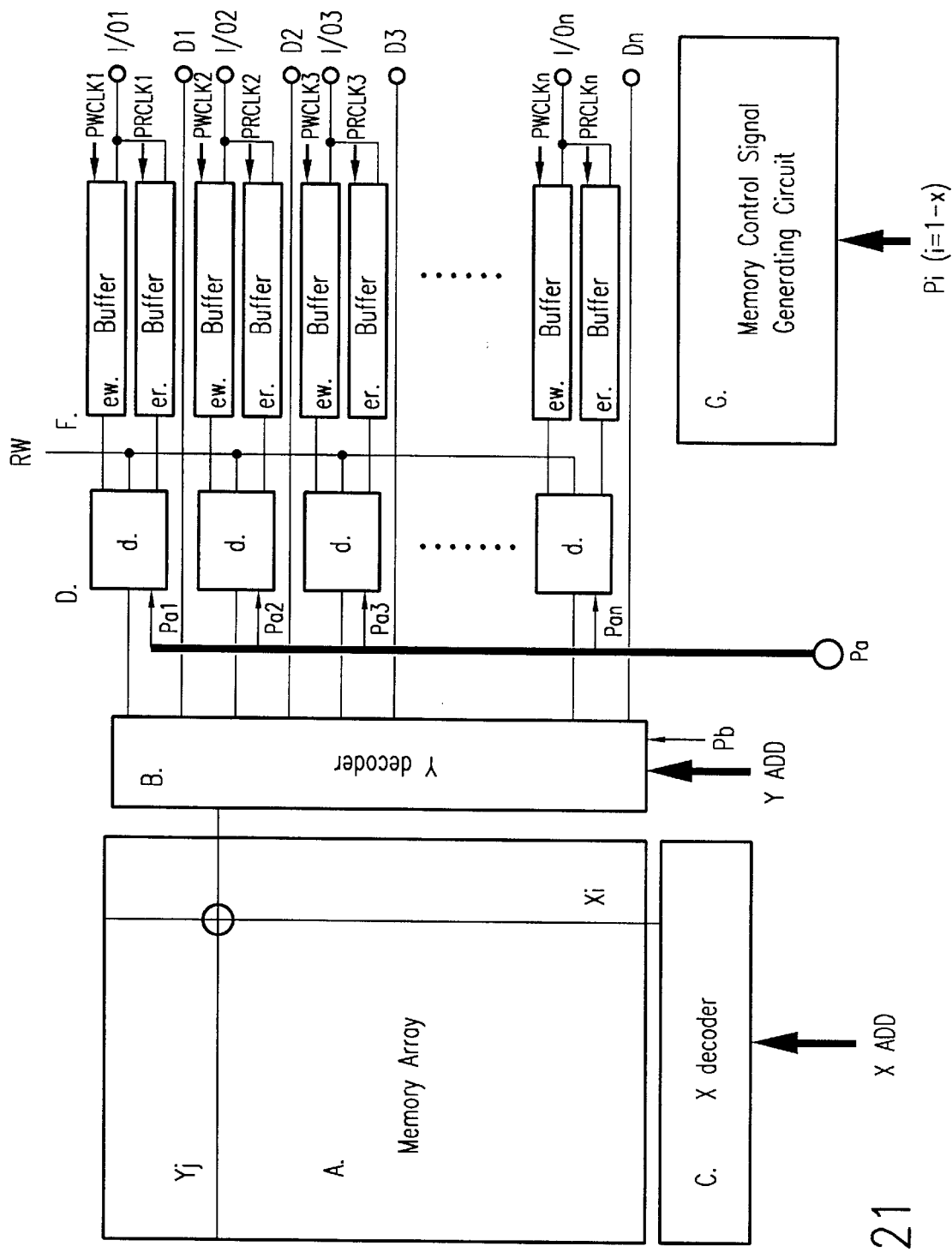
FIG. 21 is a block diagram illustrating a seventeenth embodiment of the present invention.

FIG. 21 is a block diagram illustrating a seventeenth embodiment of the present invention.

In the seventeenth embodiment, input/output terminals I/O1 to I/On share the use of the output terminals DO1 to DOn and input terminals DI1 to DIn employed in the tenth embodiment.

Figure 22:
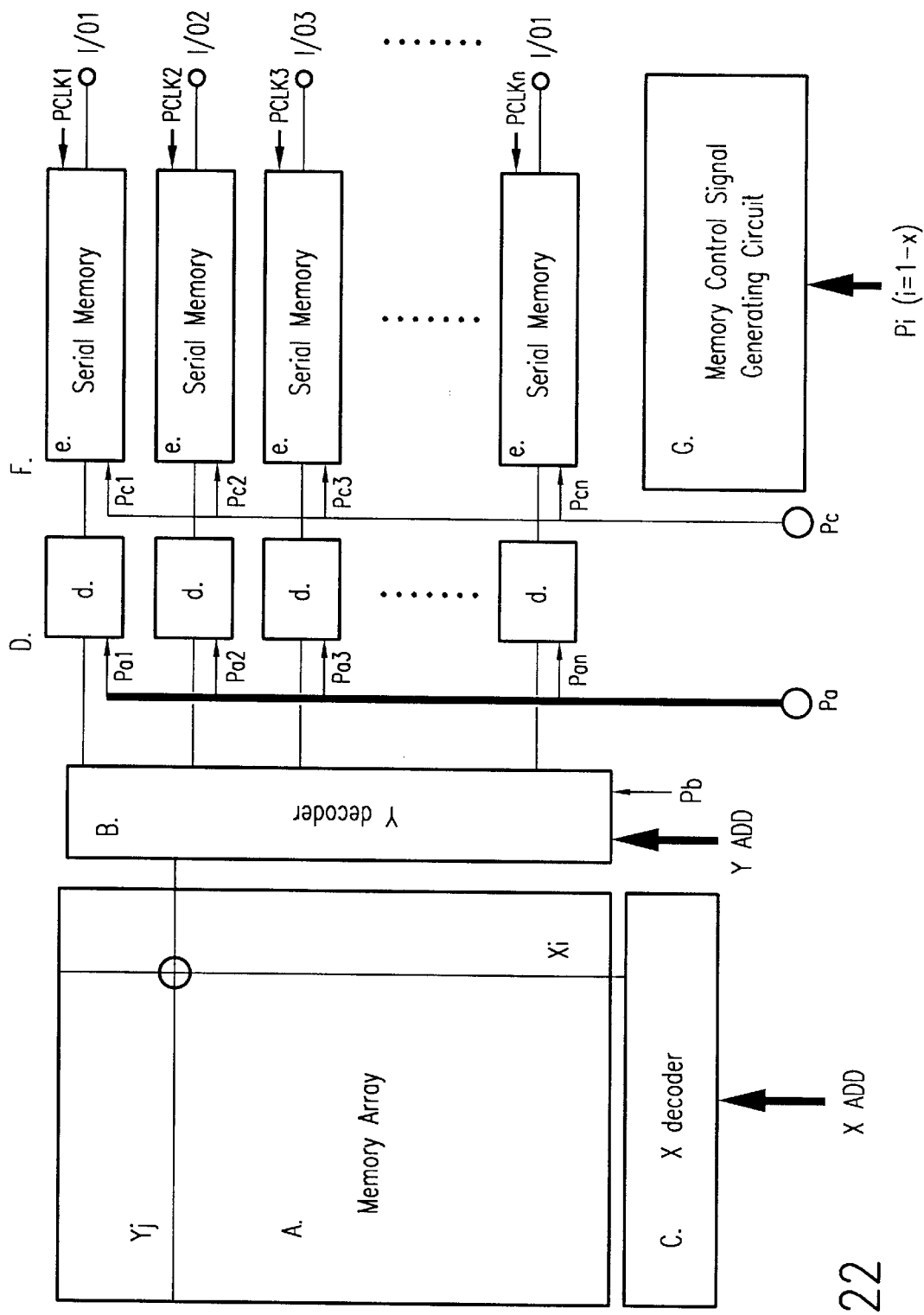
FIG. 22 is a block diagram showing an eighteenth embodiment of the present invention.

FIG. 22 is a block diagram showing an eighteenth embodiment of the present invention.

In the eighteenth embodiment, the buffers e employed in the third embodiment are replaced by serial memories e. The serial memories e receive address signals Pc1 to Pcn respectively through a first address terminal Pc.

Figure 23:
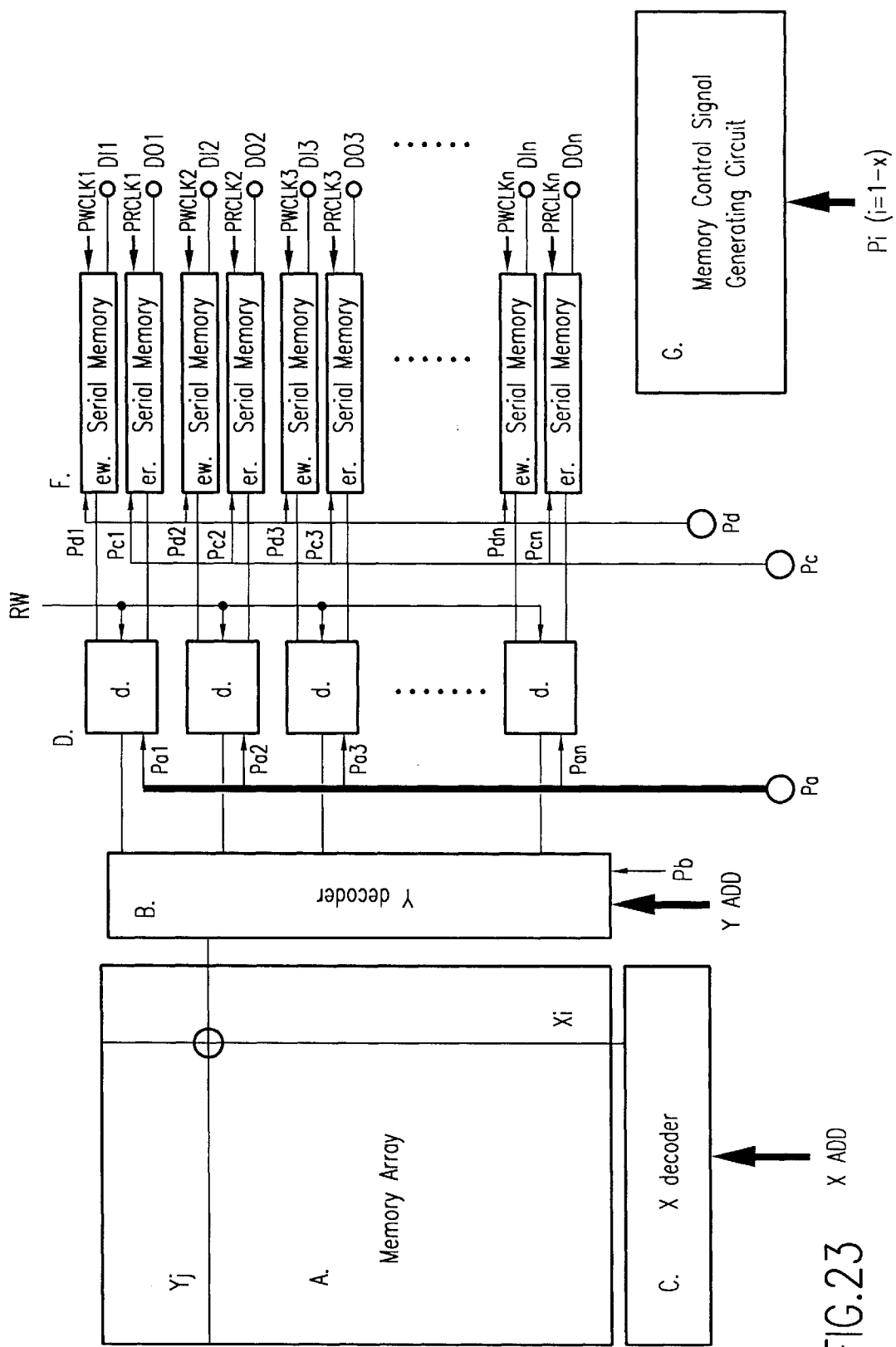
FIG. 23 is a block diagram showing a nineteenth embodiment of the present invention.

FIG. 23 is a block diagram showing a nineteenth embodiment of the present invention.

In the nineteenth embodiment, the input-output independent buffers ew and er employed in the fourth embodiment are replaced by input-output independent serial memories ew and er. The input independent serial memories ew receive address signals Pc1 to Pcn respectively through a first address terminal Pc. The output independent serial memories er receive address signals Pd1 to Pdn respectively through a second address terminal Pd.

As described in the fourth embodiment, a read/write control signal RW is inputted to opening/closing switches. Further, input terminals DI1 to DIn and output terminals DO1 to DO1n are respectively electrically connected to the input-output independent serial memories ew and er.

Figure 24:
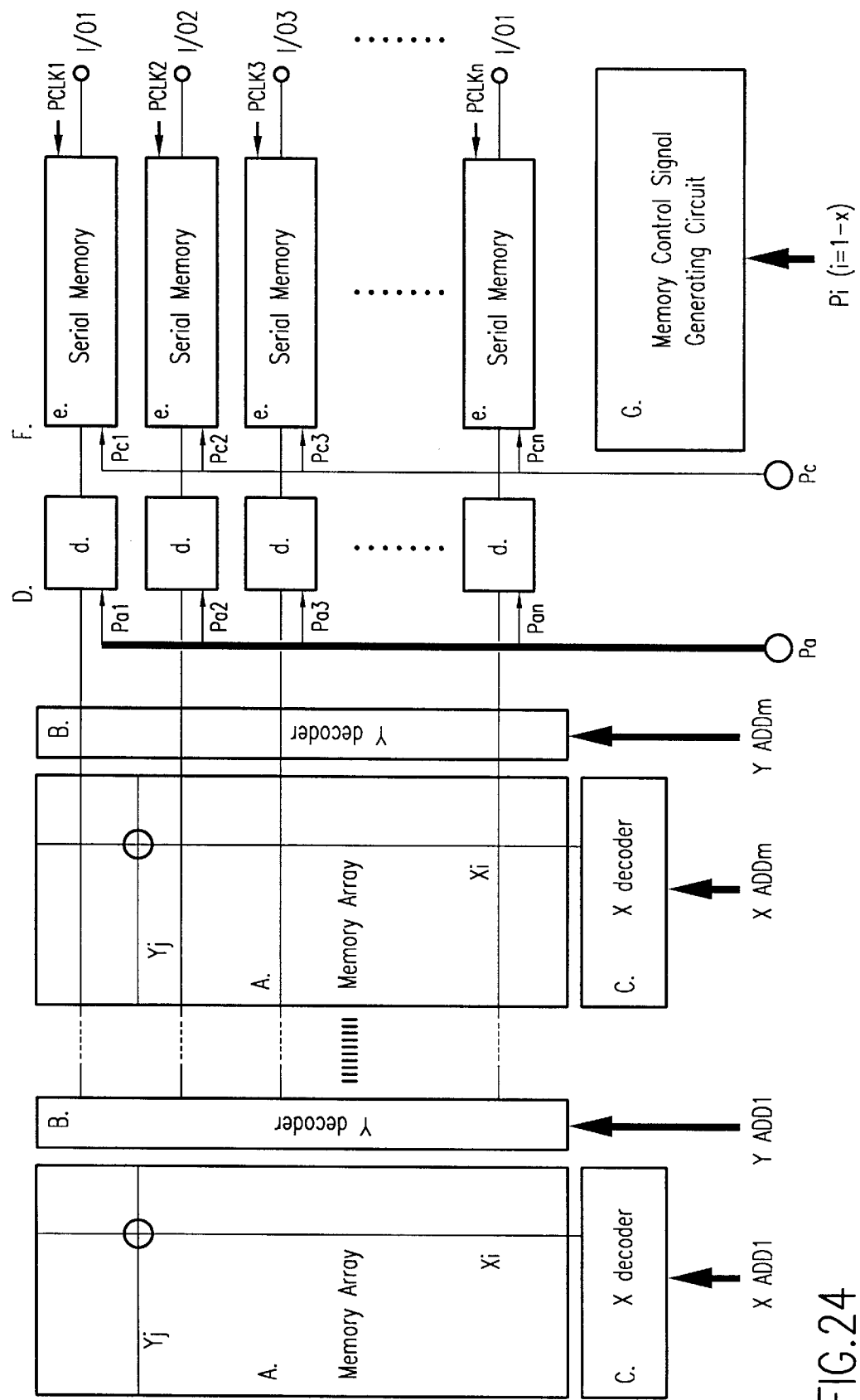
FIG. 24 is a block diagram showing a twentieth embodiment of the present invention.

FIG. 24 is a block diagram showing a twentieth embodiment of the present invention.

In the twentieth embodiment, the buffers e employed in the fifth embodiment are replaced by serial memories e. The serial memories e receive address signals Pc1 to Pcn respectively through a first address terminal Pc.

Figure 25:
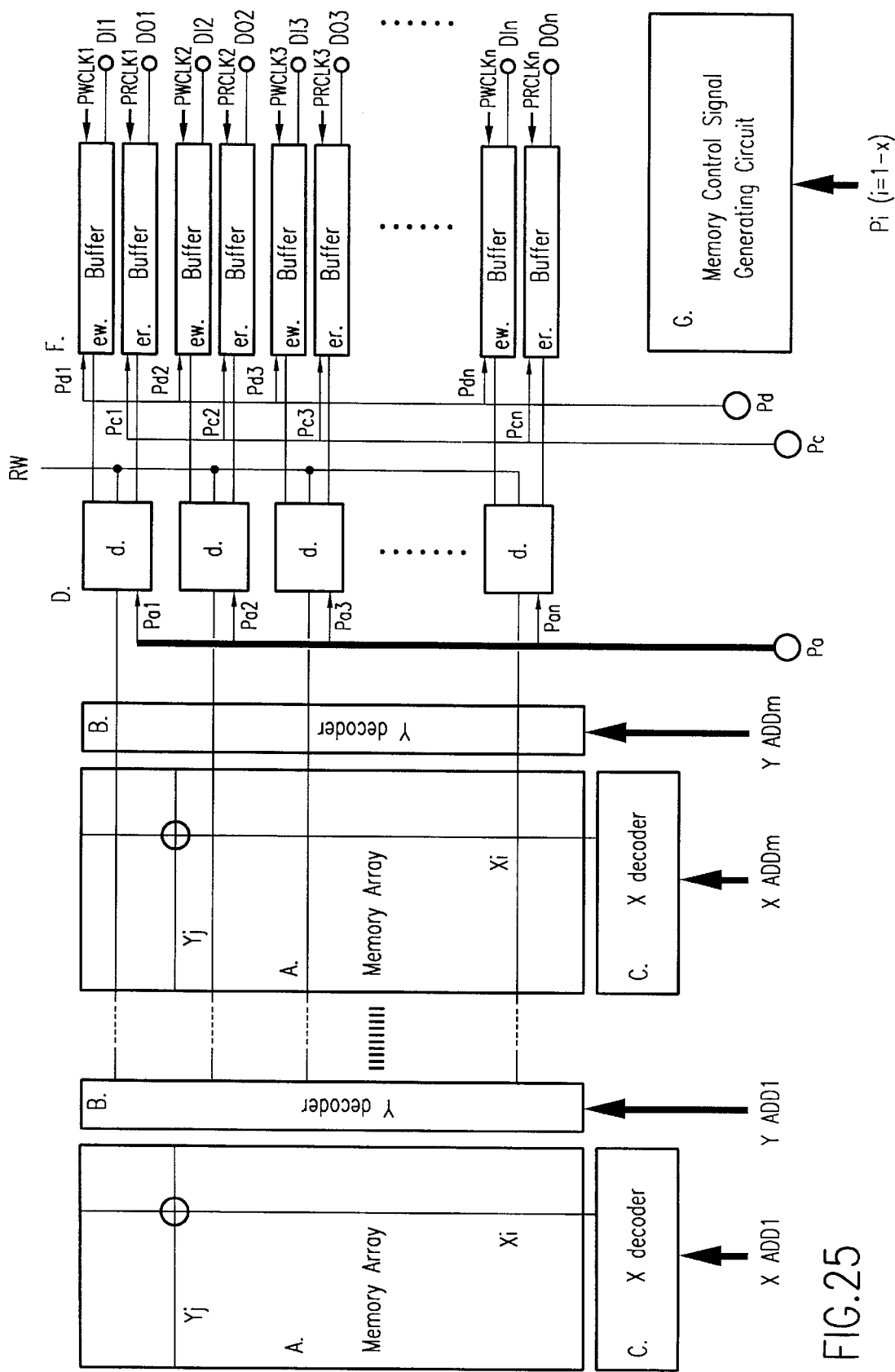
FIG. 25 is a block diagram showing a twenty-first embodiment of the present invention.

FIG. 25 is a block diagram showing a twenty-first embodiment of the present invention.

In the twenty-first embodiment, the input-output independent buffers ew and er employed in the sixth embodiment are replaced by input-output independent serial memories ew and er. The input independent serial memories ew receive address signals Pc1 to Pcn respectively through a first address terminal Pc. The output independent serial memories er receive address signals Pd1 to Pdn respectively through a second address terminal Pd.

As described in the sixth embodiment, a read/write control signal RW is inputted to opening/closing switches. Further, input terminals DI1 to DIn and output terminals DO1 to DO1n are respectively electrically connected to the input-output independent serial memories ew and er.

Figure 26:
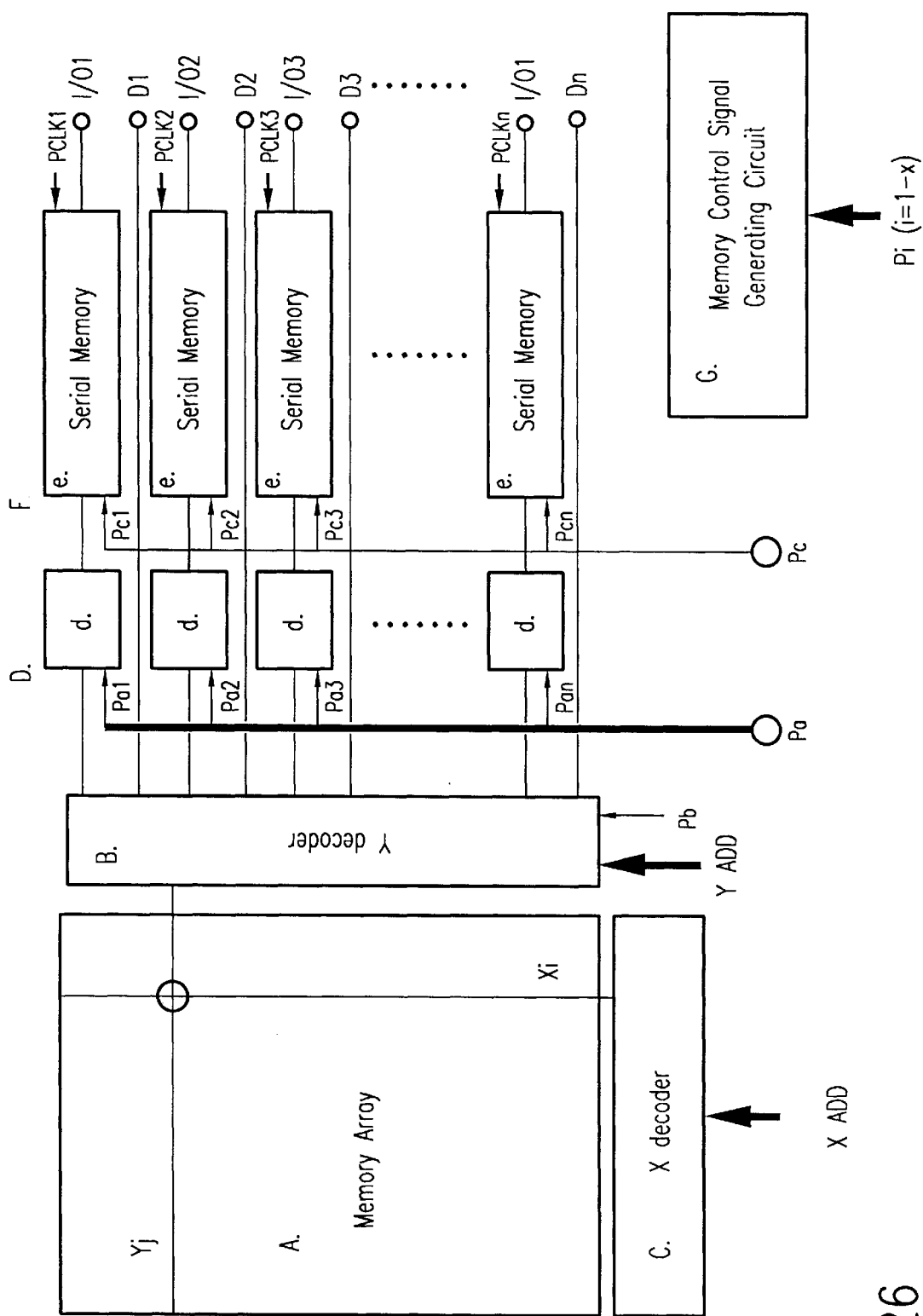
FIG. 26 is a block diagram showing a twenty-second embodiment of the present invention.

FIG. 26 is a block diagram showing a twenty-second embodiment of the present invention.

In the twenty-second embodiment, the buffers e employed in the seventh embodiment are replaced by serial memories e. The serial memories e receive address signals Pc1 to Pcn respectively through a first address terminal Pc.

Figure 27:
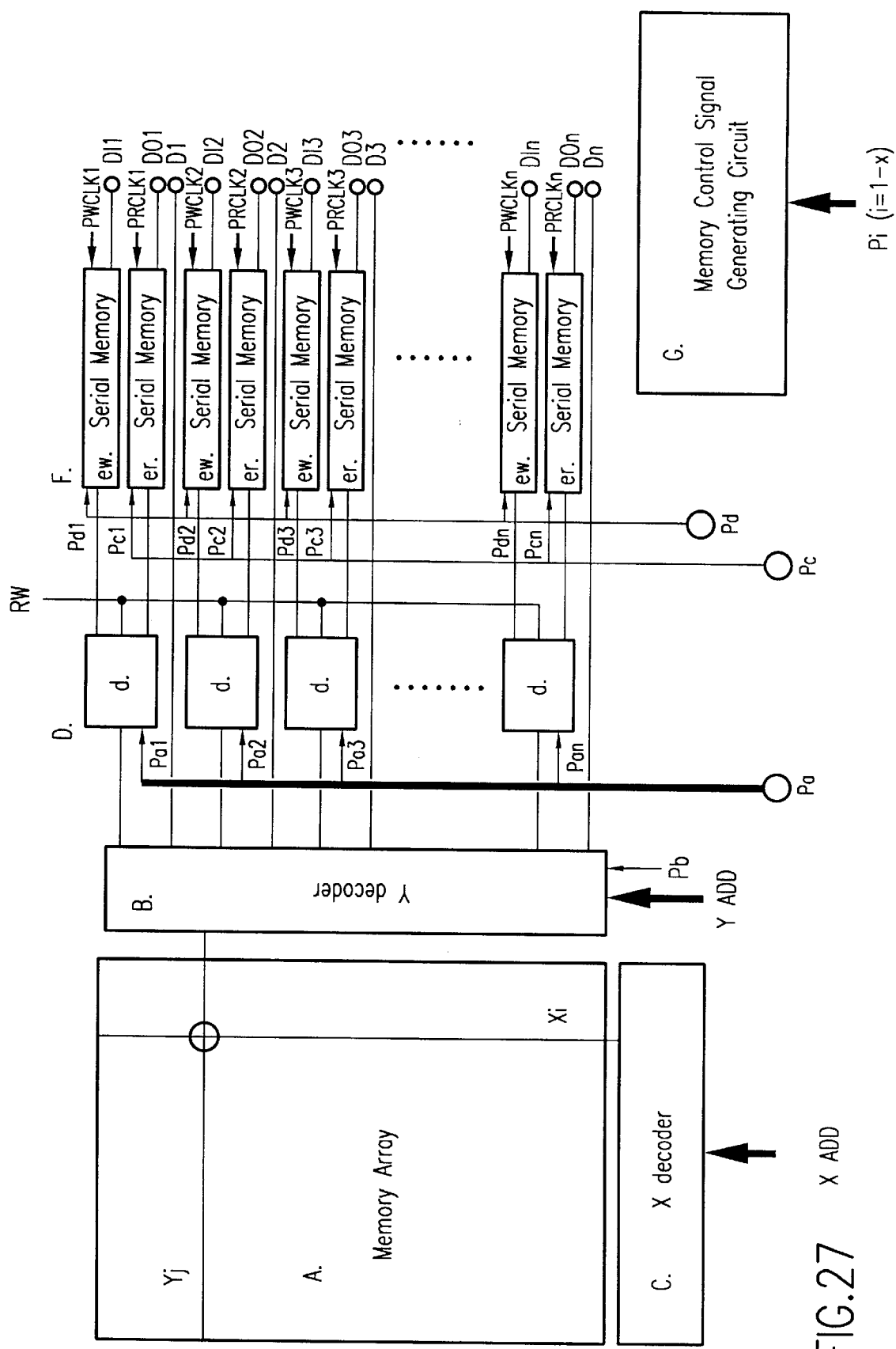
FIG. 27 is a block diagram showing a twenty-third embodiment of the present invention.

FIG. 27 is a block diagram showing a twenty-third embodiment of the present invention.

In the twenty-third embodiment, the input-output independent buffers ew and er employed in the eighth embodiment are replaced by input-output independent serial memories ew and er. The input independent serial memories ew receive address signals Pc1 to Pcn respectively through a first address terminal Pc. The output independent serial memories er receive address signals Pd1 to Pdn respectively through a second address terminal Pd.

As described in the eighth embodiment, a read/write control signal RW is inputted to opening/closing switches. Further, input terminals DI1 to DIn and output terminals DO1 to DO1n are respectively electrically connected to the input-output independent serial memories ew and er.

In the twenty-fifth embodiment, output terminals D1 to Dn are electrically connected to a Y decoder B so as to allow direct access to a DRAM without having to use the output independent serial memories er in the twenty-first embodiment.

Figure 28:
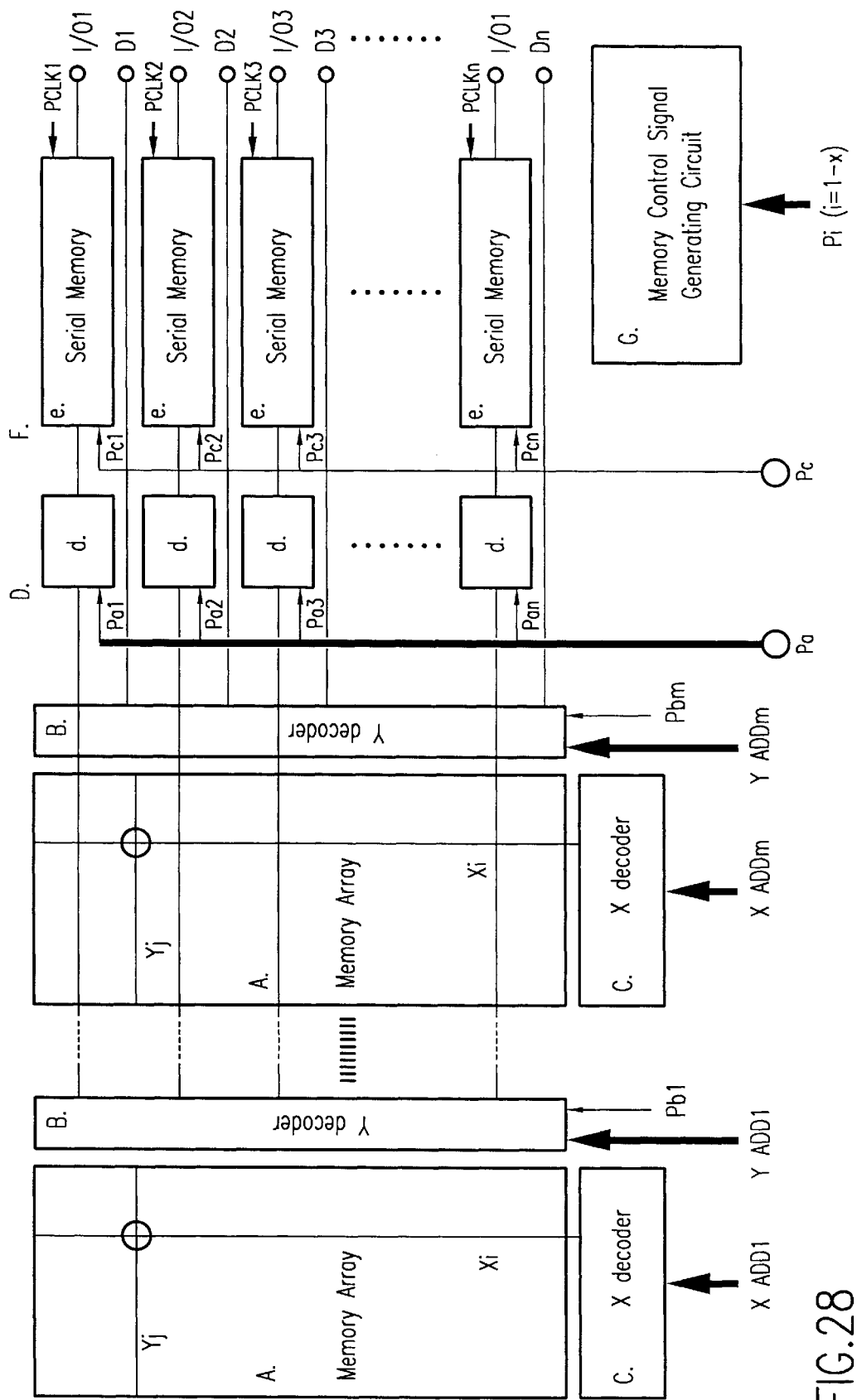
FIG. 28 is a block diagram showing a twenty-fourth embodiment of the present invention.

FIG. 28 is a block diagram showing a twenty-fourth embodiment of the present invention.

In the twenty-fourth embodiment, the buffers e employed in the ninth embodiment are replaced by serial memories e. The serial memories e receive address signals Pc1 to Pcn respectively through a first address terminal Pc.

Figure 29:
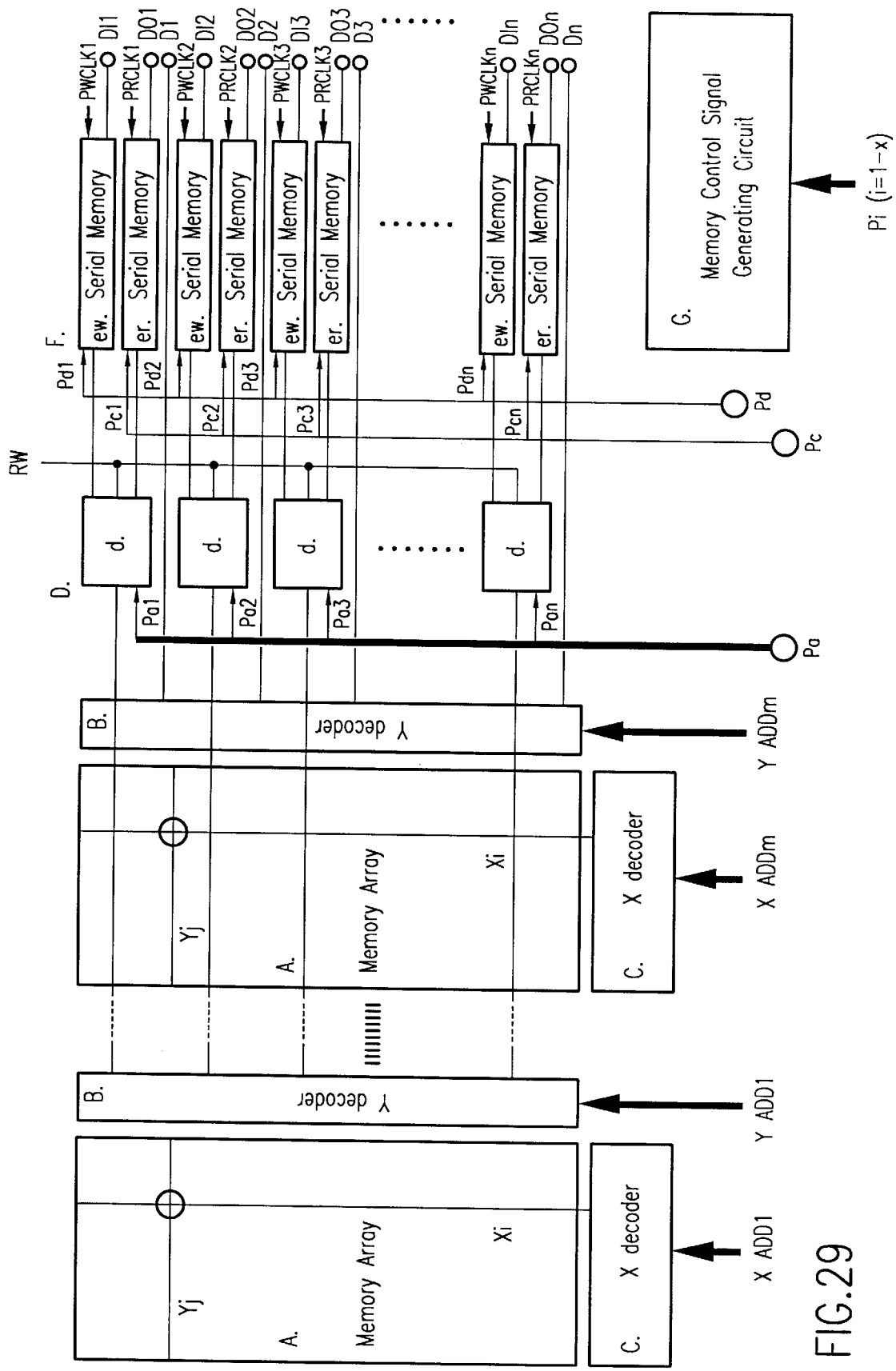
FIG. 29 is a block diagram showing a twenty-fifth embodiment of the present invention.

FIG. 29 is a block diagram showing a twenty-fifth embodiment of the present invention.

In the twenty-fifth embodiment, the input-output independent buffers ew and er employed in the tenth embodiment are replaced by input-output independent serial memories ew and er. The input independent serial memories ew receive address signals Pc1 to Pcn respectively through a first address terminal Pc. The output independent serial memories er receive address signals Pd1 to Pdn respectively through a second address terminal Pd.

As described in the tenth embodiment, a read/write control signal RW is inputted to opening/closing switches. Further, input terminals DI1 to DIn and output terminals DO1 to DO1n are respectively electrically connected to the input-output independent serial memories ew and er.

In the twenty-fifth embodiment, output terminals D1 to Dn are electrically connected to a Y decoder B so as to allow direct access to a DRAM without having to use the output independent serial memories er in the twenty-first embodiment.

Figure 30:
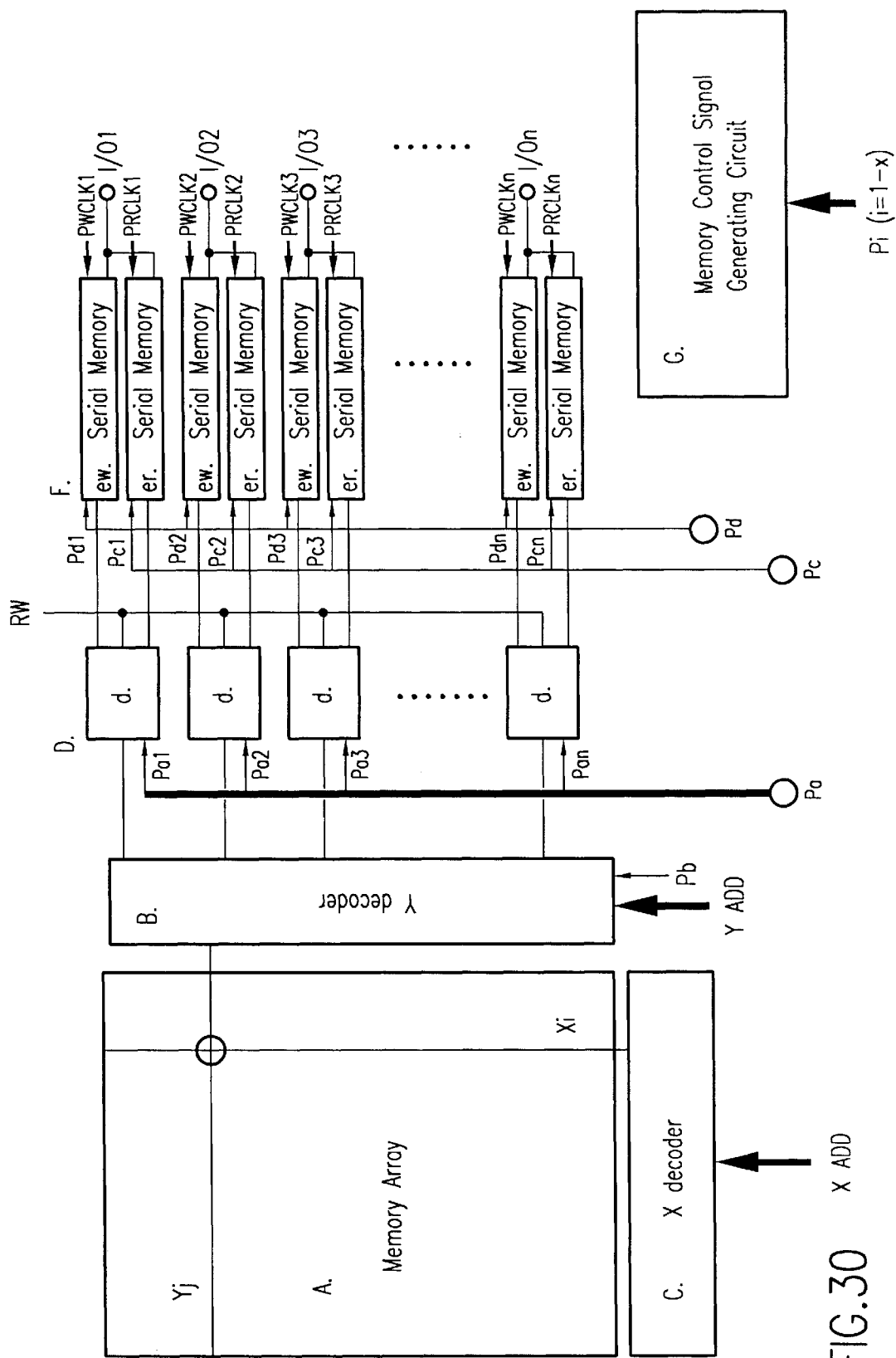
FIG. 30 is a block diagram showing a twenty-sixth embodiment of the present invention.

FIG. 30 is a block diagram showing a twenty-sixth embodiment of the present invention.

In the twenty-sixth embodiment, the input-output independent buffers ew and er employed in the fifteenth embodiment are replaced by input-output independent serial memories ew and er. The input independent serial memories ew receive address signals Pc1 to Pcn respectively through a first address terminal Pc. The output independent serial memories er receive address signals Pd1 to Pdn respectively through a second address terminal Pd.

As described in the fifteenth embodiment, a read/write control signal RW is inputted to opening/closing switches. Further, input/output terminals I/O1 to I/On share the use of the output terminals DO1 to DOn and input terminals DI1 to DIn employed in the twenty-first embodiment.

Figure 31:
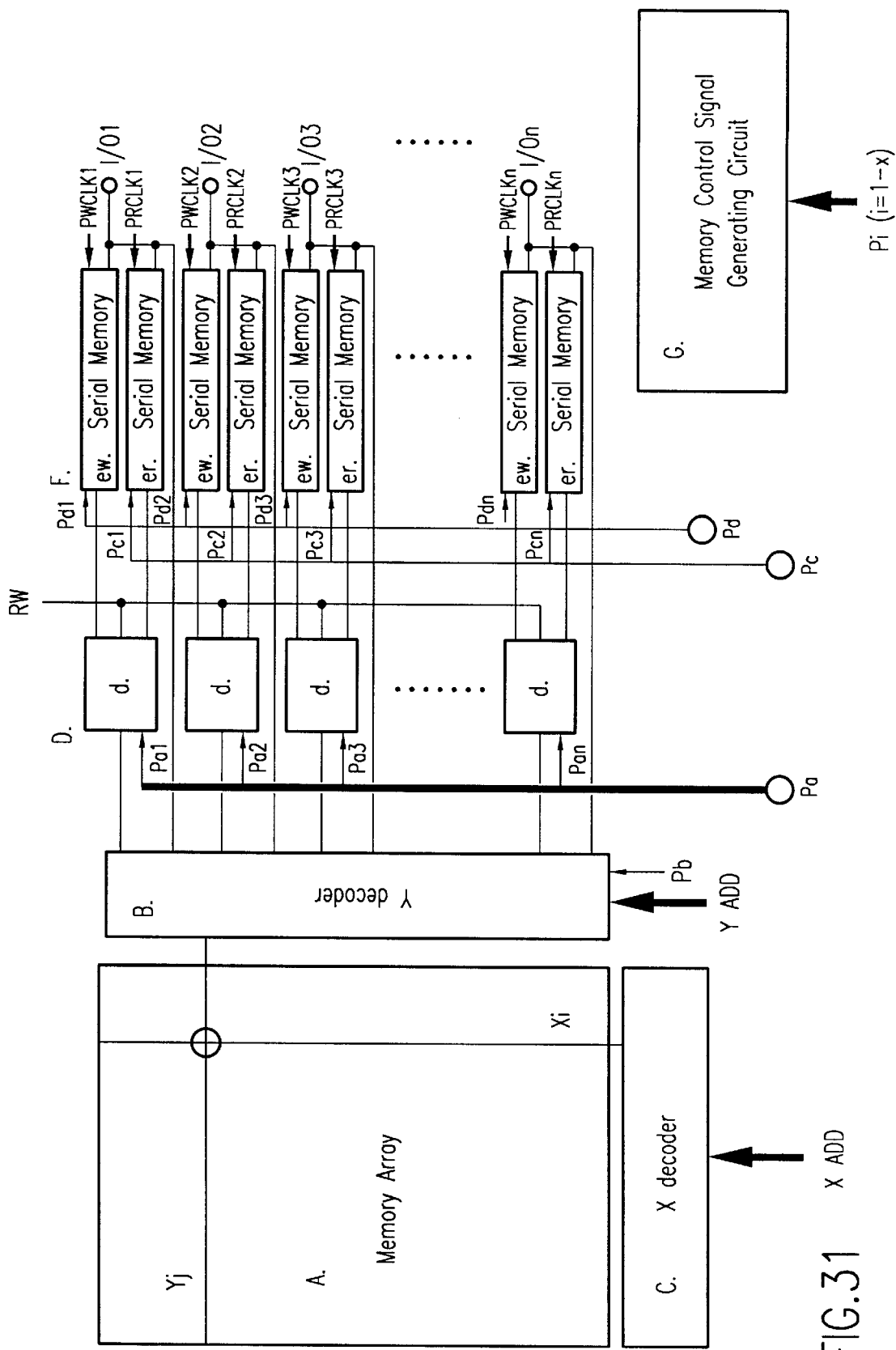
FIG. 31 is a block diagram showing a twenty-seventh embodiment of the present invention.

FIG. 31 is a block diagram showing a twenty-seventh embodiment of the present invention.

In the twenty-seventh embodiment, the input-output independent buffers ew and er employed in the sixteenth embodiment are replaced by input-output independent serial memories ew and er. The input independent serial memories ew receive address signals Pc1 to Pcn respectively through a first address terminal Pc. The output independent serial memories er receive address signals Pd1 to Pdn respectively through a second address terminal Pd.

As described in the sixteenth embodiment, a read/write control signal RW is inputted to opening/closing switches. Further, input/output terminals I/O1 to I/On share the use of the output terminals DO1 to DOn and output terminals D1 to Dn employed in the twenty-third embodiment.

Figure 32:
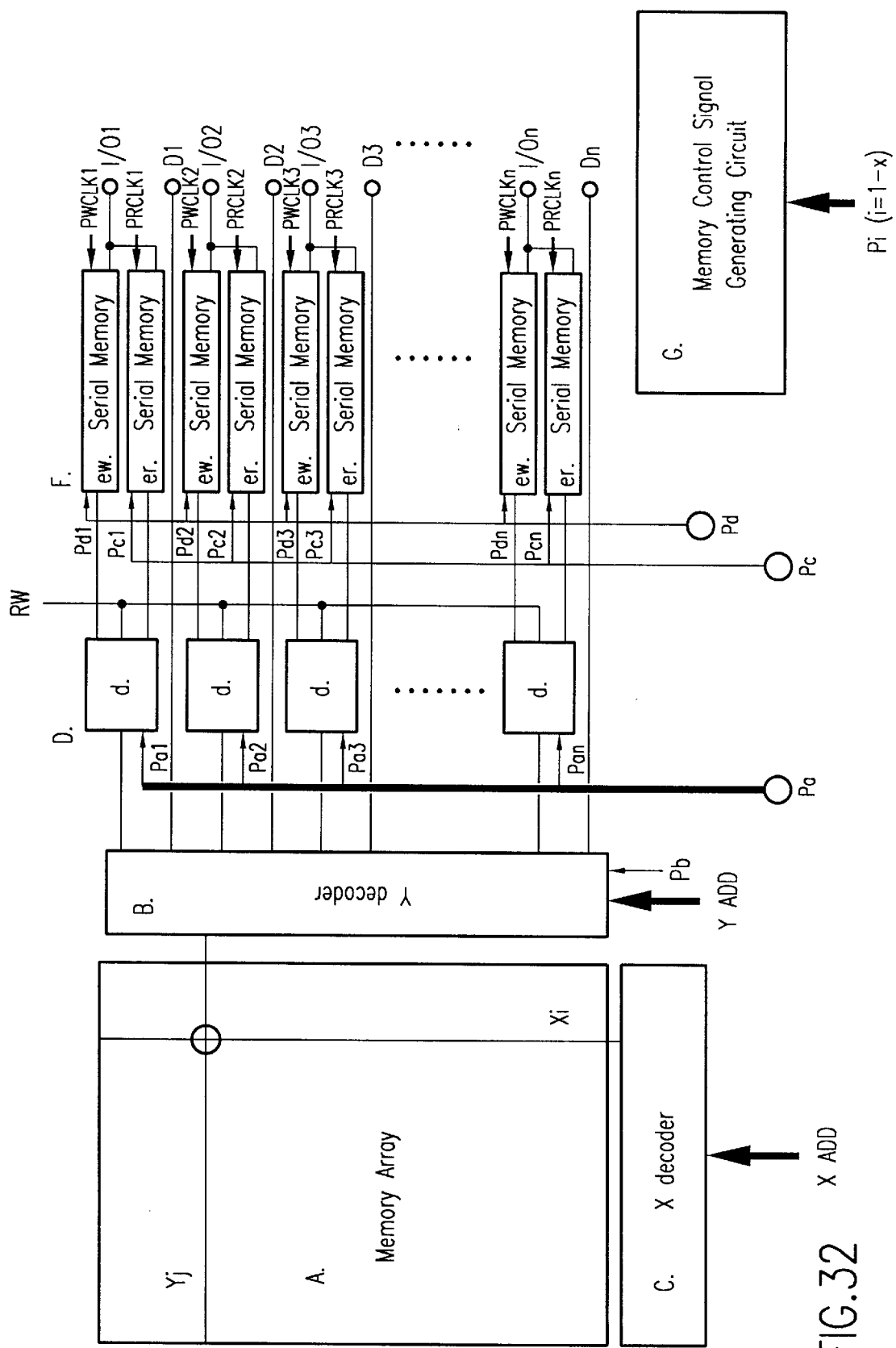
FIG. 32 is a block diagram showing a twenty-eighth embodiment of the present invention.

FIG. 32 is a block diagram showing a twenty-eighth embodiment of the present invention.

In the twenty-eighth embodiment, the input-output independent buffers ew and er employed in the sixteenth embodiment are replaced by input-output independent serial memories ew and er. The input independent serial memories ew receive address signals Pc1 to Pcn respectively through a first address terminal Pc. The output independent serial memories er receive address signals Pd1 to Pdn respectively through a second address terminal Pd.

In the twenty-eighth embodiment, input/output terminals I/O1 to I/On share the use of the output terminals DO1 to DOn and input terminals DI1 to DIn employed in the twenty-fifth embodiment.

Figure 33:
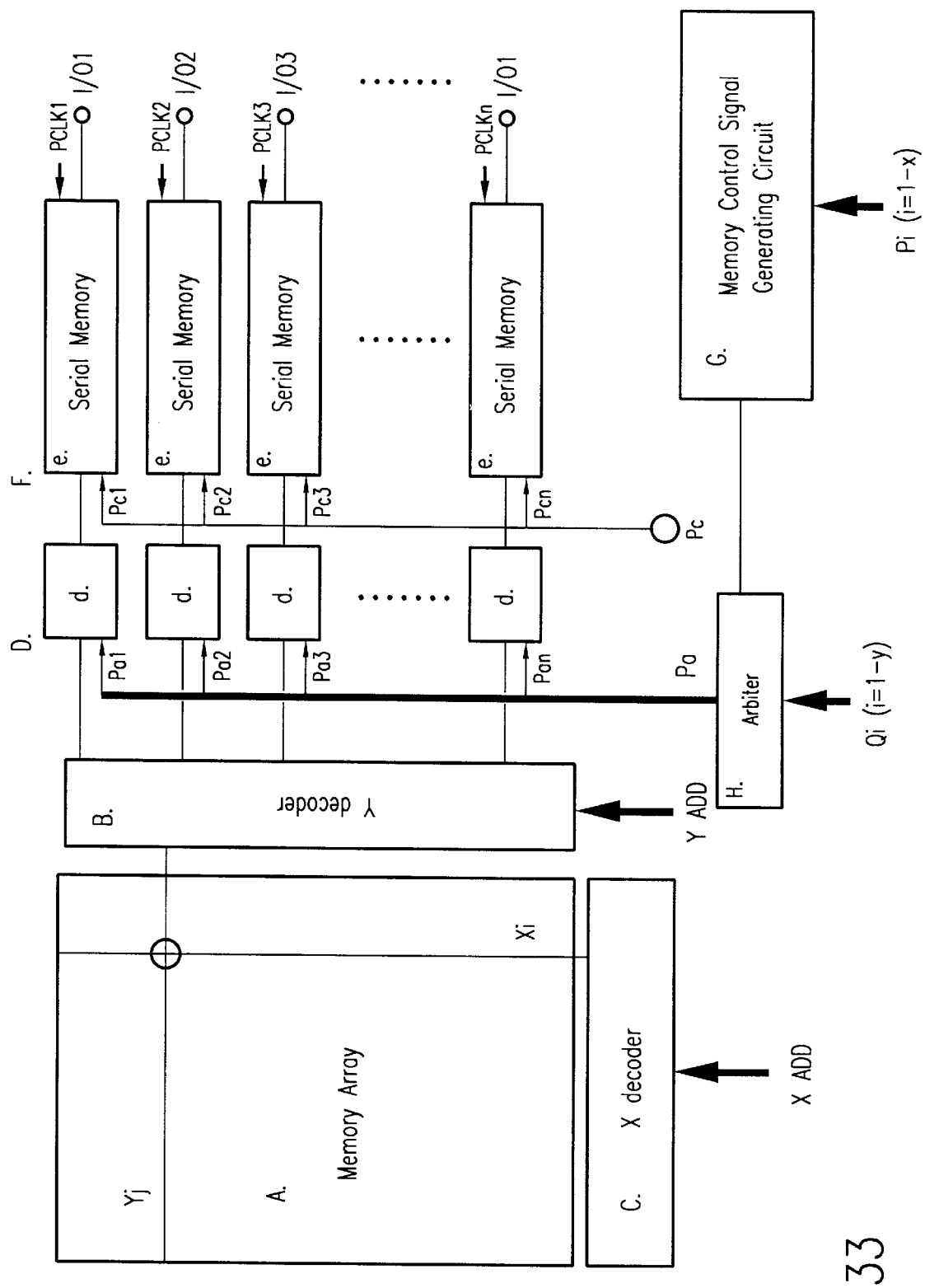
FIG. 33 is a block diagram illustrating twenty-ninth embodiment of the present invention.

FIG. 33 is a block diagram illustrating twenty-ninth embodiment of the present invention.

The twenty-ninth embodiment is configured by adding arbiter H to the eighteenth embodiment. The arbiter H is electrically connected to a memory control signal generating circuit G and receives request signals Qi (where i=1 to y) therein to thereby output opening/closing control signals Pa1 to Pan. Therefore, the opening/closing control signal terminal Pa described in the eighteenth embodiment is not present.

Upon writing information from ports when the arbiter is included, the write information are temporarily stored in their corresponding buffers and the sequence of the write information is determined, whereby the writing of the information into the memories can be automatically done.

Figure 34:
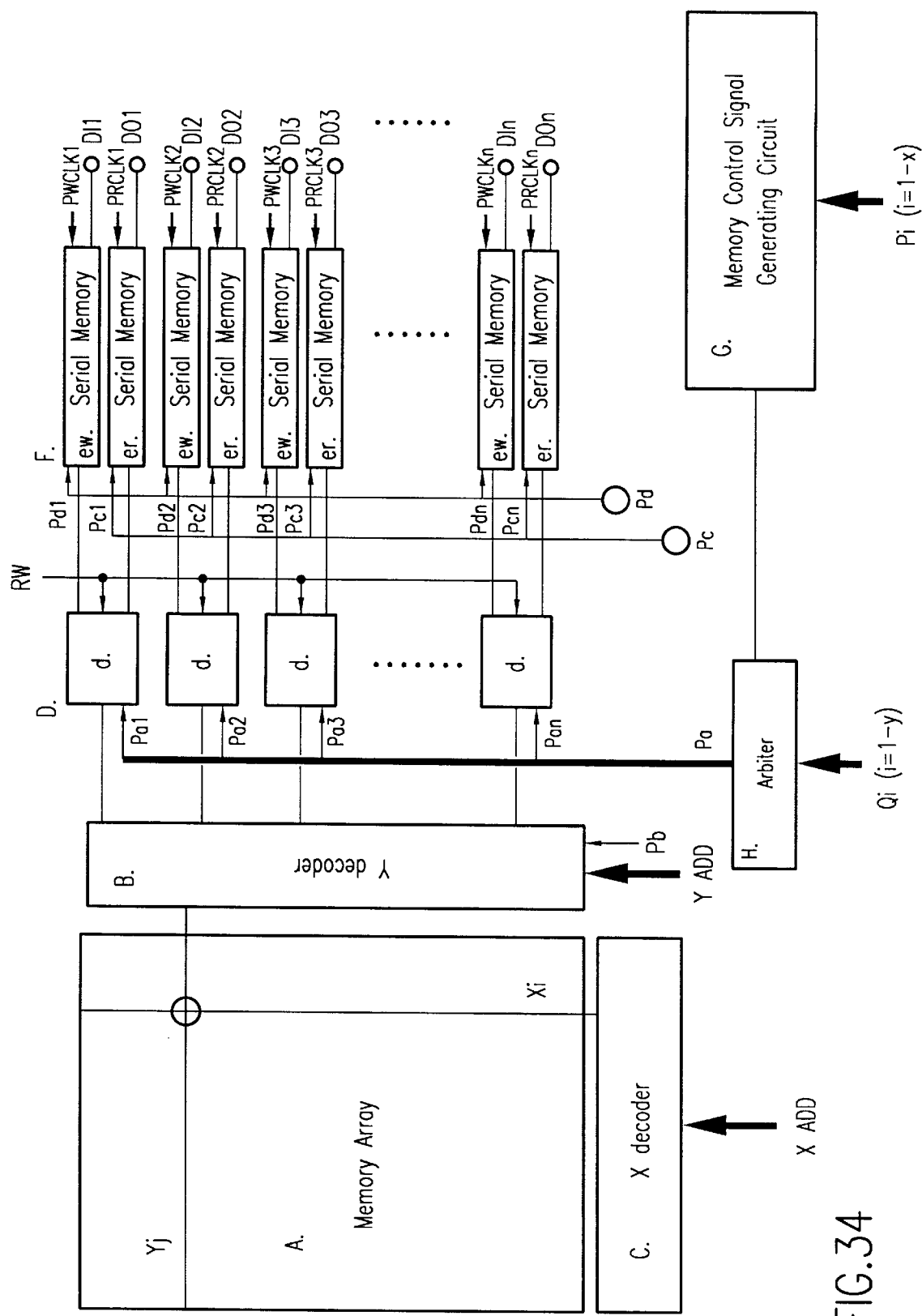
FIG. 34 is a block diagram illustrating thirtieth embodiment of the present invention.

FIG. 34 is a block diagram illustrating thirtieth embodiment of the present invention.

The thirtieth embodiment is configured by adding arbiter H to the nineteenth embodiment. The arbiter H is electrically connected to a memory control signal generating circuit G and receives request signals Qi (where i=1 to y) therein to thereby output opening/closing control signals Pa1 to Pan. Therefore, the opening/closing control signal terminal Pa described in the nineteenth embodiment is not present.

The thirtieth embodiment has the same advantages of the twenty-ninth and nineteenth embodiments.

Figure 35:
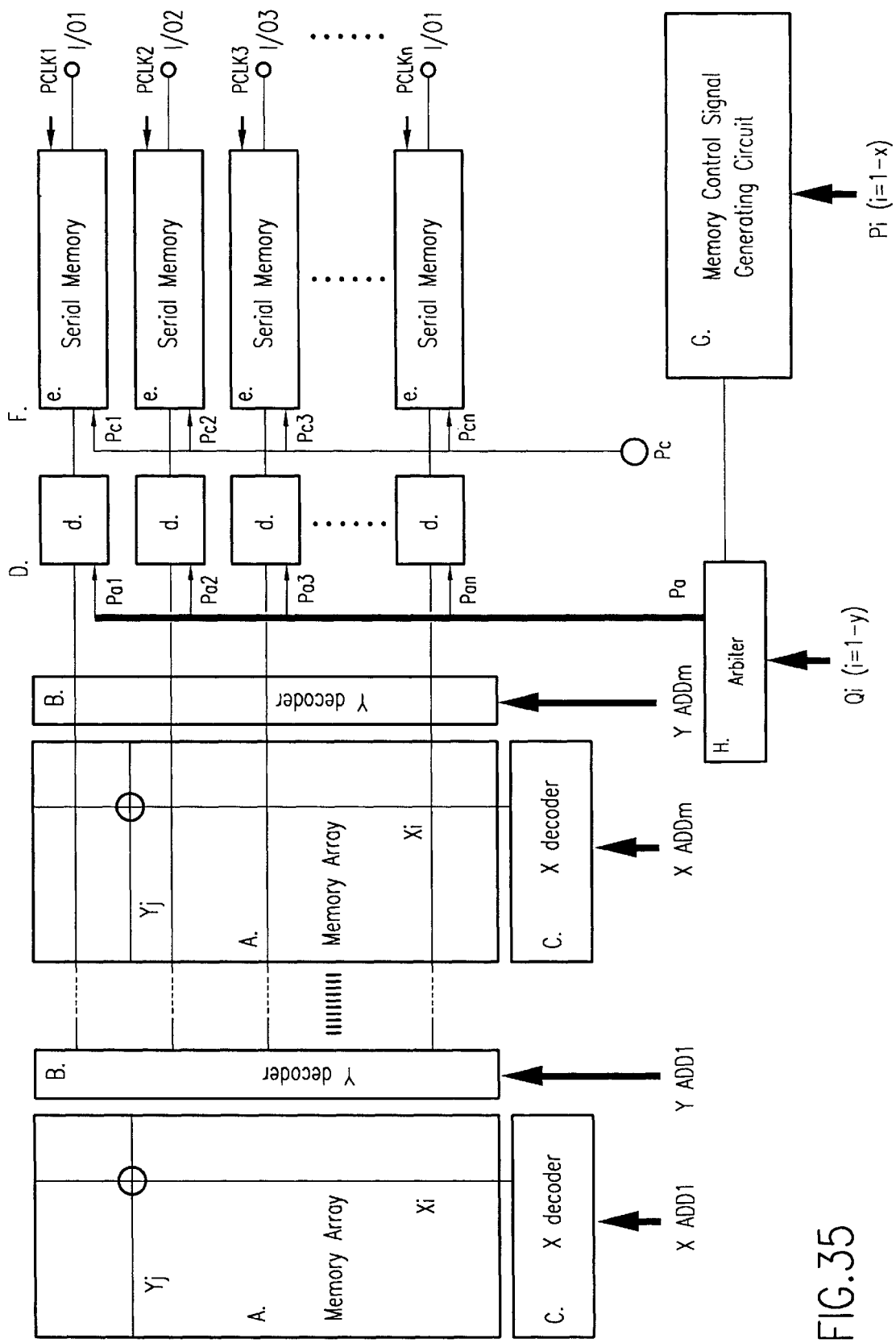
FIG. 35 is a block diagram illustrating thirty-first embodiment of the present invention.

FIG. 35 is a block diagram illustrating thirty-first embodiment of the present invention.

The thirty-first embodiment is configured by adding arbiter H to the twentieth embodiment. The arbiter H is electrically connected to a memory control signal generating circuit G and receives request signals Qi (where 1=1 to y) therein to thereby output opening/closing control signals Pa1 to Pan. Therefore, the opening/closing control signal terminal Pa described in the nineteenth embodiment is not present.

The thirty-first embodiment has the same advantages of the twenty-ninth and twentieth embodiments.

Figure 36:
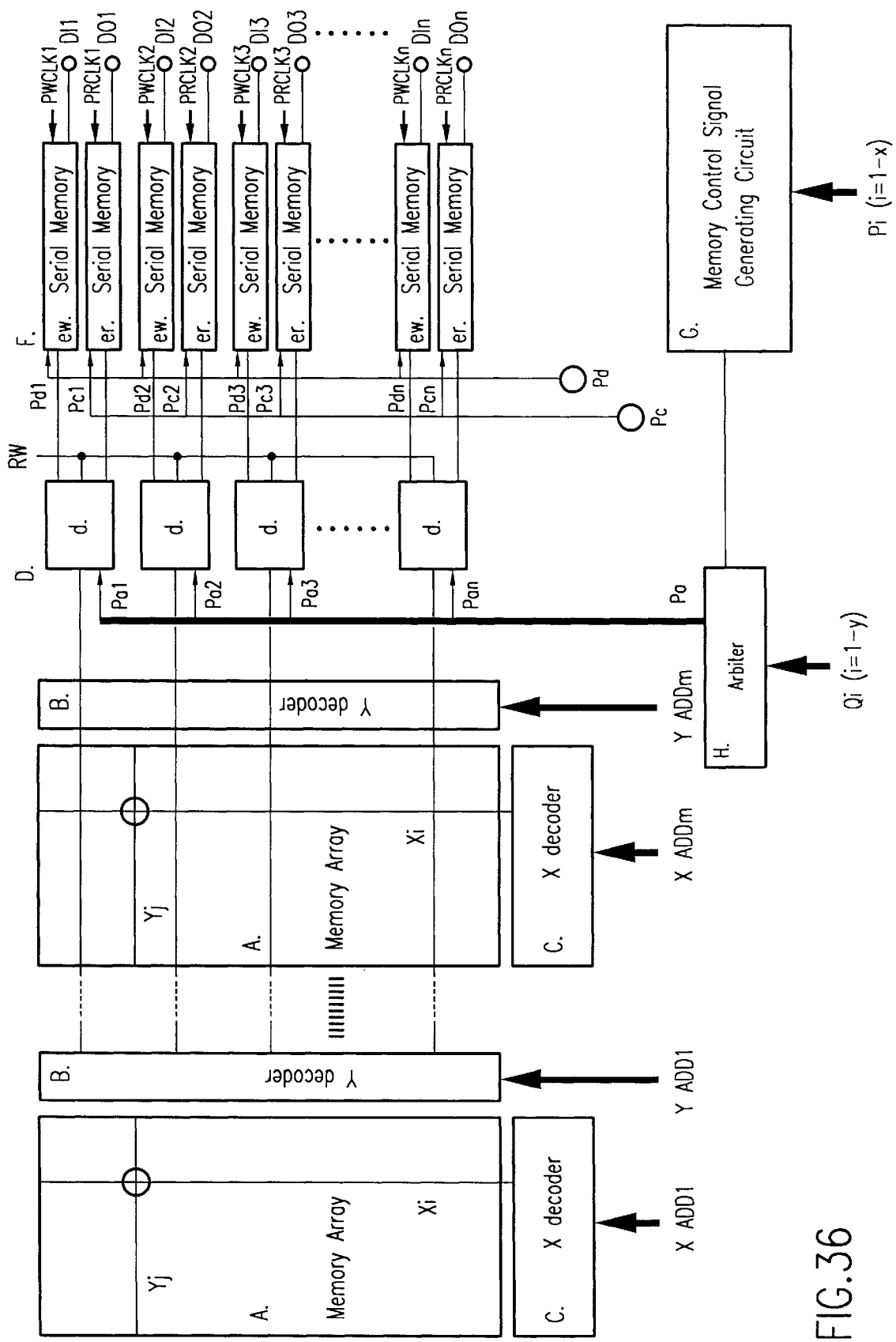
FIG. 36 is a block diagram illustrating thirty-second embodiment of the present invention.

FIG. 36 is a block diagram illustrating thirty-second embodiment of the present invention.

The thirty-second embodiment is configured by adding arbiter H to the twenty-first embodiment. The arbiter H is electrically connected to a memory control signal generating circuit G and receives request signals Qi (where i=1 to y) therein to thereby output opening/closing control signals Pa1 to Pan. Therefore, the opening/closing control signal terminal Pa described in the twenty-first embodiment is not present.

The thirty-second embodiment has the same advantages of the twenty-ninth and twenty-first embodiments.

Figure 37:
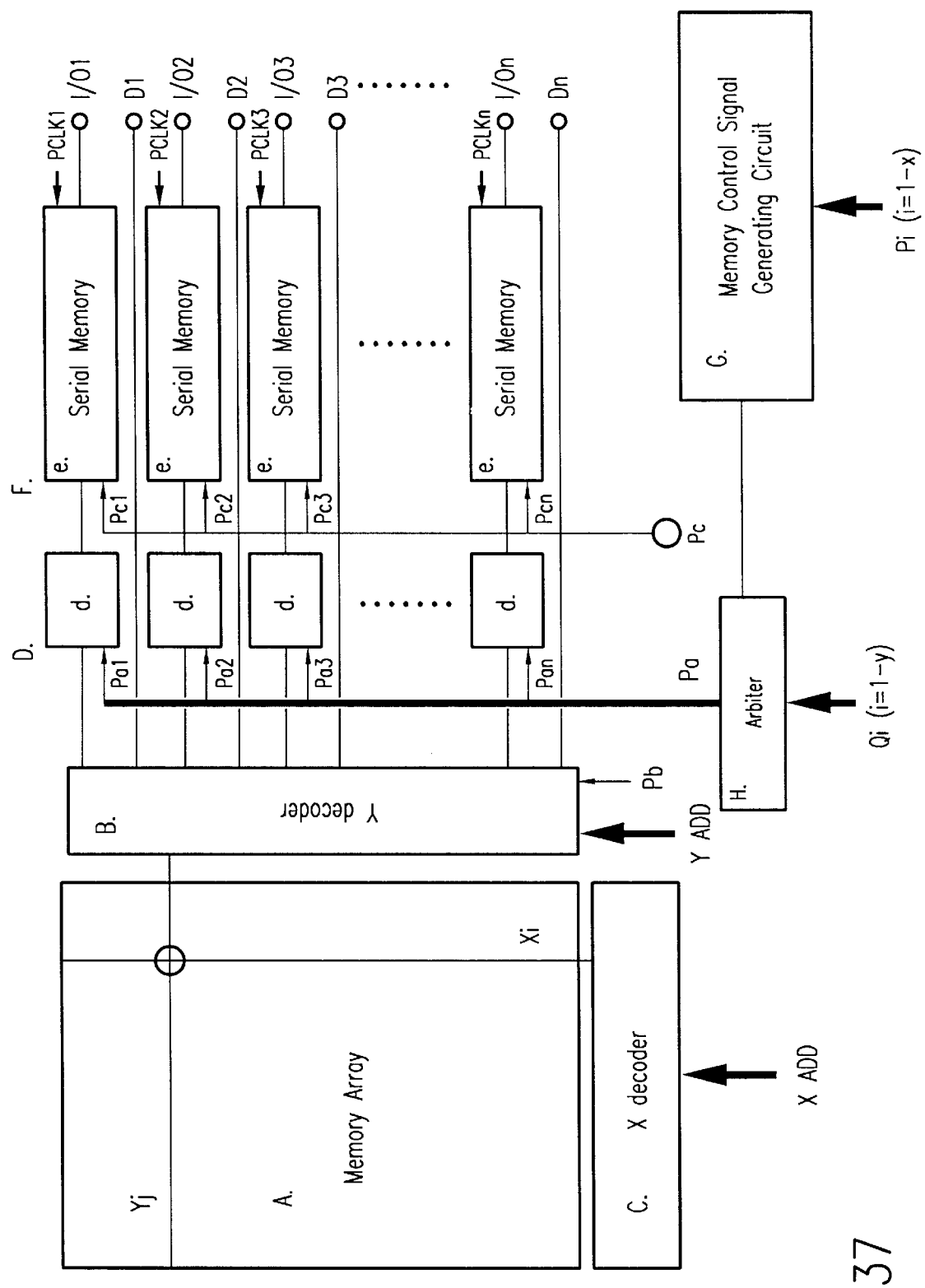
FIG. 37 is a block diagram illustrating thirty-third embodiment of the present invention.

FIG. 37 is a block diagram illustrating thirty-third embodiment of the present invention.

The thirty-third embodiment is configured by adding arbiter H to the twenty-second embodiment. The arbiter H is electrically connected to a memory control signal generating circuit G and receives request signals Qi (where i=1 to y) therein to thereby output opening/closing control signals Pa1 to Pan. Therefore, the opening/closing control signal terminal Pa described in the twenty-second embodiment is not present.

The thirty-third embodiment has the same advantages of the twenty-ninth and twenty-second embodiments.

Figure 38:
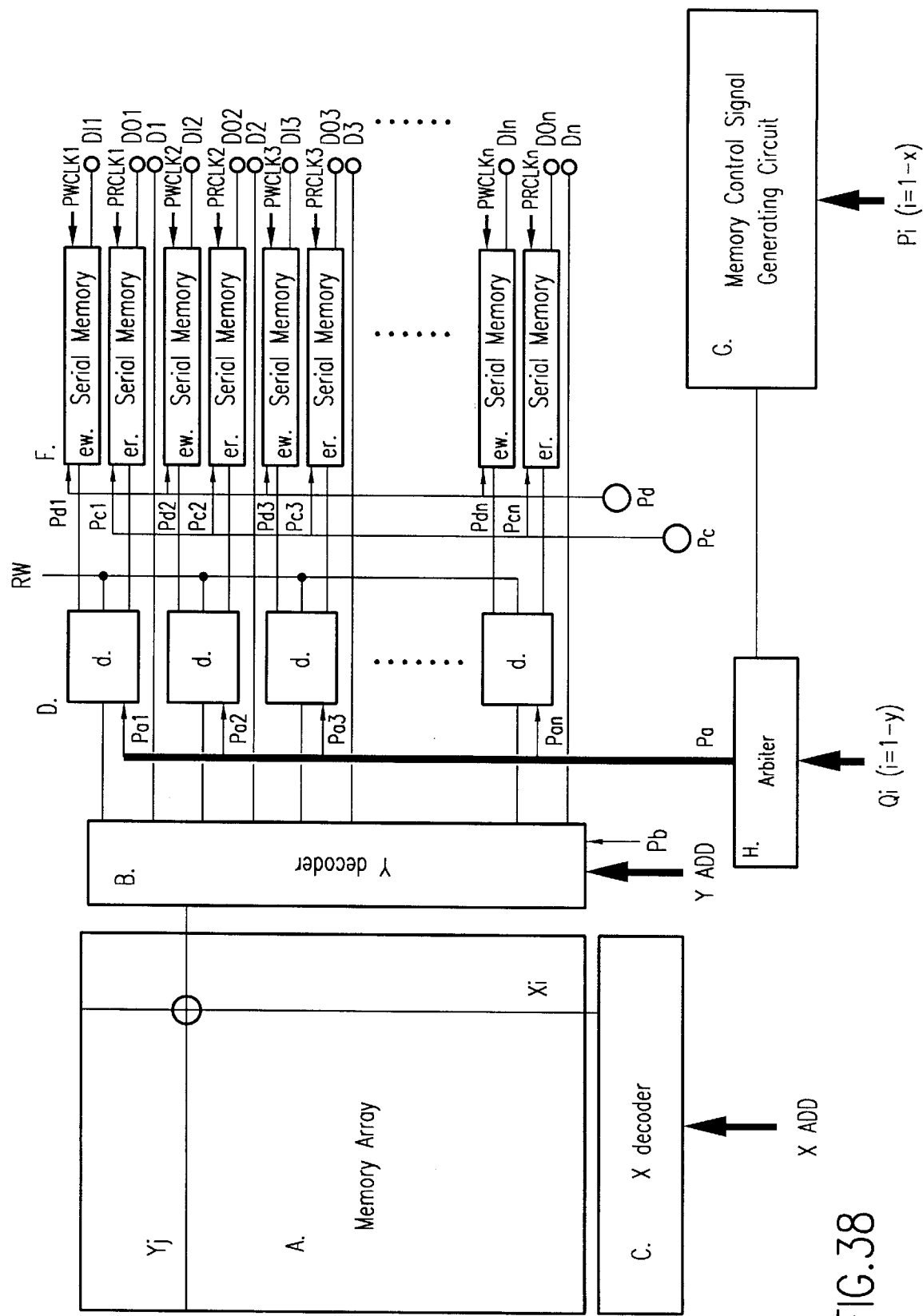
FIG. 38 is a block diagram illustrating thirty-fourth embodiment of the present invention.

FIG. 38 is a block diagram illustrating thirty-fourth embodiment of the present invention.

The thirty-fourth embodiment is configured by adding arbiter H to the twenty-first embodiment. The arbiter H is electrically connected to a memory control signal generating circuit G and receives request signals Qi (where i=1 to y) therein to thereby output opening/closing control signals Pa1 to Pan. Therefore, the opening/closing control signal terminal Pa described in the twenty-third embodiment is not present.

The thirty-fourth embodiment has the same advantages of the twenty-ninth and twenty-third embodiments.

Figure 39:
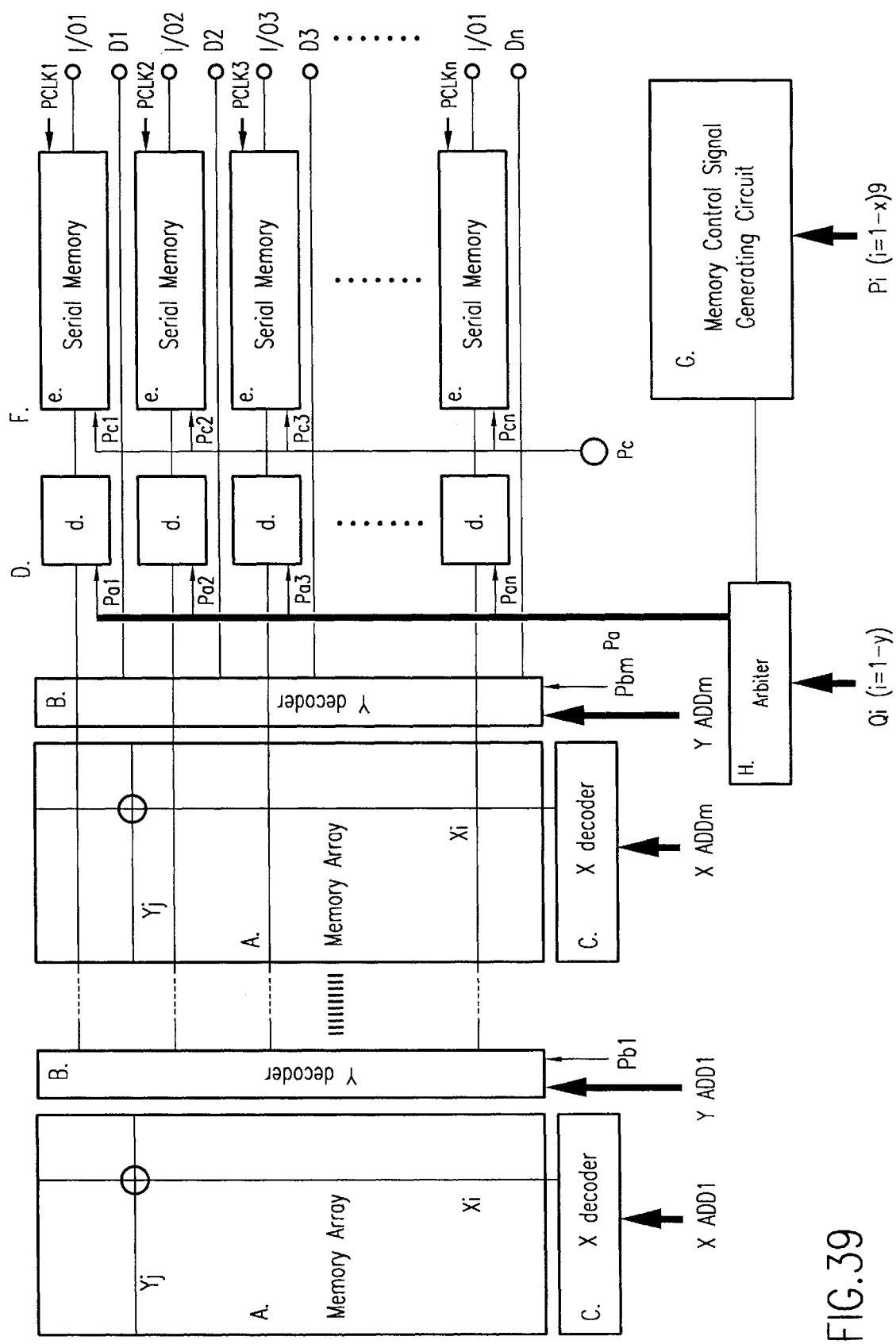
FIG. 39 is a block diagram illustrating thirty-fifth embodiment of the present invention.

FIG. 39 is a block diagram illustrating thirty-fifth embodiment of the present invention.

The thirty-fifth embodiment is configured by adding arbiter H to the twenty-fourth embodiment. The arbiter H is electrically connected to a memory control signal generating circuit G and receives request signals Qi (where i=1 to y) therein to thereby output opening/closing control signals Pa1 to Pan. Therefore, the opening/closing control signal terminal Pa described in the twenty-fourth embodiment is not present.

The thirty-fifth embodiment has the same advantages of the twenty-ninth and twenty-fourth embodiments.

Figure 40:
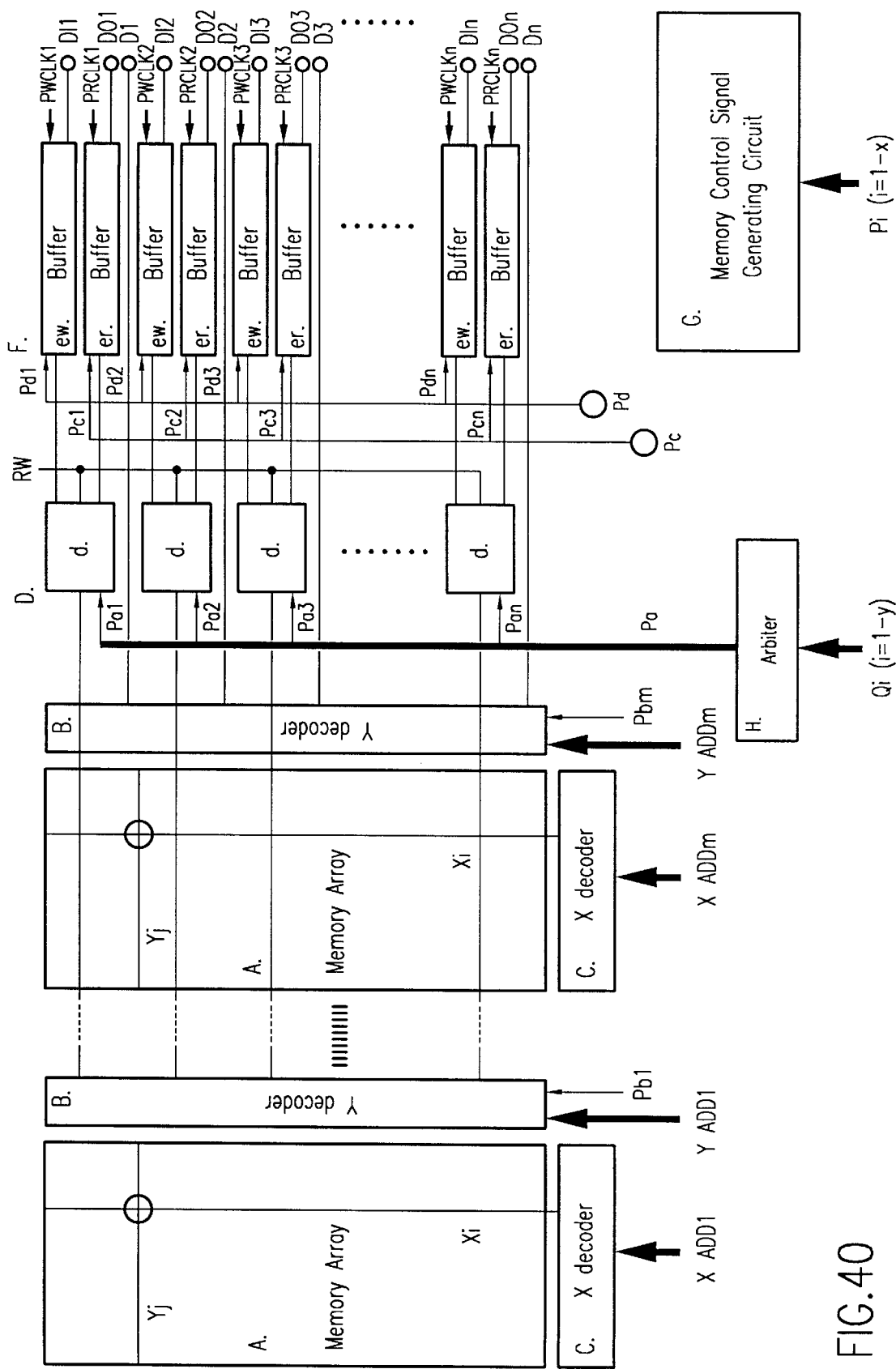
FIG. 40 is a block diagram illustrating thirty-sixth embodiment of the present invention.

FIG. 40 is a block diagram illustrating thirty-sixth embodiment of the present invention.

The thirty-sixth embodiment is configured by adding arbiter H to the twenty-fifth embodiment. The arbiter H is electrically connected to a memory control signal generating circuit G and receives request signals Qi (where i=1 to y) therein to thereby output opening/closing control signals Pa1 to Pan. Therefore, the opening/closing control signal terminal Pa described in the twenty-fifth embodiment is not present.

The thirty-sixth embodiment has the same advantages of the twenty-ninth and twenty-fifth embodiments.

Figure 41:
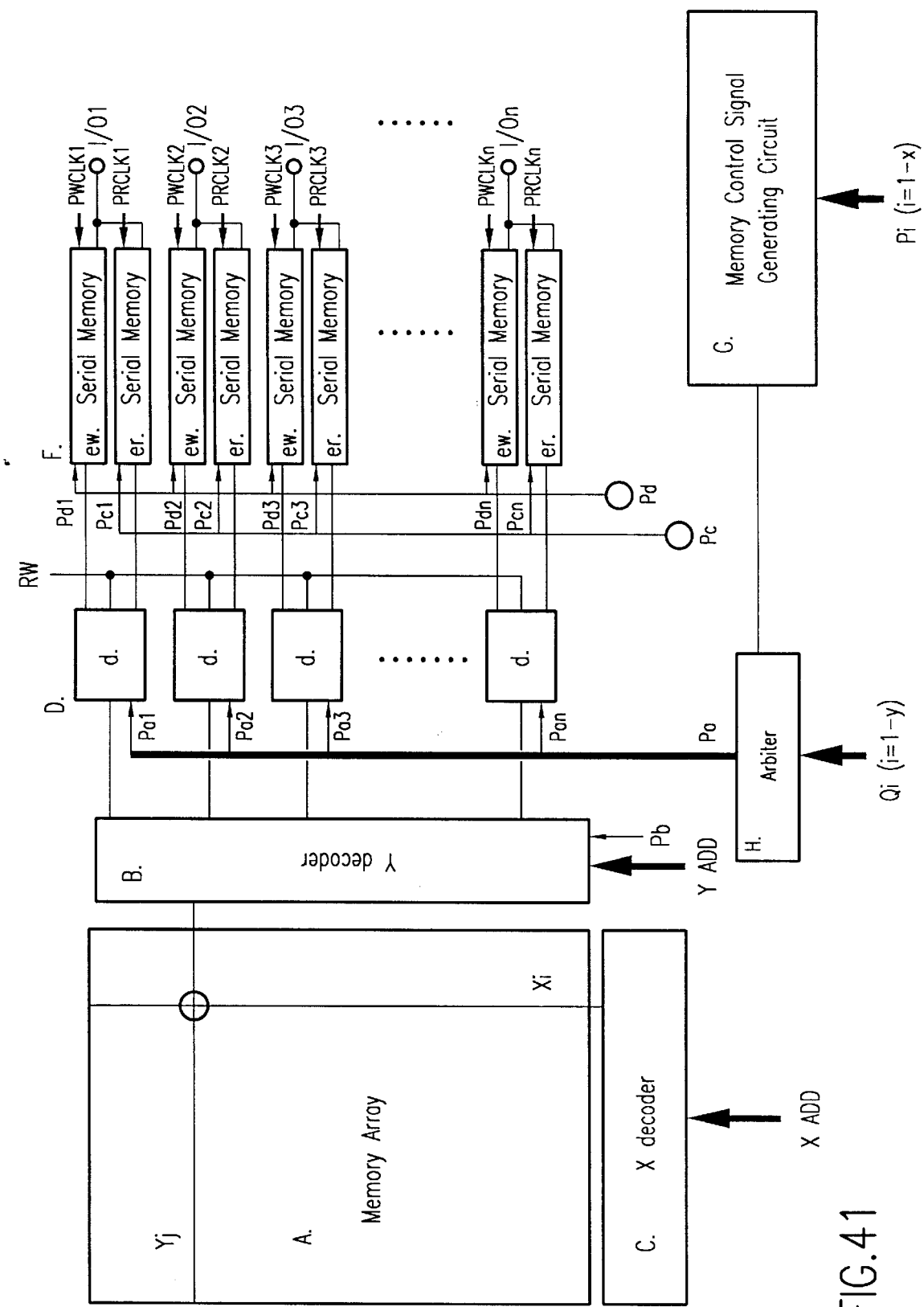
FIG. 41 is a block diagram illustrating thirty-seventh embodiment of the present invention.

FIG. 41 is a block diagram illustrating thirty-seventh embodiment of the present invention.

The thirty-seventh embodiment is configured by adding arbiter H to the twenty-sixth embodiment. The arbiter H is electrically connected to a memory control signal generating circuit G and receives request signals Qi (where i=1 to y) therein to thereby output opening/closing control signals Pa1 to Pan. Therefore, the opening/closing control signal terminal Pa described in the twenty-sixth embodiment is not present.

The thirty-seventh embodiment has the same advantages of the twenty-ninth and twenty-sixth embodiments.

Figure 42:
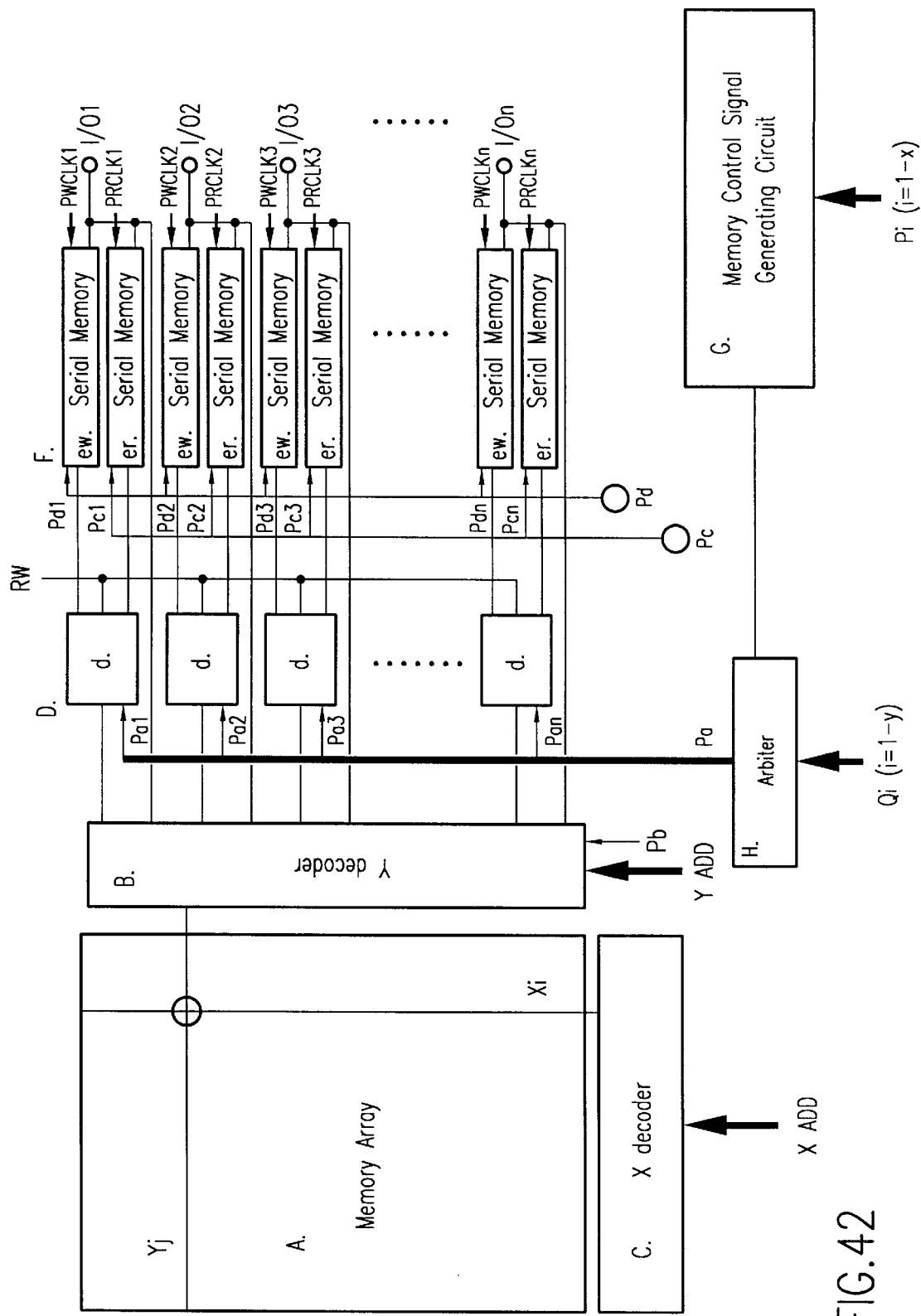
FIG. 42 is a block diagram illustrating thirty-eighth embodiment of the present invention.

FIG. 42 is a block diagram illustrating thirty-eighth embodiment of the present invention.

The thirty-eighth embodiment is configured by adding arbiter H to the twenty-seventh embodiment. The arbiter H is electrically connected to a memory control signal generating circuit G and receives request signals Qi (where i=1 to y) therein to thereby output opening/closing control signals Pa1 to Pan. Therefore, the opening/closing control signal terminal Pa described in the twenty-seventh embodiment is not present.

The thirty-eighth embodiment has the same advantages of the twenty-ninth and twenty-seventh embodiments.

Figure 43:
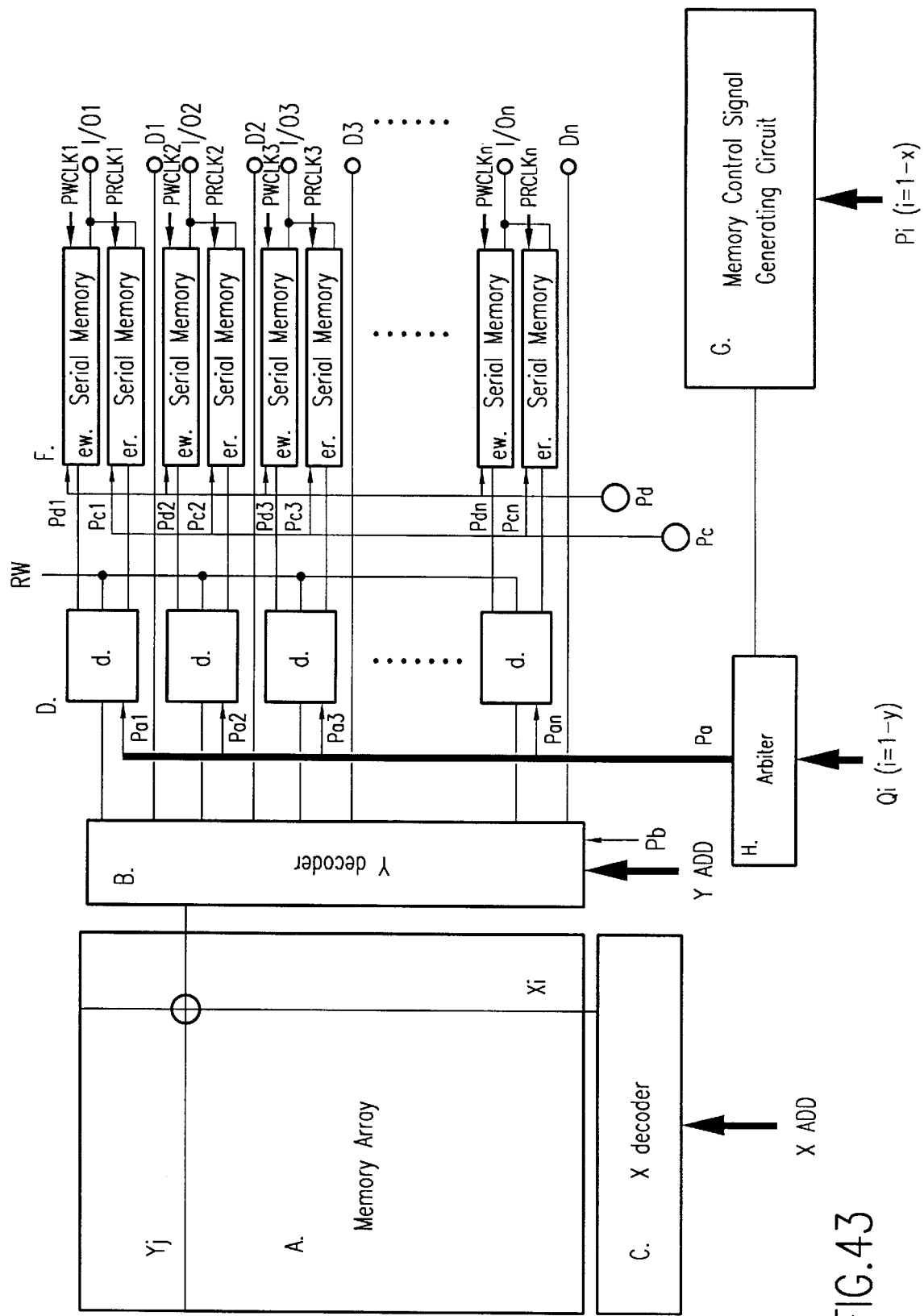
FIG. 43 is a block diagram illustrating thirty-ninth embodiment of the present invention.

FIG. 43 is a block diagram illustrating thirty-ninth embodiment of the present invention.

The thirty-ninth embodiment is configured by adding arbiter H to the twenty-eighth embodiment. The arbiter H is electrically connected to a memory control signal generating circuit G and receives request signals Qi (where i=1 to y) therein to thereby output opening/closing control signals Pa1 to Pan. Therefore, the opening/closing control signal terminal Pa described in the twenty-eighth embodiment is not present.

The thirty-ninth embodiment has the same advantages of the twenty-ninth and twenty-eighth embodiments.

Figure 44:
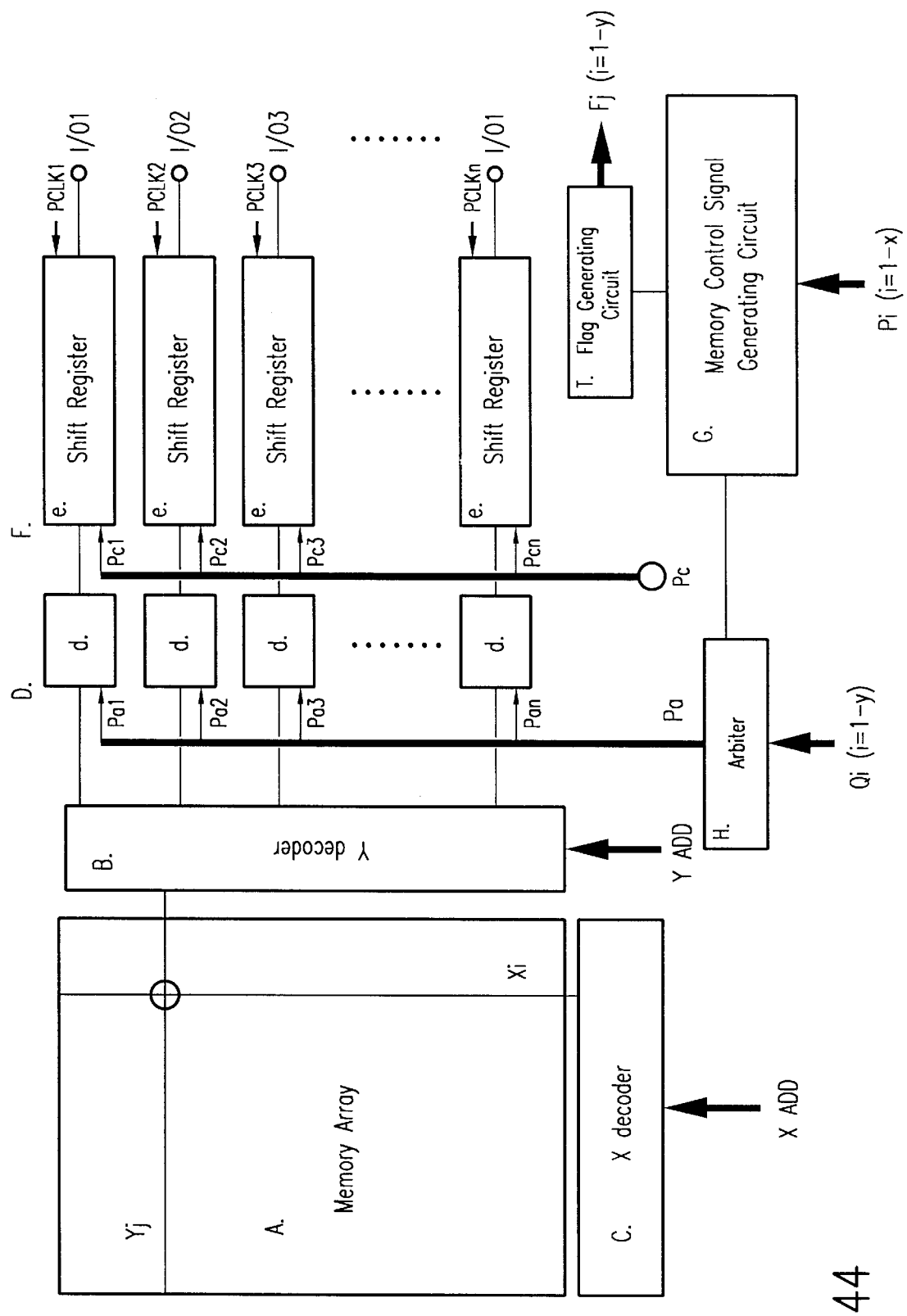
FIG. 44 is a block diagram showing fortieth embodiment of the present invention.

FIG. 44 is a block diagram showing fortieth embodiment of the present invention.

In the fortieth embodiment, serial memories e of the twenty-ninth embodiment are replaced by shift registers e, and a flag generating circuit T is added to the twenty-ninth embodiment. The flag generating circuit T is electrically connected to the memory control signal generating circuits G and outputs a flag signal Fj (where ji=1 to y). Convenience is offered because whether a shift register is empty or full can be determined according to the state of a flag.

Figure 45:
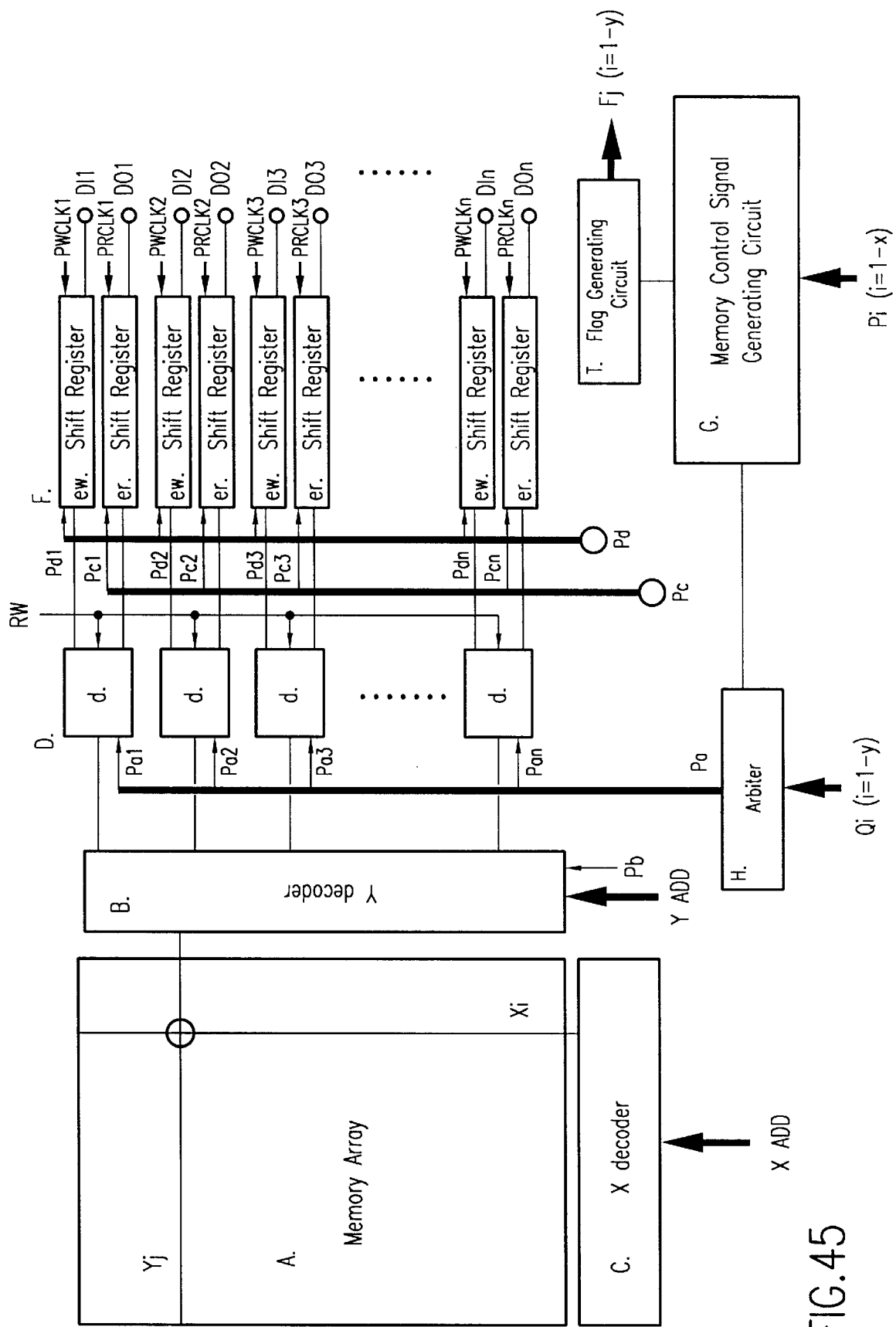
FIG. 45 is a block diagram showing forty-first embodiment of the present invention.

FIG. 45 is a block diagram showing forty-first embodiment of the present invention.

In the forty-first embodiment, input-output independent serial memories ew and er of the thirtieth embodiment are replaced by input-output independent shift registers ew and er, respectively, and a flag generating circuit T is added to the thirtieth embodiment. The flag generating circuit T is electrically connected to the memory control signal generating circuits G and outputs a flag signal Fj (where j=1 to y). Convenience is offered because whether a shift register is empty or full can be determined according to the state of a flag.

Figure 46:
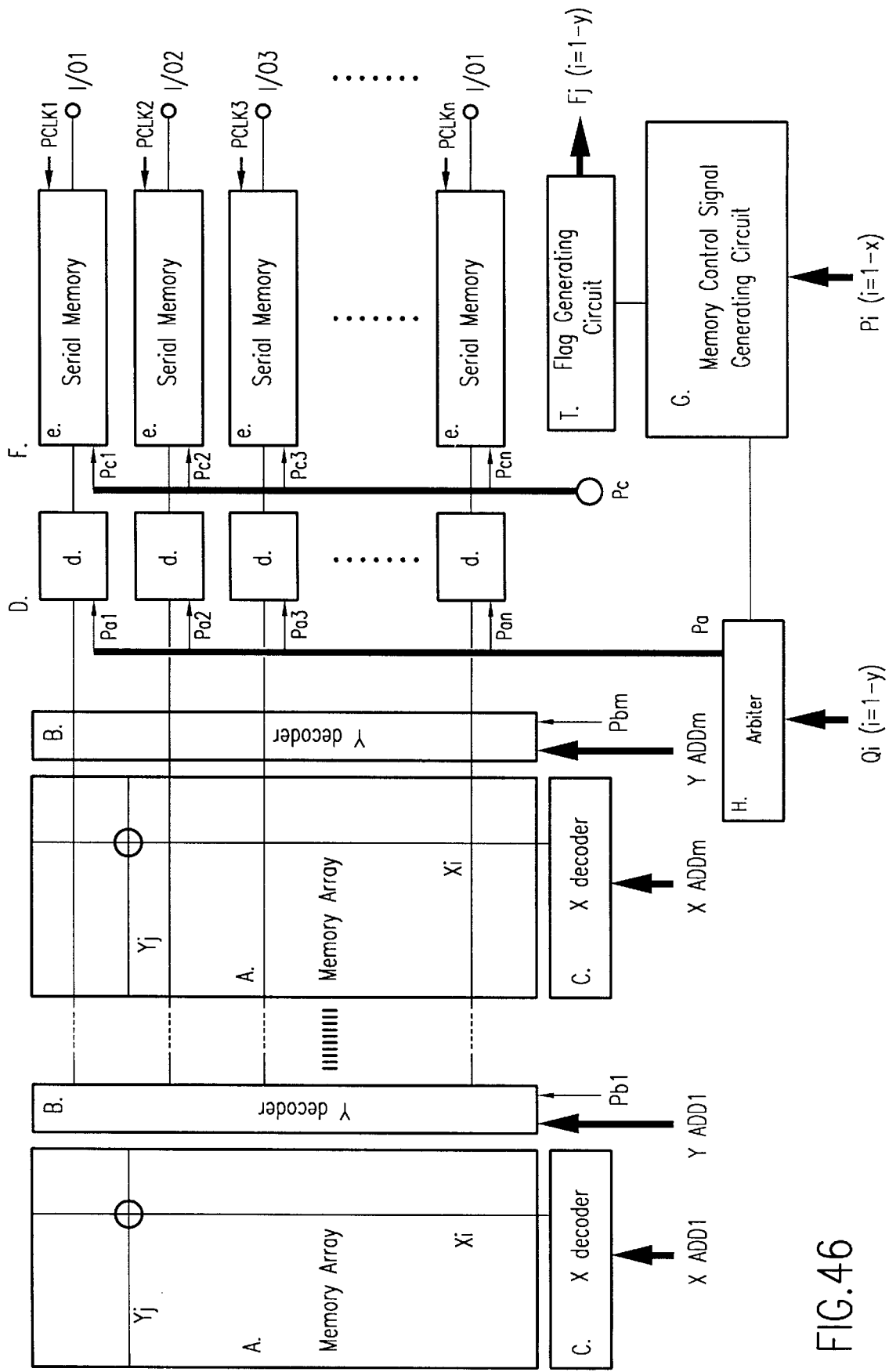
FIG. 46 is a block diagram showing forty-second embodiment of the present invention.

FIG. 46 is a block diagram showing forty-second embodiment of the present invention.

In the forty-second embodiment, serial memories e of the thirty-first embodiment are replaced by shift registers e, and a flag generating circuit T is added to the thirty-first embodiment. The flag generating circuit T is electrically connected to the memory control signal generating circuits G and outputs a flag signal Fj (where j=1 to y). Convenience is offered because whether a shift register is empty or full can be determined according to the state of a flag.

Figure 47:
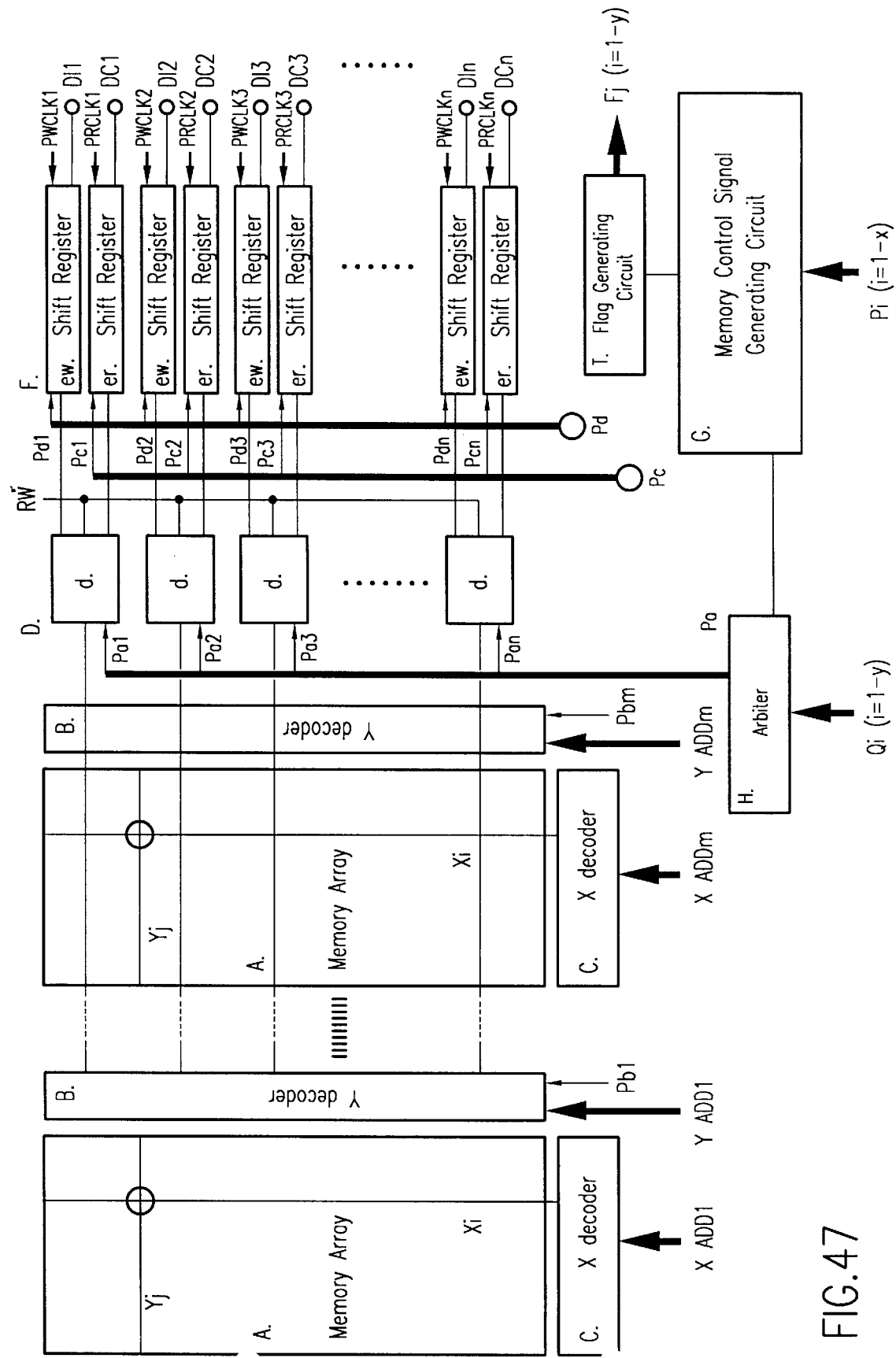
FIG. 47 is a block diagram showing forty-third embodiment of the present invention.

FIG. 47 is a block diagram showing forty-third embodiment of the present invention.

In the forty-third embodiment, input-output independent serial memories ew and er of the thirty-second embodiment are replaced by input-output independent shift registers ew and er, respectively, and a flag generating circuit T is added to the thirty-second embodiment. The flag generating circuit T is electrically connected to the memory control signal generating circuits G and outputs a flag signal Fj (where j=1 to y). Convenience is offered because whether a shift register is empty or full can be determined according to the state of a flag.

Figure 48:
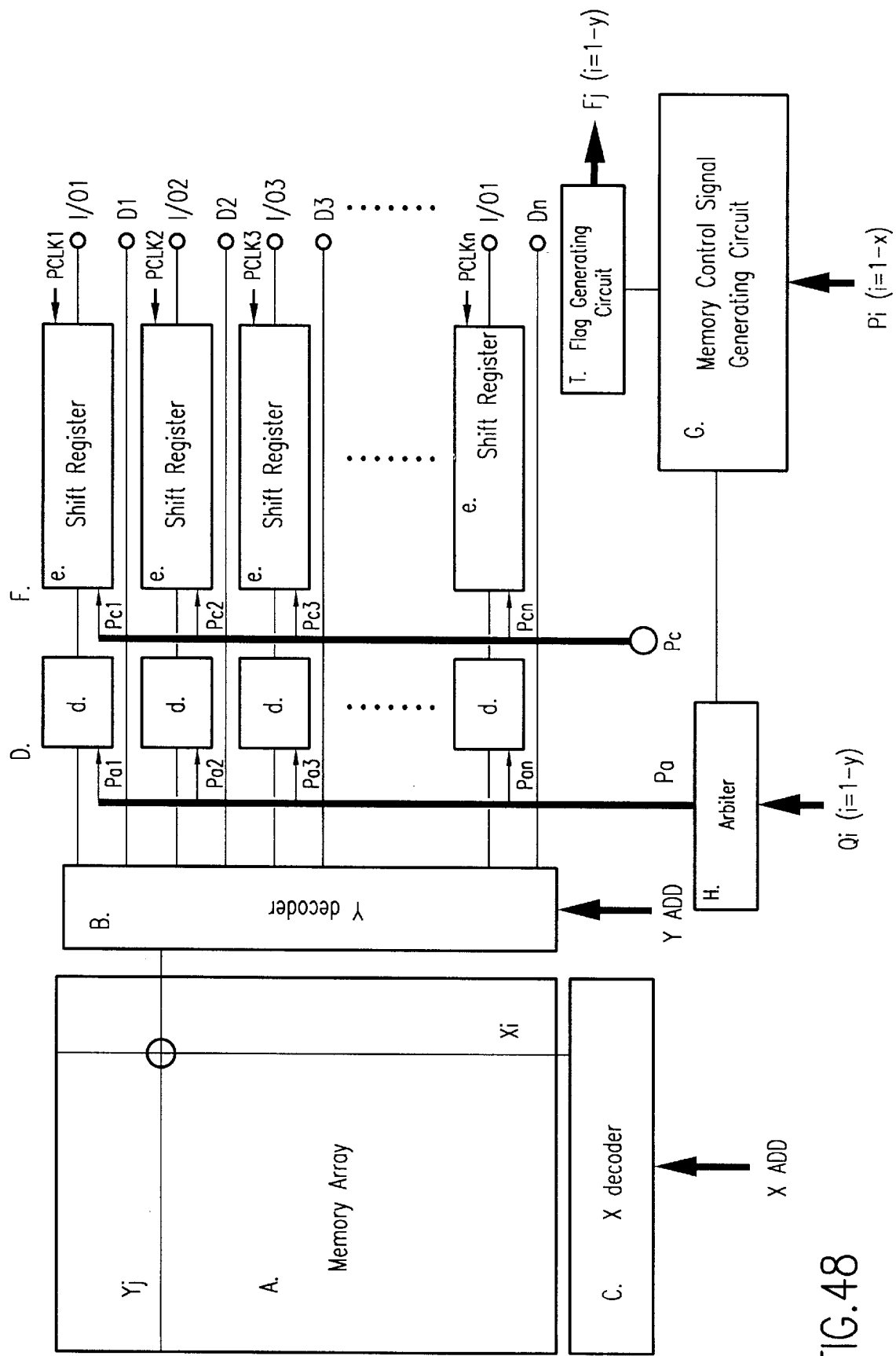
FIG. 48 is a block diagram showing forty-fourth embodiment of the present invention.

FIG. 48 is a block diagram showing forty-fourth embodiment of the present invention.

In the forty-fourth embodiment, serial memories e of the thirty-third embodiment are replaced by shift registers e, and a flag generating circuit T is added to the thirty-third embodiment. The flag generating circuit T is electrically connected to the memory control signal generating circuits G and outputs a flag signal Fj (where j=1 to y). Convenience is offered because whether a shift register is empty or full can be determined according to the state of a flag.

Figure 49:
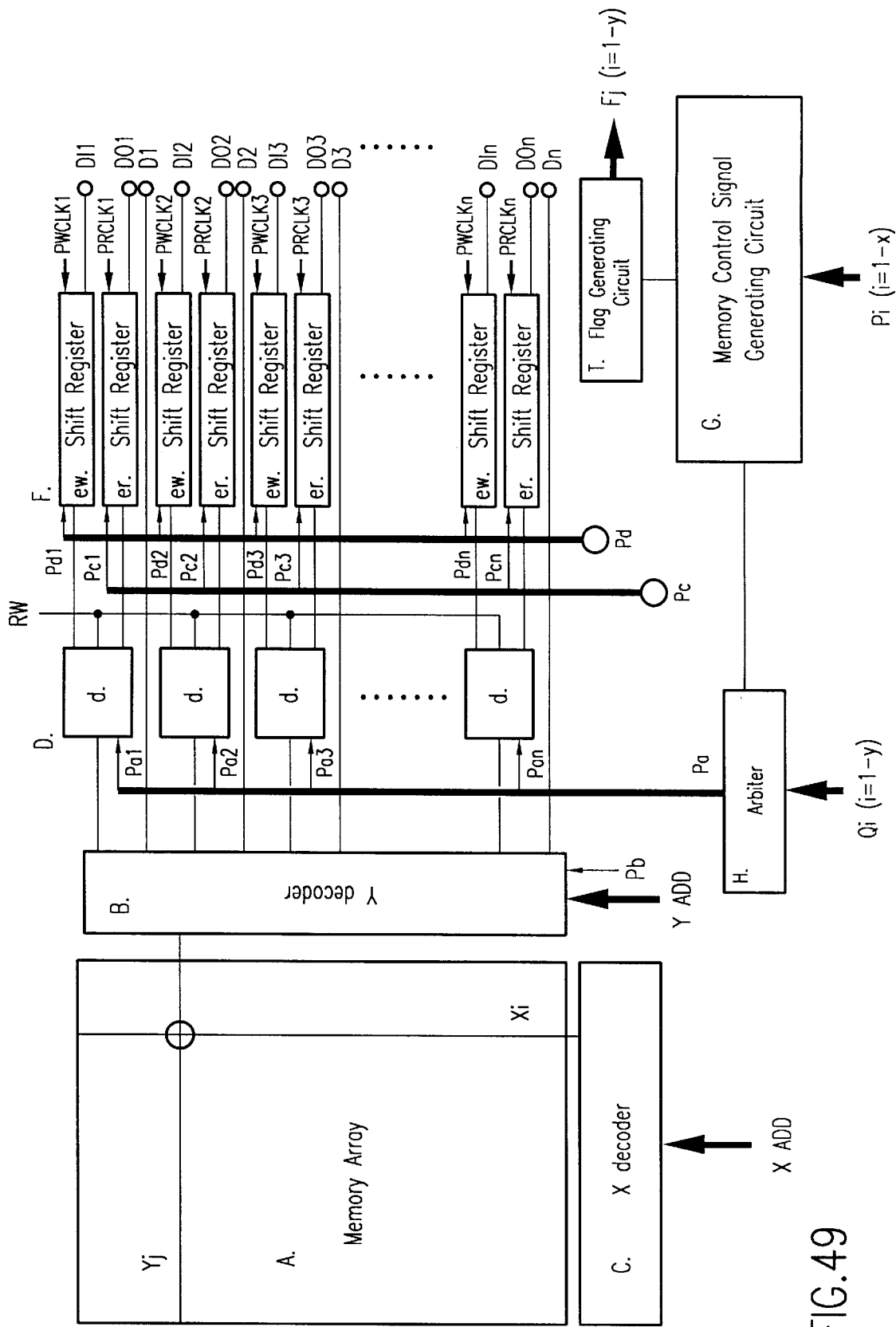
FIG. 49 is a block diagram showing forty-fifth embodiment of the present invention.

FIG. 49 is a block diagram showing forty-fifth embodiment of the present invention.

In the forty-fifth embodiment, input-output independent serial memories ew and er of the thirty-fourth embodiment are replaced by input-output independent shift registers ew and er, respectively, and a flag generating circuit T is added to the thirty-fourth embodiment. The flag generating circuit T is electrically connected to the memory control signal generating circuits G and outputs a flag signal Fj (where j=1 to y). Convenience is offered because whether a shift register is empty or full can be determined according to the state of a flag.

Figure 50:
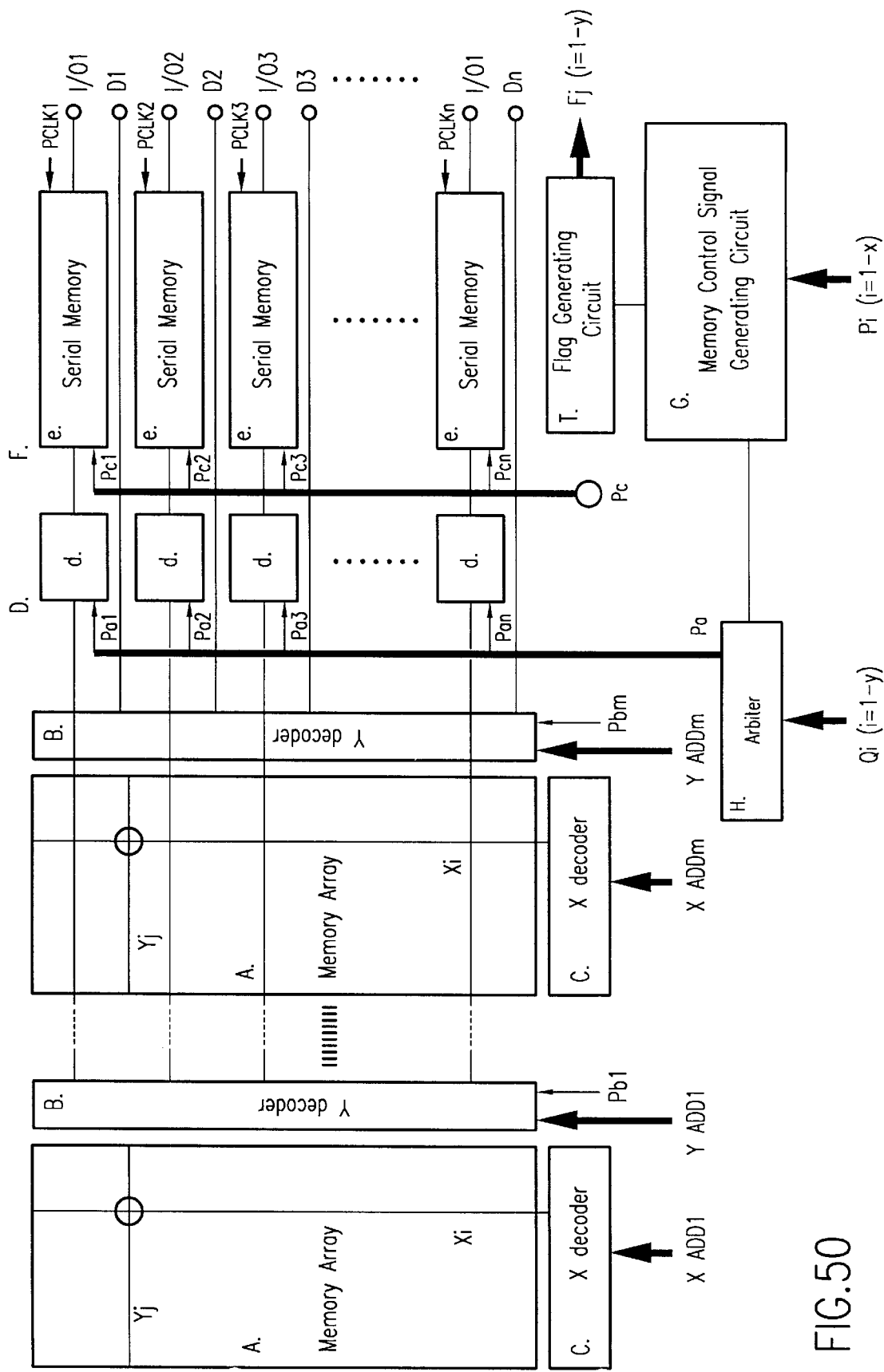
FIG. 50 is a block diagram showing forty-sixth embodiment of the present invention.

FIG. 50 is a block diagram showing forty-sixth embodiment of the present invention.

In the forty-sixth embodiment, serial memories e of the thirty-fifth embodiment are replaced by shift registers e, and a flag generating circuit T is added to the thirty-fifth embodiment. The flag generating circuit T is electrically connected to the memory control signal generating circuits G and outputs a flag signal Fj (where j=1 to y). Convenience is offered because whether a shift register is empty or full can be determined according to the state of a flag.

Figure 51:
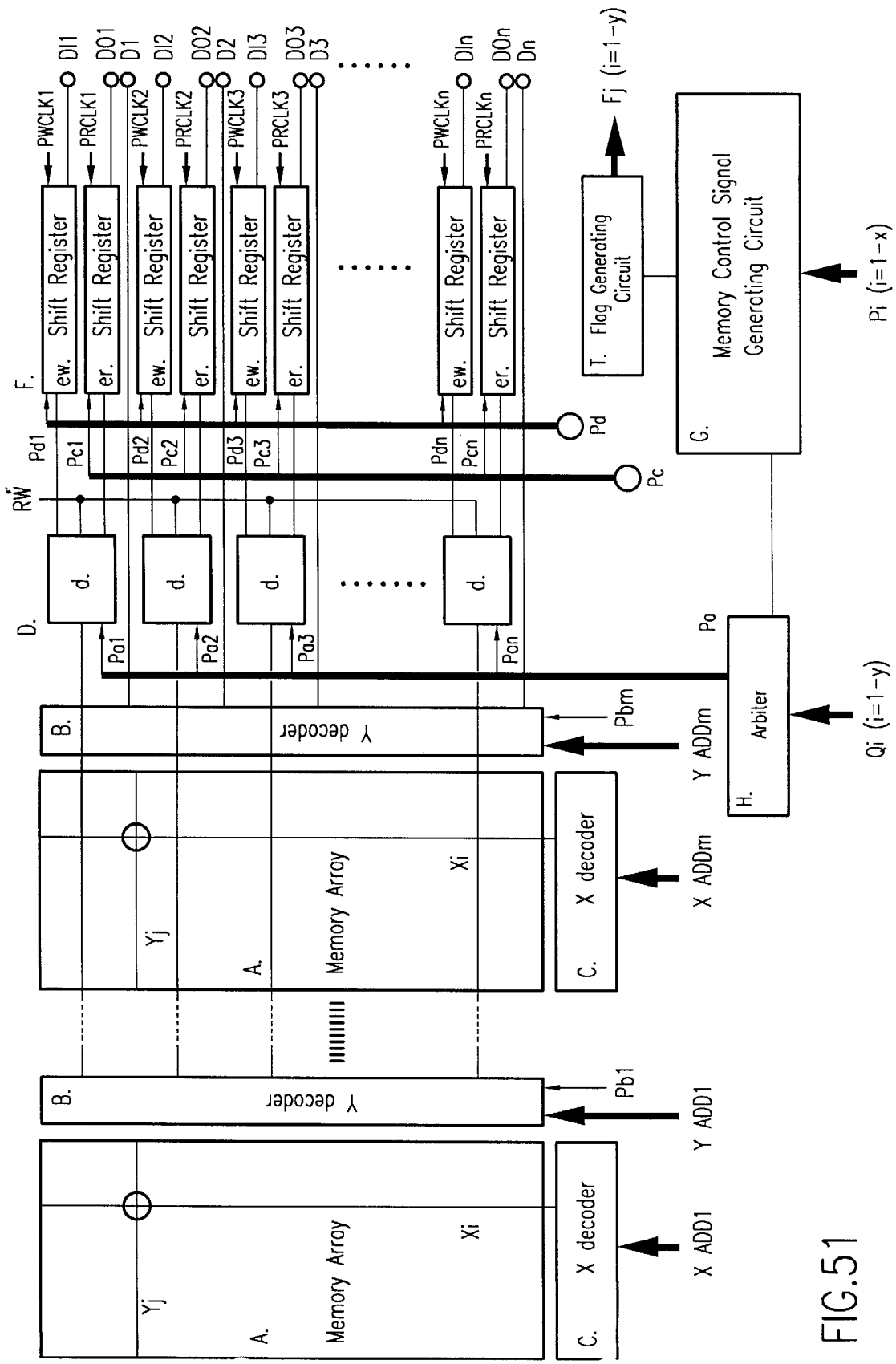
FIG. 51 is a block diagram showing forty-seventh embodiment of the present invention.

FIG. 51 is a block diagram showing forty-seventh embodiment of the present invention.

In the forty-seventh embodiment, input-output independent serial memories ew and er of the thirty-sixth embodiment are replaced by input-output independent shift registers ew and er, respectively, and a flag generating circuit T is added to the thirty-sixth embodiment. The flag generating circuit T is electrically connected to the memory control signal generating circuits G and outputs a flag signal Fj (where j=1 to y). Convenience is offered because whether a shift register is empty or full can be determined according to the state of a flag.

Figure 52:
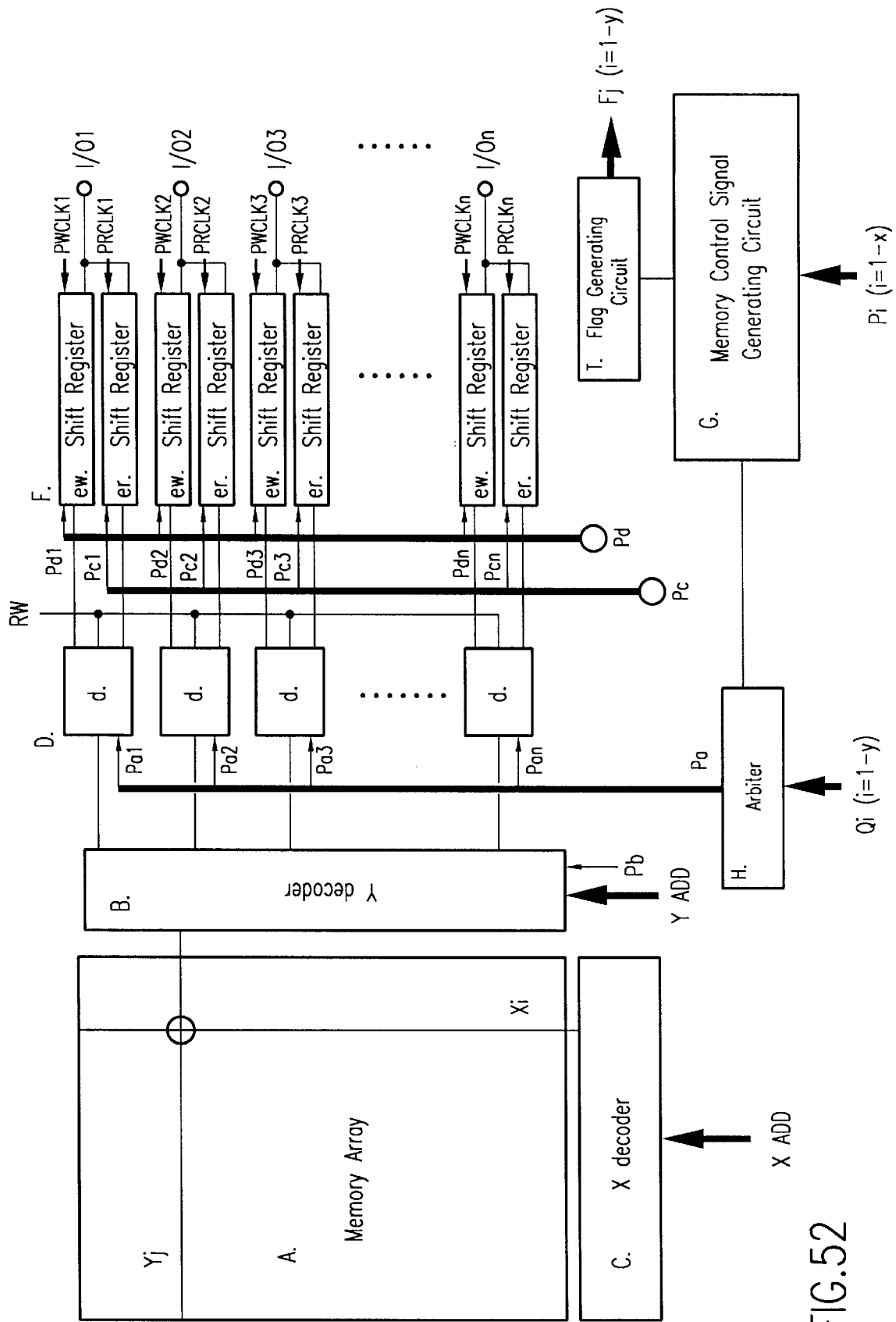
FIG. 52 is a block diagram showing forty-eighth embodiment of the present invention.

FIG. 52 is a block diagram showing forty-eighth embodiment of the present invention.

In the forty-eighth embodiment, input-output independent serial memories ew and er of the thirty-seventh embodiment are replaced by input-output independent shift registers ew and er, respectively, and a flag generating circuit T is added to the thirty-seventh embodiment. The flag generating circuit T is electrically connected to the memory control signal generating circuits G and outputs a flag signal Fj (where j=1 to y). Convenience is offered because whether a shift register is empty or full can be determined according to the state of a flag.

Figure 53:
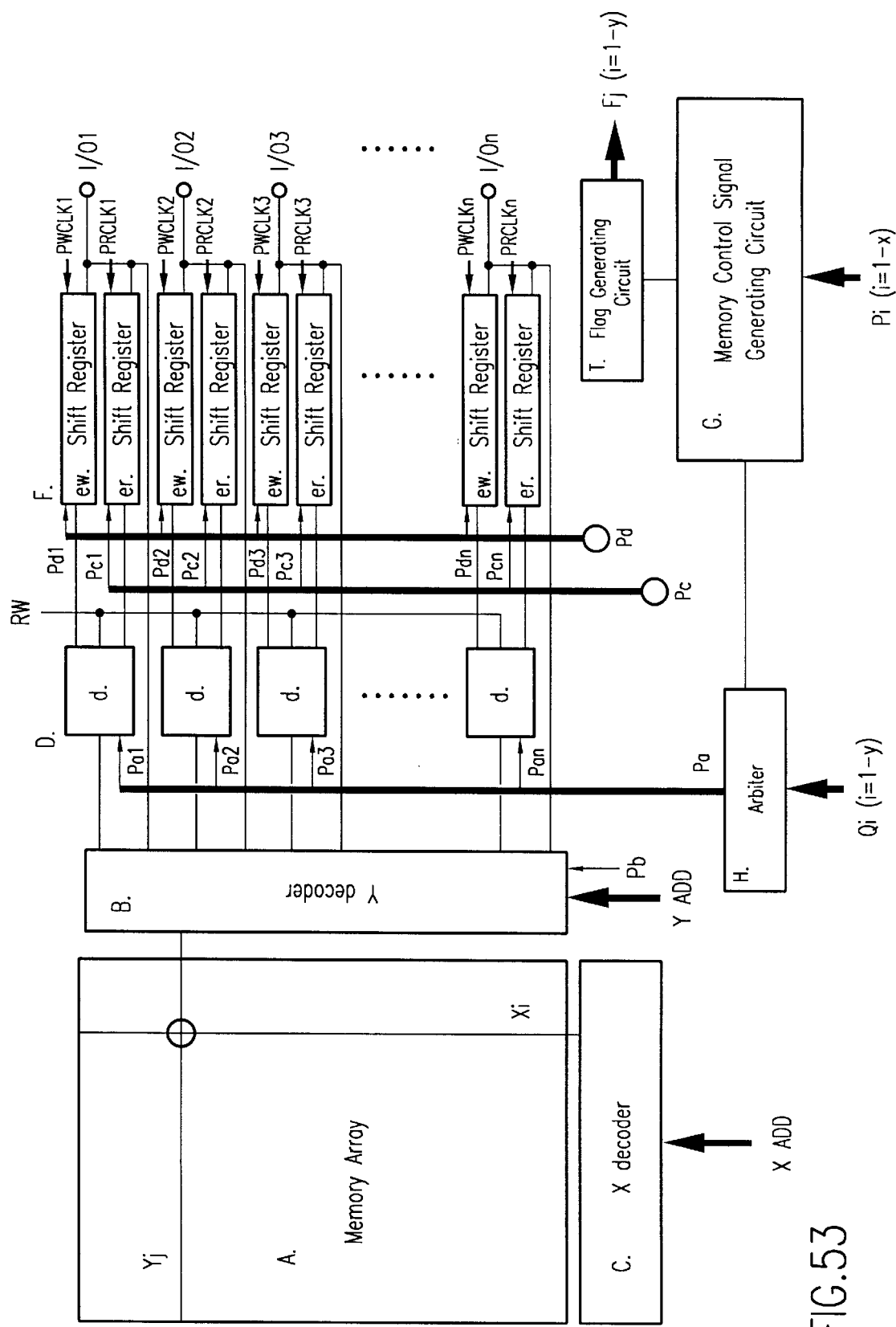
FIG. 53 is a block diagram showing forty-ninth embodiment of the present invention.

FIG. 53 is a block diagram showing forty-ninth embodiment of the present invention.

In the forty-ninth embodiment, input-output independent serial memories ew and er of the thirty-eighth embodiment are replaced by input-output independent shift registers ew and er, respectively, and a flag generating circuit T is added to the thirty-eighth embodiment. The flag generating circuit T is electrically connected to the memory control signal generating circuits G and outputs a flag signal Fj (where j=1 to y). Convenience is offered because whether a shift register is empty or full can be determined according to the state of a flag.

Figure 54:
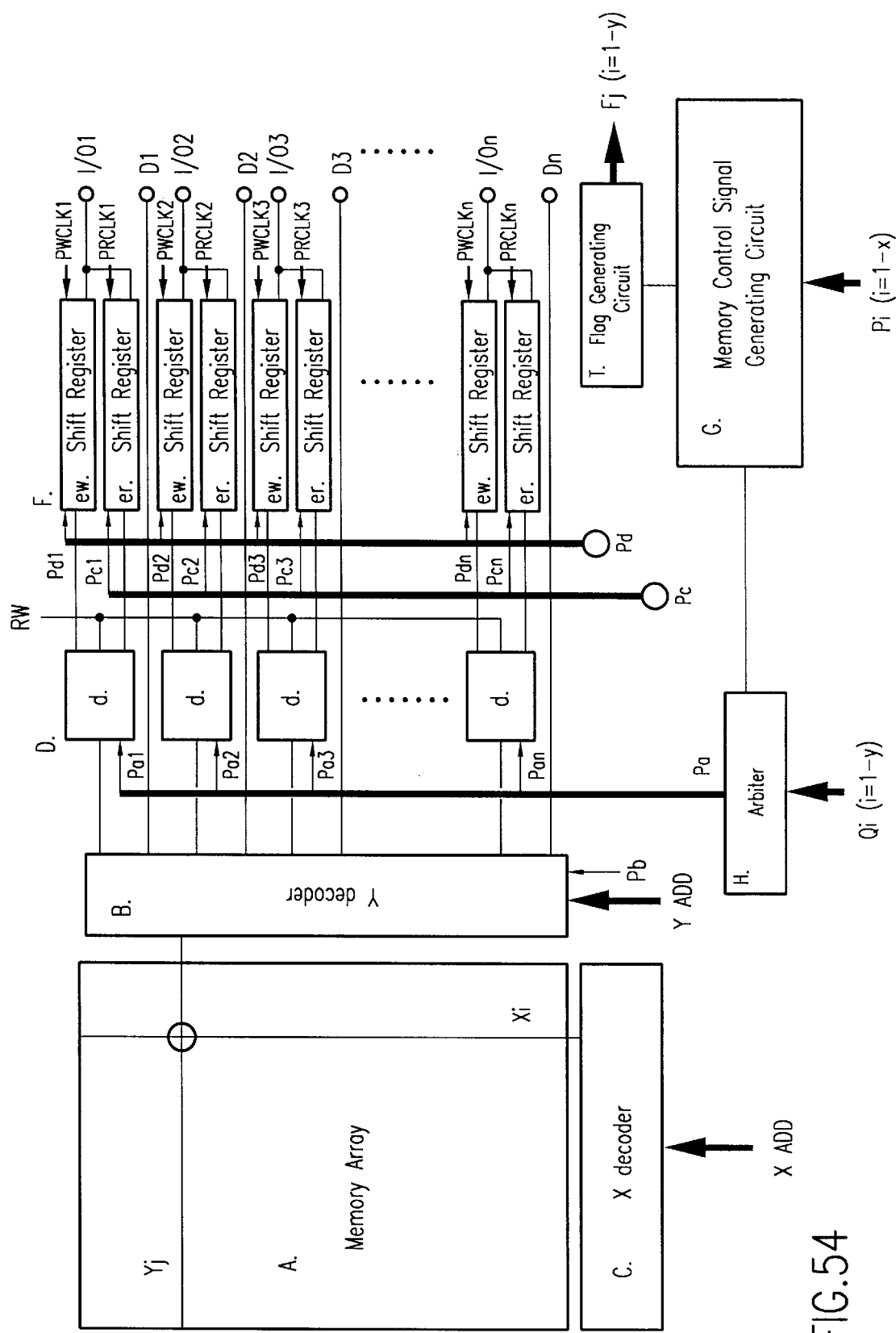
FIG. 54 is a block diagram showing fiftieth embodiment of the present invention.

FIG. 54 is a block diagram showing fiftieth embodiment of the present invention.

In the fiftieth embodiment, input-output independent serial memories ew and er of the thirty-ninth embodiment are replaced by input-output independent shift registers ew and er, respectively, and a flag generating circuit T is added to the thirty-ninth embodiment. The flag generating circuit T is electrically connected to the memory control signal generating circuits G and outputs a flag signal Fj (where j=1 to y). Convenience is offered because whether a shift register is empty or full can be determined according to the state of a flag.

Figure 55:
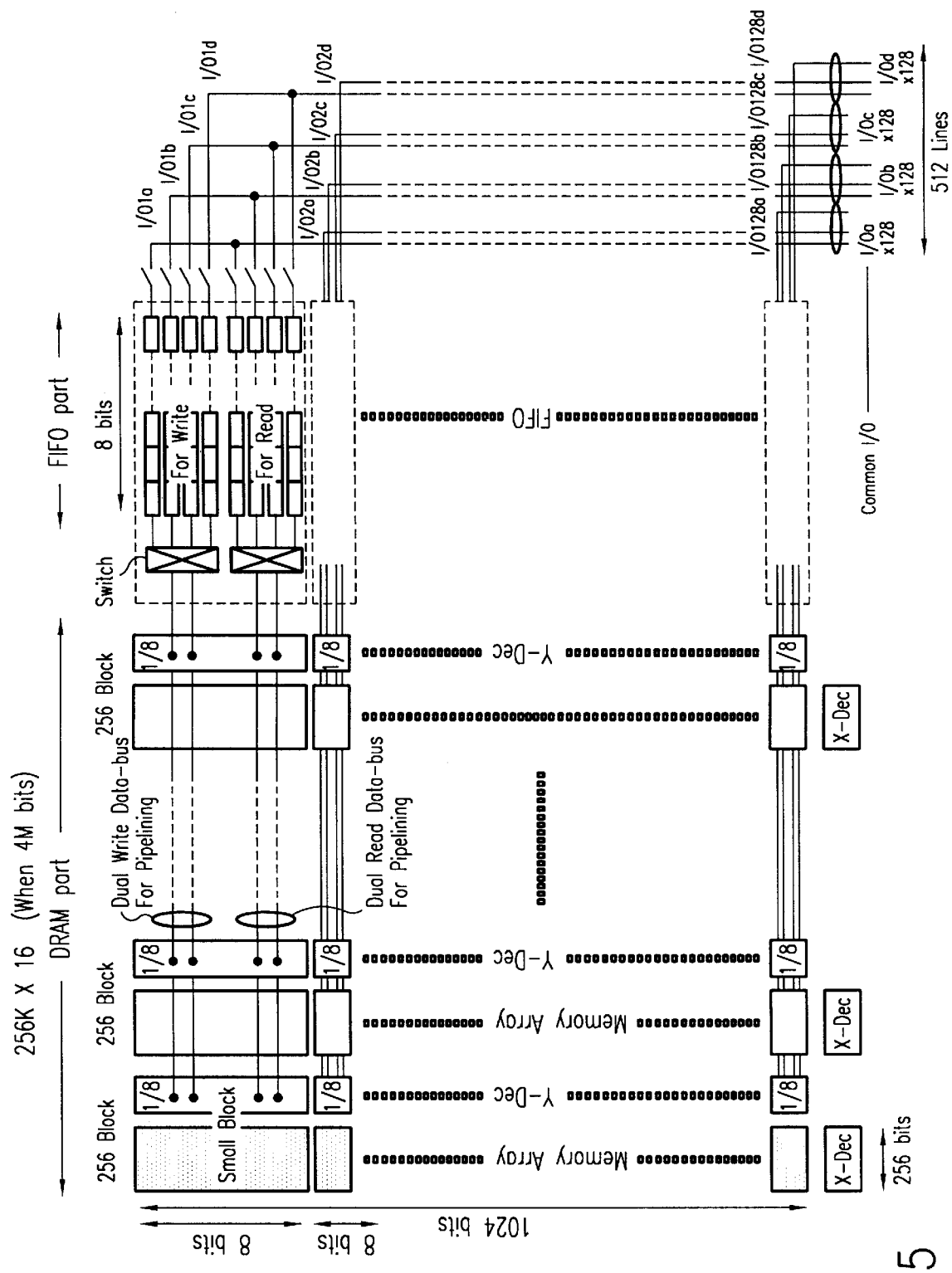
FIG. 55 shows imaged layout plans of a product adopting the present invention.
Figure 56:
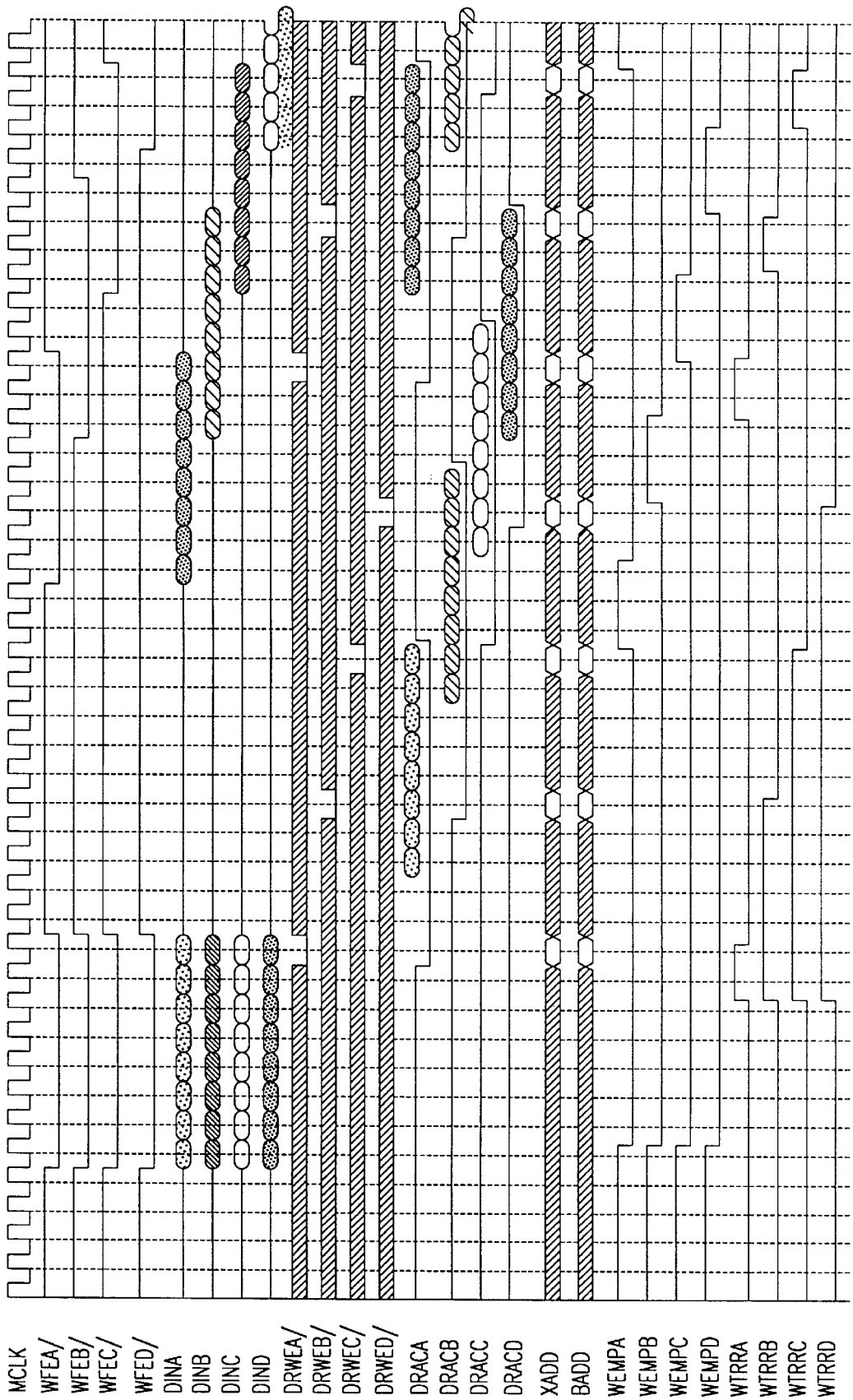
FIG. 56 is a timing chart showing a write operation of the product.
Figure 57:
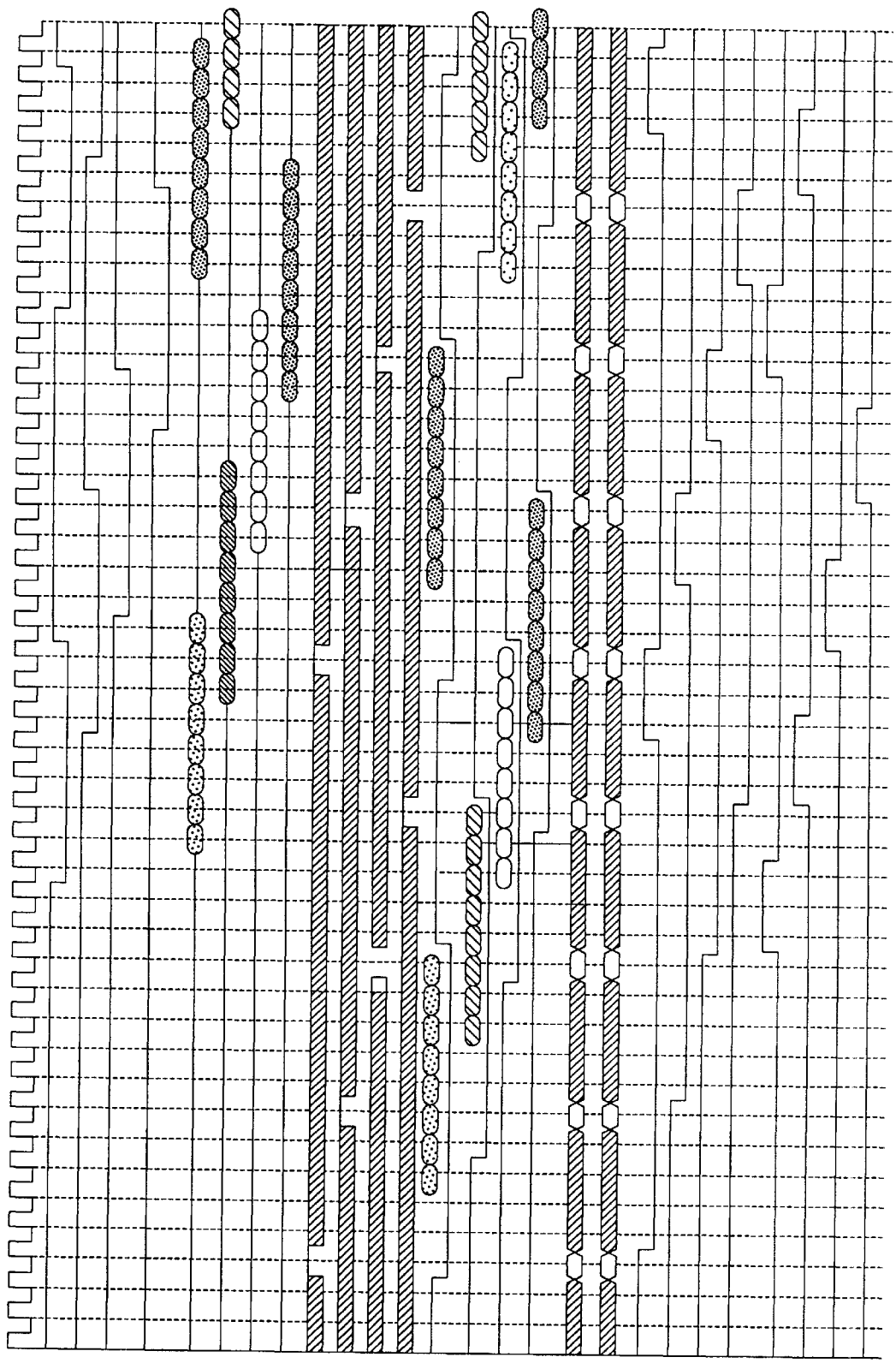
FIG. 57 is a timing chart showing a read operation of the product.

FIGS. 55, 56 and 57 are imaged layout plans of actual products respectively and are respectively timing charts related to their writing and reading. Since connection relations and operations of the present embodiments can be analogized from the aforementioned embodiments if the drawings are seen, their description will be omitted.

According to the present invention, as has been described above in detail, a memory having very high performance can be provided for a network system.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor memory circuit comprising:
   a memory array including
      a X decoder receiving an X address and
      a plurality of column units, each of which is formed within a first pattern width, each of said column units having
         a plurality of memory cells,
         a plurality of bit line pairs connected to the memory cells, and
         a Y decoder receiving a Y address and selecting one of the bit line pairs in response to the Y address;
   a plurality of switching circuits each having an input connected to one of the Y decoders and a plurality of outputs, said switching circuit connected to the input and one of the output in response to a control signal, each of said switching circuits having a second pattern width within the first pattern width;
   a plurality of buffers, each of which is connected to one of the outputs of said switching circuits, each of said buffers having a third pattern width within the first pattern width;
   a plurality of ports, each of which is connected to one of said buffers; and
   a memory control signal generating circuit outputting the X address and Y address.

2. A semiconductor memory circuit according to claim 1, wherein said memory array is divided to a plurality of memory arrays.

3. A semiconductor memory circuit according to claim 1, wherein each of said buffer includes an input buffer and an output buffer, and each of said ports includes an input port connected to the input buffer and an output port connected to the output buffer.

4. A semiconductor memory circuit according to claim 2, wherein each of said buffers includes an input buffer and an output buffer, and each of said ports includes an input port connected to the input buffer and an output port connected to the output buffer.

5. A semiconductor memory circuit according to claim 1, further comprising a direct access output port connected to said Y decoder.

6. A semiconductor memory circuit according to claim 2, further comprising a direct access output port connected to said Y decoder.

7. A semiconductor memory circuit according to claim 3, further comprising a direct access output port connected to said Y decoder.

8. A semiconductor memory circuit according to claim 4, further comprising a direct access output port connected to said Y decoder.

9. A semiconductor memory circuit comprising:
   a memory array including
      an X decoder receiving an X address and
      a plurality of column units, each having
         a plurality of memory cells,
         a plurality of bit line pairs connected to the memory cells, and a Y decoder receiving a Y address and selecting one of the bit line pairs in response to the Y address;

a plurality of switching circuits each having an input connected to one of the Y decoders and a plurality of outputs, said switching circuit connected to the input and one of the output in response to a control signal;

a plurality of serial memories, each of which is connected to one of the outputs of said switching circuits, each of said serial memories including an input serial memory and an output serial memory;

a plurality of ports, each of which is connected to one of said serial memories, each of said ports including an input port connected to the input serial memory and an output port connected to the output serial memory; and a memory control signal generating circuit outputting the X address and Y address.

10. A semiconductor memory circuit according to claim 9, wherein said memory array is divided to a plurality of memory arrays.

11. A semiconductor memory circuit according to claim 10, wherein each of said serial memories includes an input serial memory and an output serial memory, and each of said ports includes an input port connected to the input serial memory and an output port connected to the output serial memory.

12. A semiconductor memory circuit comprising:

a memory array including
an X decoder receiving an X address and
a plurality of column units, each having
a plurality of memory cells,
a plurality of bit line pairs connected to the memory cells, and
a Y decoder receiving a Y address and selecting one of the bit line pairs in response to the Y address;

a plurality of switching circuits each having an input connected to one of the Y decoders and a plurality of outputs, said switching circuit connected to the input and one of the output in response to a control signal;

a plurality of serial memories, each of which is connected to one of the outputs of said switching circuits;

a plurality of ports, each of which is connected to one of said serial memories, a memory control signal generating circuit outputting the X address and Y address; and a direct access output port connected to said Y decoder.

13. A semiconductor memory circuit according to claim 10, further comprising a direct access output port connected to said Y decoder.

14. A semiconductor memory circuit according to claim 9, further comprising a direct access output port connected to said Y decoder.

15. A semiconductor memory circuit according to claim 11, further comprising a direct access output port connected to said Y decoder.

16. A semiconductor memory circuit comprising:

a memory array including
an X decoder receiving an X address and
a plurality of column units, each of which is formed within a first pattern width, each of said column units having
a plurality of memory cells,
a plurality of bit line pairs connected to the memory cells,
a Y decoder receiving a Y address and selecting one of the bit line pairs in response to the Y address;

a plurality of switching circuits each having an input connected to one of the Y decoders and a plurality of outputs, said switching circuit connected to the input and one of the output in response to a control signal each of said switching circuits having a second pattern width within the first pattern width;

a plurality of serial memories, each of which is connected to one of the outputs of said switching circuits, each of said serial memories having a third pattern width within the first patter width;

a plurality of ports, each of which is connected to one of said serial memories; and a memory control signal generating circuit outputting the X address and Y address.

17. A semiconductor memory circuit comprising:

a memory array including
an X decoder receiving an X address and
a plurality of column units each having
a plurality of memory cells,
a plurality of bit line pairs connected to the memory cells, and
a Y decoder receiving a Y address and selecting one of the bit line pairs in response to the Y address;

a plurality of switching circuits each having an input connected to one of the Y decoders and a plurality of outputs, said switching circuit connected to the input and one of the output in response to a control signal;

a plurality of serial memories, each of which is connected to one of the outputs of said switching circuits;

a plurality of ports, each of which is connected to one of said serial memories;

an arbiter connected to said memory control signal generating circuit and said switching circuits for generating the control signal.

18. A semiconductor memory circuit according to claim 10, further comprising an arbiter connected to said memory control signal generating circuit and said switching circuits for generating the control signal.

19. A semiconductor memory circuit according to claim 9, further comprising an arbiter connected to said memory control signal generating circuit and said switching circuits for generating the control signal.

20. A semiconductor memory circuit according to claim 11, further comprising an arbiter connected to said memory control signal generating circuit and said switching circuits for generating the control signal.

21. A semiconductor memory circuit according to claim 12, further comprising an arbiter connected to said memory control signal generating circuit and said switching circuits for generating the control signal.

22. A semiconductor memory circuit according to claim 13, further comprising an arbiter connected to said memory control signal generating circuit and said switching circuits for generating the control signal.

23. A semiconductor memory circuit according to claim 15, further comprising an arbiter connected to said memory control signal generating circuit and said switching circuits for generating the control signal.

24. A semiconductor memory circuit comprising:

a memory array including
an X decoder receiving an X address and
a plurality of column units, each having
a plurality of memory cells,
a plurality of bit line pairs connected to the memory cells,
a Y decoder receiving a Y address and selecting one of the bit line pairs in response to the Y address;

a plurality of switching circuits each having an input connected to one of the Y decoders and a plurality of outputs, said switching circuit connected to the input and one of the output in response to a control signal;

a plurality of serial memories, each of which is connected to one of the outputs of said switching circuits;

a plurality of ports, each of which is connected to one of said serial memories; and a memory control signal generating circuit outputting the X address and Y address, wherein a total number of bits of said serial memories is equal to a number of the bit line pairs within each of said column units.

25. A semiconductor memory circuit comprising:

a memory array including
an X decoder receiving an X address and
a plurality of column units, each having
a plurality of memory cells,
a plurality of bit line pairs connected to the memory cells,
a Y decoder receiving a Y address and selecting one of the bit line pairs in response to the Y address;

a plurality of switching circuits each having an input connected to one of the Y decoders and a plurality of outputs, said switching circuit connected to the input and one of the input in response to a control signal;

a plurality of shift registers, each of which is connected to one of the outputs of said switching circuits;

a plurality of ports, each of which is connected to one of said shift registers;

a memory control signal generating circuit outputting the X address and Y address;

an arbiter connected to said memory control signal generating circuit and said switching circuits for generating the control signal; and a flag generating circuit connected to said memory control signal generating circuit for outputting a flag indicating whether said shift registers are full or empty.

26. A semiconductor memory circuit according to claim 25, wherein said memory array is divided to a plurality of memory arrays.

27. A semiconductor memory circuit according to claim 25, wherein each of said shift registers includes an input shift register and an output shift register, and each of said ports includes an input port connected to the input shift register and an output port connected to the output shift register.

28. A semiconductor memory circuit according to claim 26, wherein each of said shift registers includes an input shift register and an output shift register, and each of said ports includes an input port connected to the input shift register and an output port connected to the output shift register.

29. A semiconductor memory circuit according to claim 25, further comprising a direct access output port connected to said Y decoder.

30. A semiconductor memory circuit according to claim 26, further comprising a direct access output port connected to said Y decoder.

31. A semiconductor memory circuit according to claim 27, further comprising a direct access output port connected to said Y decoder.

32. A semiconductor memory circuit according to claim 28, further comprising a direct access output port connected to said Y decoder.

33. A semiconductor memory circuit according to claim 25, wherein pattern of said switching circuits and said shift registers are formed within a pattern width of the corresponding column unit.

34. A semiconductor memory circuit according to claim 25, wherein a total number of bits of said shift registers is equal to a number of the bit line pairs within each of said column units.

35. A semiconductor memory circuit according to claim 16, wherein said memory array is divided into a plurality of memory arrays.

36. A semiconductor memory circuit according to claim 16, wherein each of said serial memories includes an input serial memory and an output serial memory, and each of said ports includes an input port connected to the input serial memory and an output port connected to the output serial memory.

37. A semiconductor memory circuit according to claim 16, further comprising a direct access output port connected to said Y decoder.

38. A semiconductor memory circuit according to claim 16, further comprising an arbiter connected to said memory control signal generating circuit and said switching circuits for generating the control signal.

39. A semiconductor memory circuit according to claim 16, wherein a total number of bits of said serial memories is equal to a number of the bit line pairs within each of said column units.

40. A semiconductor memory circuit according to claim 24, wherein said memory array is divided into a plurality of memory arrays.

41. A semiconductor memory circuit according to claim 24, wherein each of said serial memories includes an input serial memory and an output serial memory, and each of said ports includes an input port connected to the input serial memory and an output port connected to the output serial memory.

42. A semiconductor memory circuit according to claim 24, further comprising a direct access output port connected to said Y decoder.

43. A semiconductor memory circuit according to claim 24, wherein patterns of said switching circuits and said serial memories are formed within a pattern width of the corresponding column unit.

44. A semiconductor memory circuit according to claim 24, further comprising an arbiter connected to said memory control signal generating circuit and said switching circuits for generating the control signal.

45. A semiconductor memory circuit according to claim 9, wherein a total number of bits of said serial memories is equal to a number of the bit line pairs within each of said column units.

* * * * *